US011683202B2

(12) United States Patent
Saeki

(10) Patent No.: US 11,683,202 B2
(45) Date of Patent: Jun. 20, 2023

(54) TRANSMITTER AND COMMUNICATION SYSTEM

(71) Applicant: Sony Semiconductor Solutions Corporation, Kanagawa (JP)

(72) Inventor: Takanori Saeki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 9 days.

(21) Appl. No.: 17/613,285

(22) PCT Filed: May 18, 2020

(86) PCT No.: PCT/JP2020/019688
§ 371 (c)(1),
(2) Date: Nov. 22, 2021

(87) PCT Pub. No.: WO2020/241362
PCT Pub. Date: Dec. 3, 2020

(65) Prior Publication Data
US 2022/0224569 A1    Jul. 14, 2022

(30) Foreign Application Priority Data
May 29, 2019 (JP) .............................. JP2019-099922

(51) Int. Cl.
*H04L 25/02* (2006.01)
*H04L 25/49* (2006.01)

(52) U.S. Cl.
CPC ........ *H04L 25/0274* (2013.01); *H04L 25/028* (2013.01); *H04L 25/0276* (2013.01); *H04L 25/4917* (2013.01)

(58) Field of Classification Search
CPC ............ H03K 19/0175; H04L 25/0272; H04L 25/0274; H04L 25/0276; H04L 25/028; H04L 25/4917
See application file for complete search history.

(56) References Cited

U.S. PATENT DOCUMENTS

| 2008/0212709 | A1* | 9/2008 | Wiley | ................. H04L 25/4917 375/286 |
| 2009/0225873 | A1* | 9/2009 | Lee | ..................... H04L 25/0272 375/257 |
| 2019/0081648 | A1 | 3/2019 | Shimada | |

FOREIGN PATENT DOCUMENTS

| JP | 2010520715 A | 6/2010 |
| JP | 2011517159 A | 5/2011 |

(Continued)

OTHER PUBLICATIONS

PCT/JP2020/019688 International Preliminary Report on Patentability, Chapter I (translated), dated Nov. 30, 2021 (Year: 2021).*

(Continued)

*Primary Examiner* — Nader Bolourchi
(74) *Attorney, Agent, or Firm* — Michael Best & Friedrich LLP

(57) ABSTRACT

Transmitters and communication systems are disclosed. In one example, a transmitter includes first to third serializers that generate first to third serial signals; a first output section configured to set a voltage of a first output terminal; a first output control circuit configured to control an operation of the first output section on the basis of the first serial signal and the second serial signal; a second output section configured to set a voltage of a second output terminal; a second output control circuit configured to control an operation of the second output section on the basis of the third serial signal and the first serial signal; a third output section configured to set a voltage of a third output terminal; and a third output control circuit configured to control an operation of the third output section on the basis of the second serial signal and the third serial signal.

14 Claims, 43 Drawing Sheets

(56) References Cited

FOREIGN PATENT DOCUMENTS

| JP | 2016006937 A | 1/2016 | |
|---|---|---|---|
| WO | 2015/146510 A1 | 10/2015 | |
| WO | WO-2015194089 A1 * | 12/2015 | ............... H04B 1/40 |

OTHER PUBLICATIONS

International Search Report (PCT/ISA/210), International Application No. PCT/JP2020/019688, dated May 18, 2020.

* cited by examiner

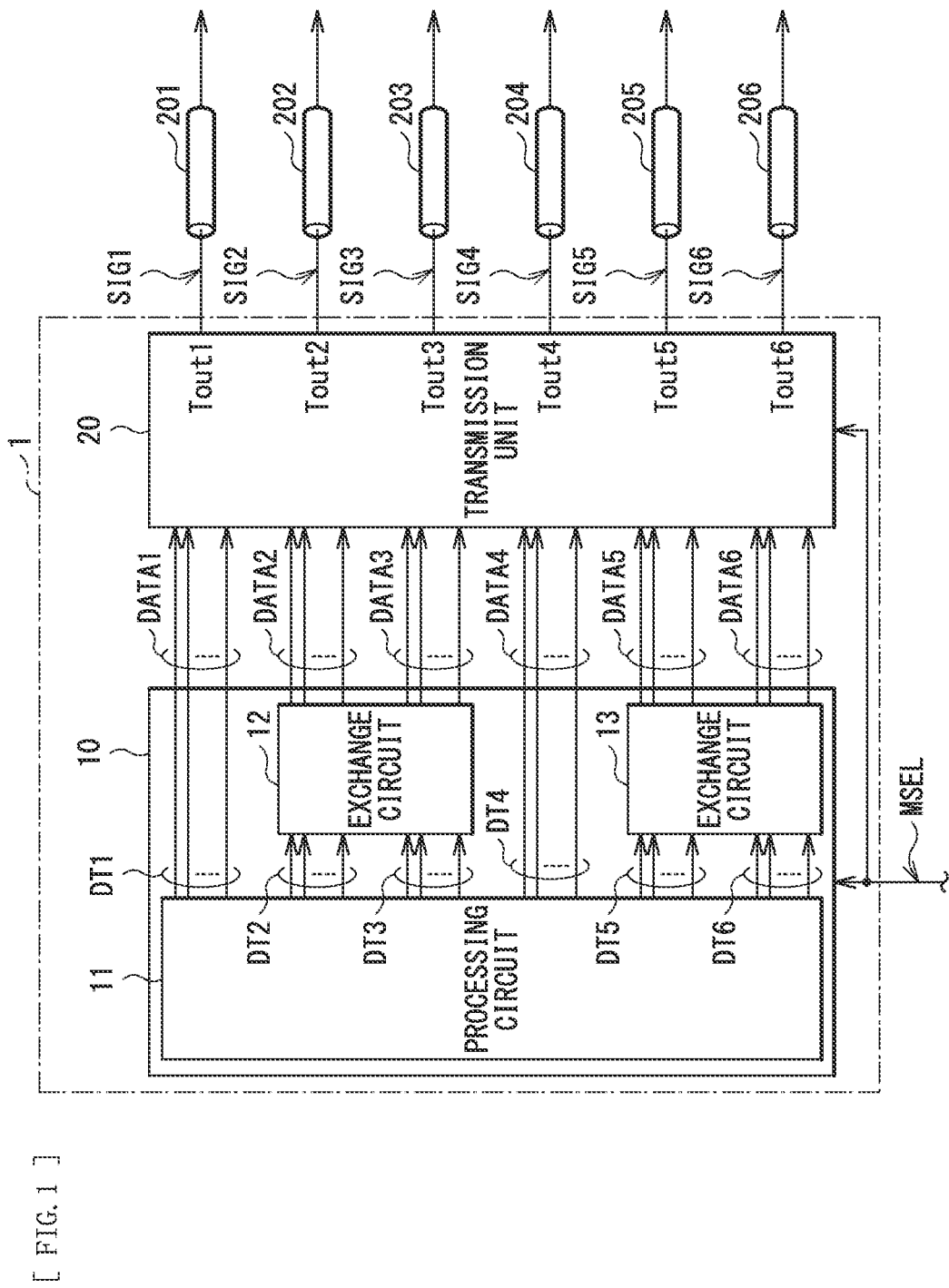
[FIG. 1]

[ FIG. 2 ]
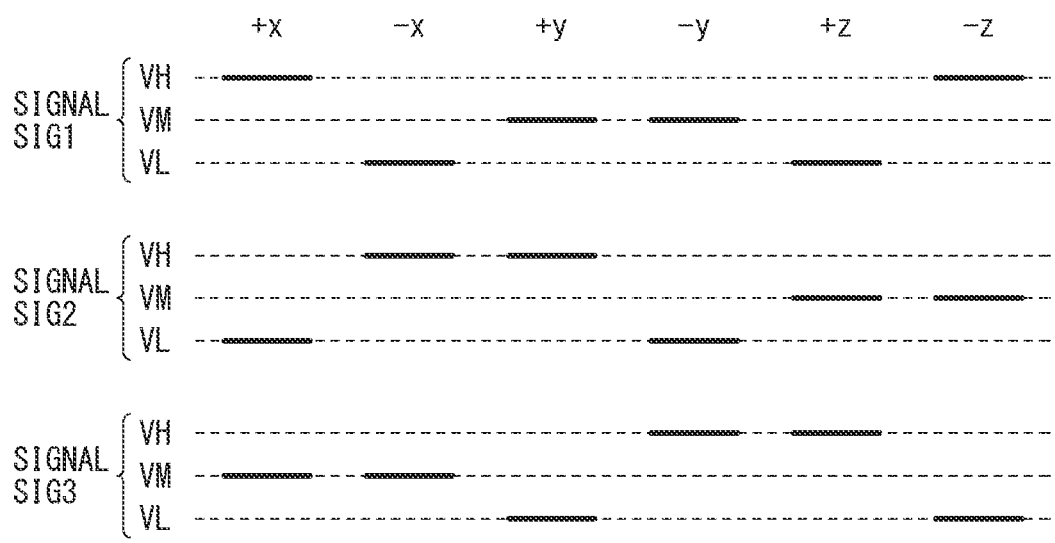

[FIG. 3]
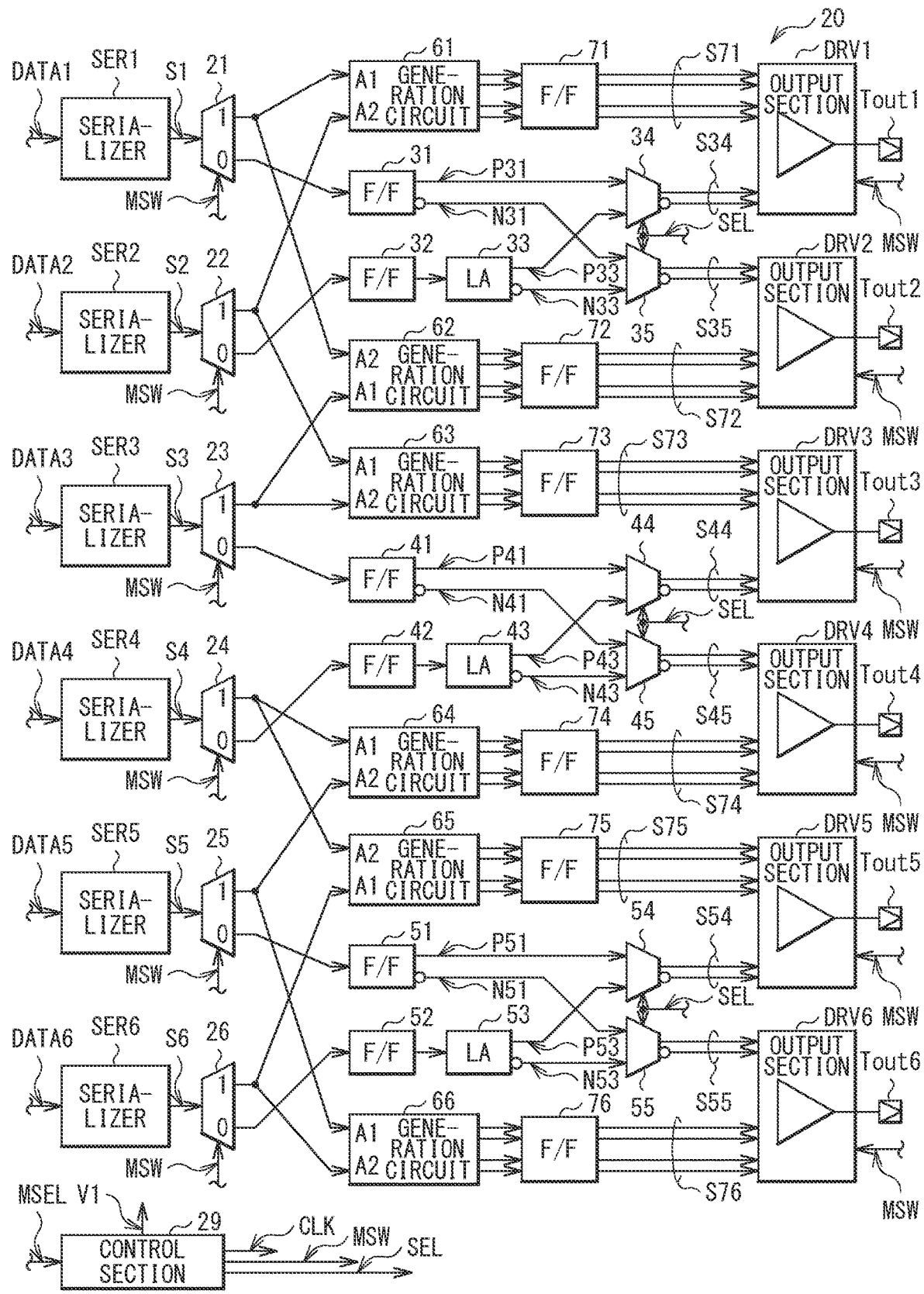

[FIG. 4]
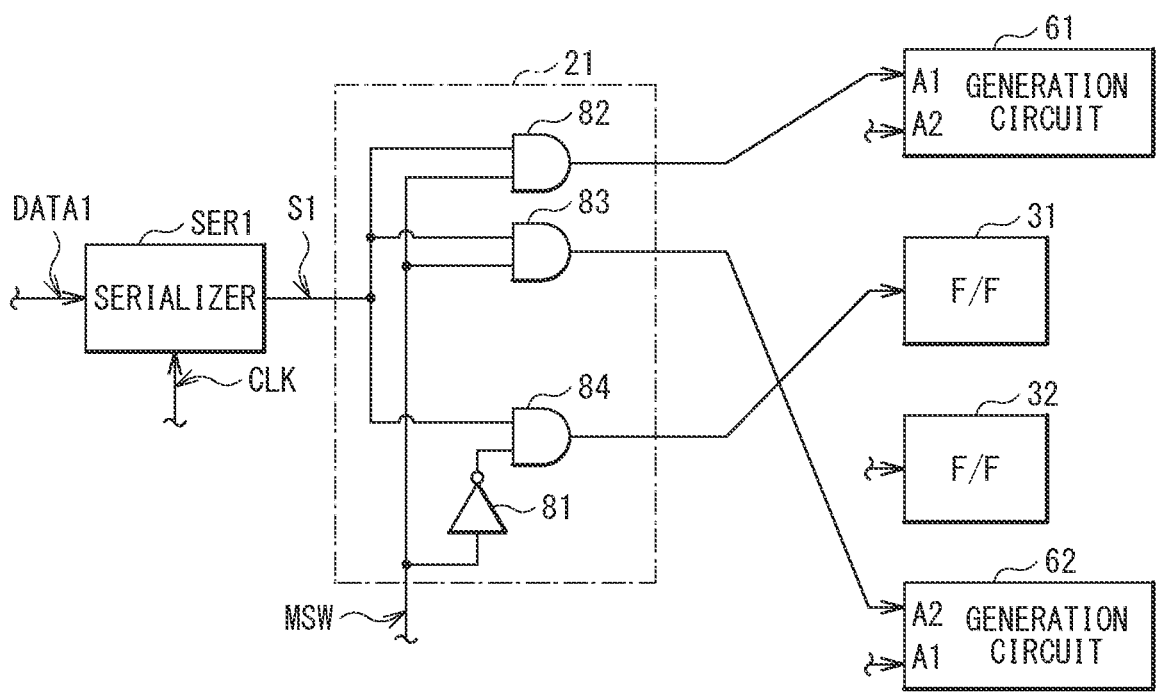

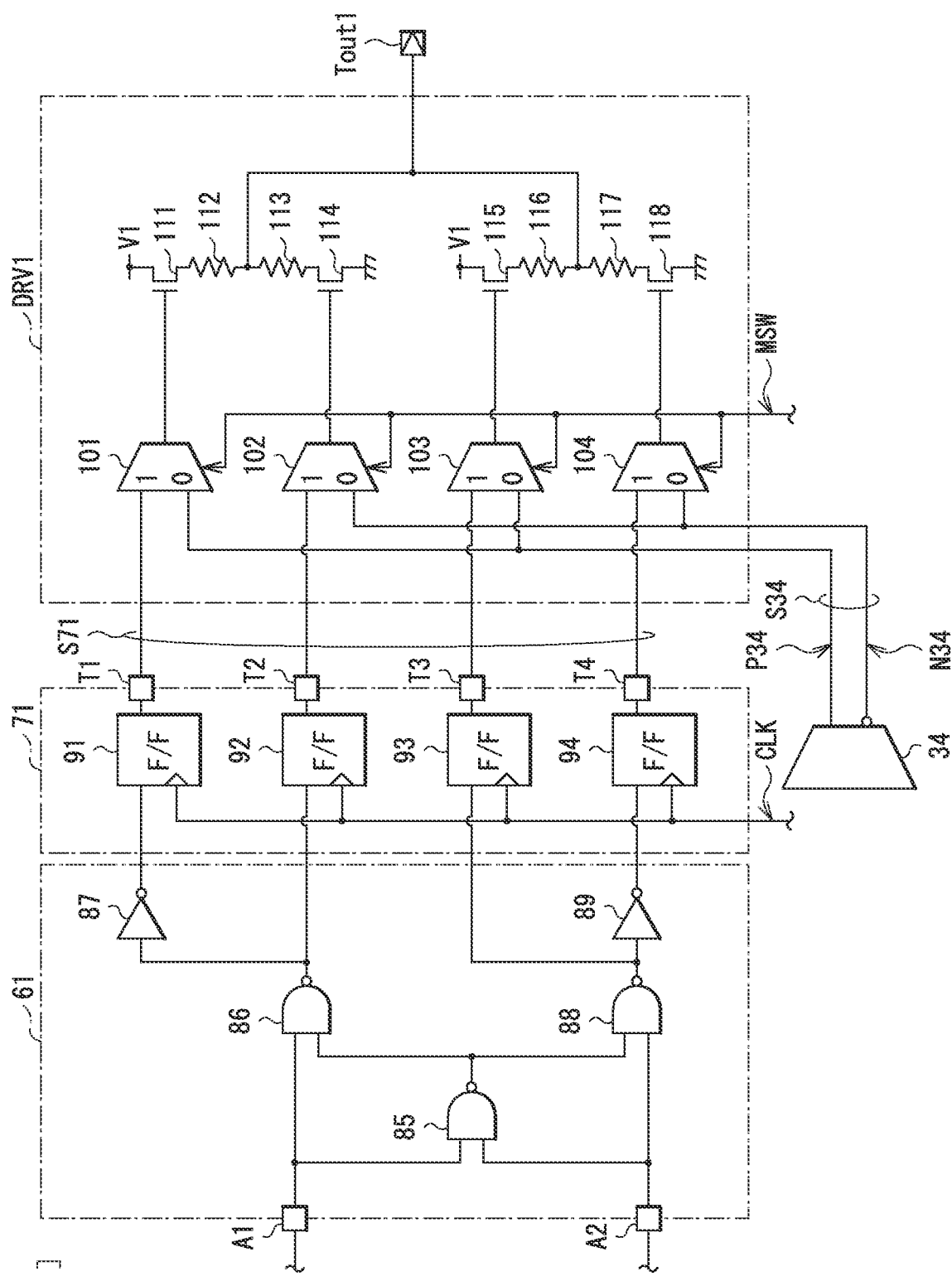
[FIG. 5]

[ FIG. 6 ]

| SIGNAL SA1 | SIGNAL SA2 | SIGNAL ST1 | SIGNAL ST2 | SIGNAL ST3 | SIGNAL ST4 | SIGNAL SIG1 |
|---|---|---|---|---|---|---|
| 0 | 0 | 0 | 1 | 1 | 0 | VM |
| 0 | 1 | 0 | 1 | 0 | 1 | VL |
| 1 | 0 | 1 | 0 | 1 | 0 | VH |
| 1 | 1 | 0 | 1 | 1 | 0 | VM |

[FIG. 7]

| SYMBOL | SERIAL SIGNAL S1 | SERIAL SIGNAL S2 | SERIAL SIGNAL S3 | GENERATION CIRCUIT 61 | | GENERATION CIRCUIT 62 | | GENERATION CIRCUIT 63 | | SIGNAL SIG1 | SIGNAL SIG2 | SIGNAL SIG3 |
|---|---|---|---|---|---|---|---|---|---|---|---|---|
| | | | | SIGNAL SA1 | SIGNAL SA2 | SIGNAL SA1 | SIGNAL SA2 | SIGNAL SA1 | SIGNAL SA2 | | | |
| +x | 1 | 0 | 0 | 1 | 0 | 0 | 1 | 0 | 0 | VH | VL | VM |
| -x | 0 | 1 | 1 | 0 | 1 | 1 | 0 | 1 | 1 | VL | VH | VM |
| +y | 0 | 0 | 1 | 0 | 0 | 1 | 0 | 0 | 1 | VM | VH | VL |
| -y | 1 | 1 | 0 | 1 | 1 | 0 | 1 | 1 | 0 | VM | VL | VH |
| +z | 0 | 1 | 0 | 0 | 1 | 0 | 0 | 1 | 0 | VL | VM | VH |
| -z | 1 | 0 | 1 | 1 | 0 | 1 | 1 | 0 | 1 | VH | VM | VL |

[FIG. 8]
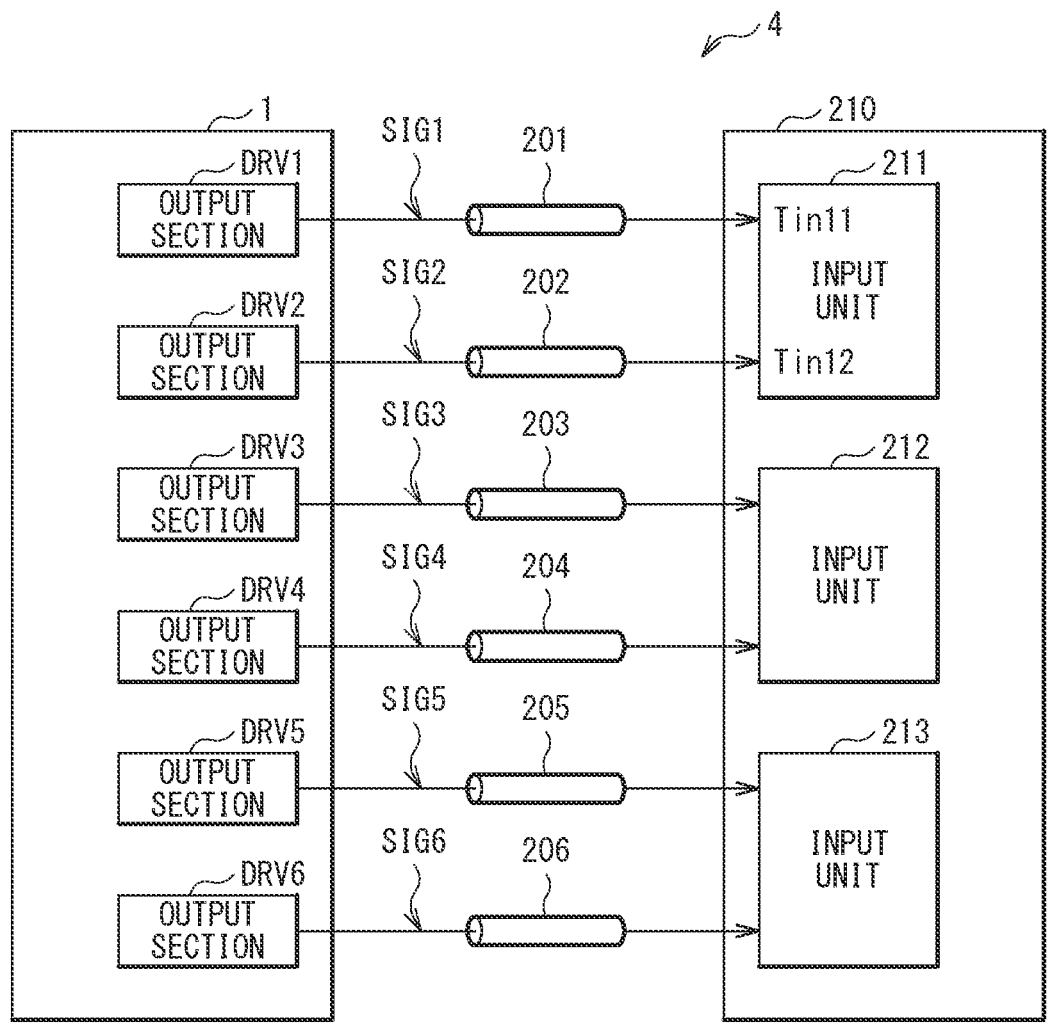
[FIG. 9]
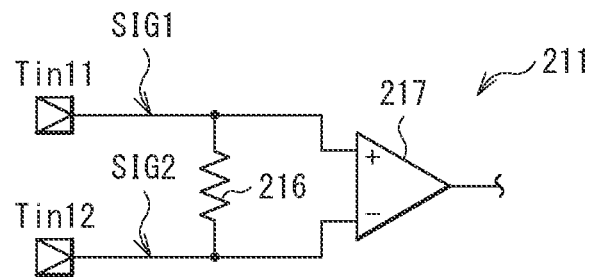

[FIG. 10]
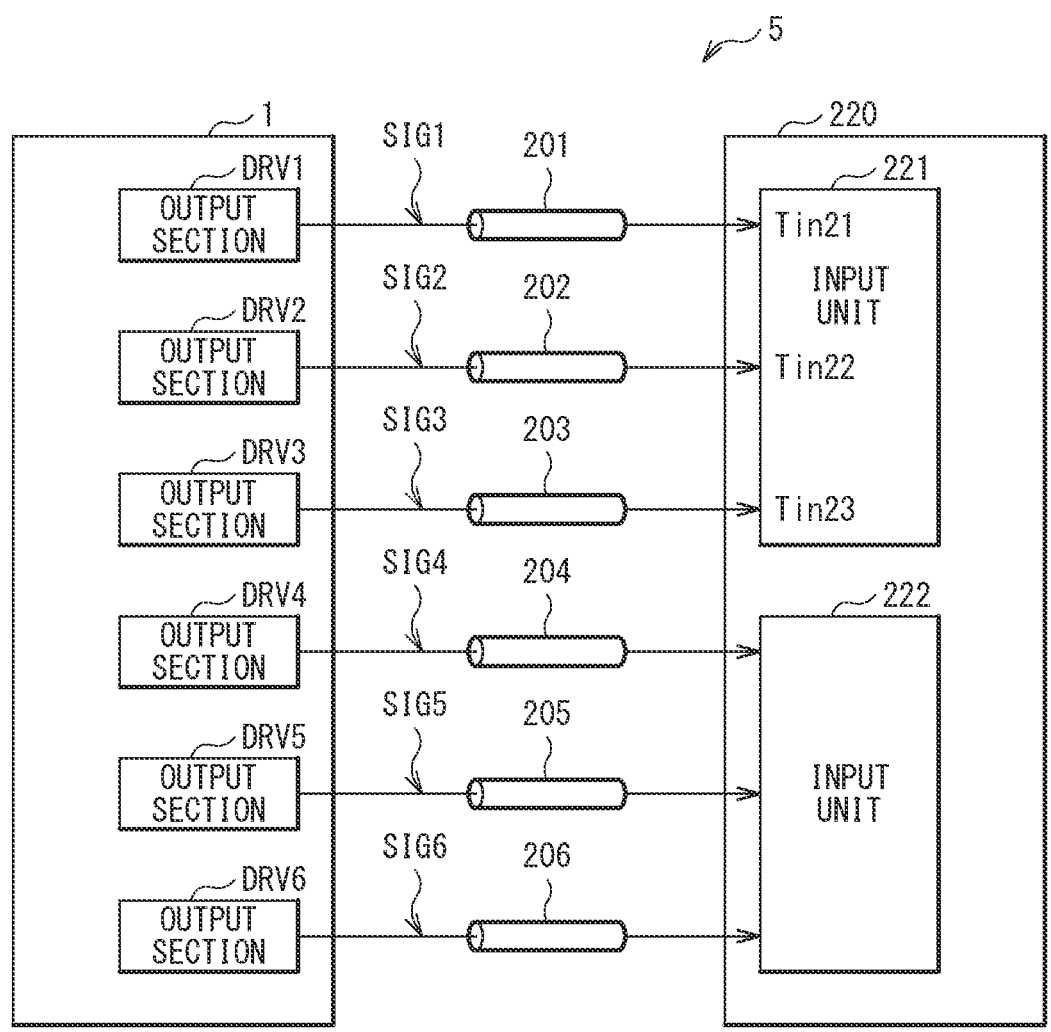

[ FIG. 11 ]
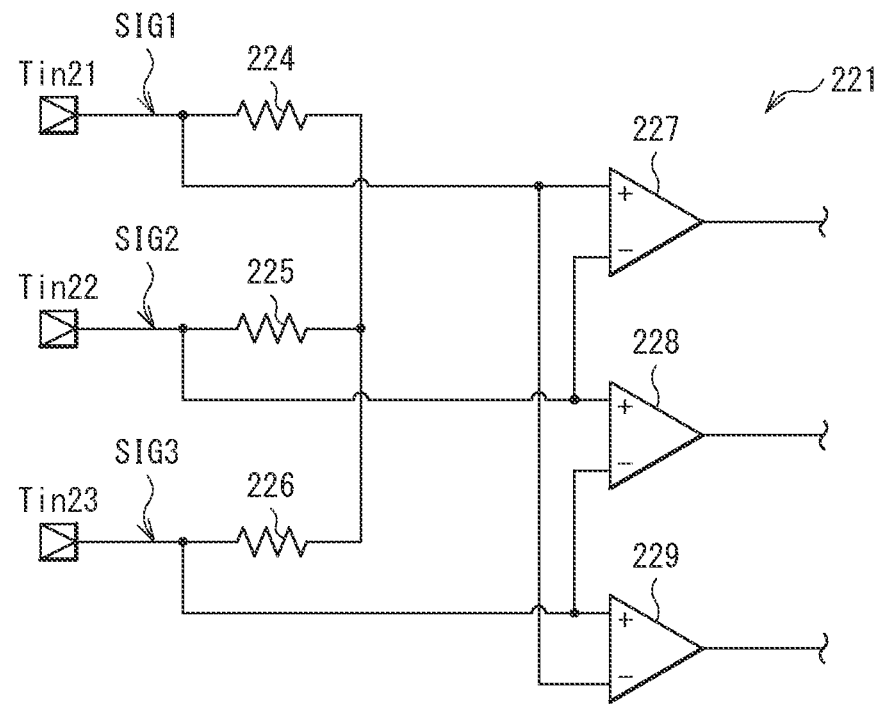
[ FIG. 12 ]
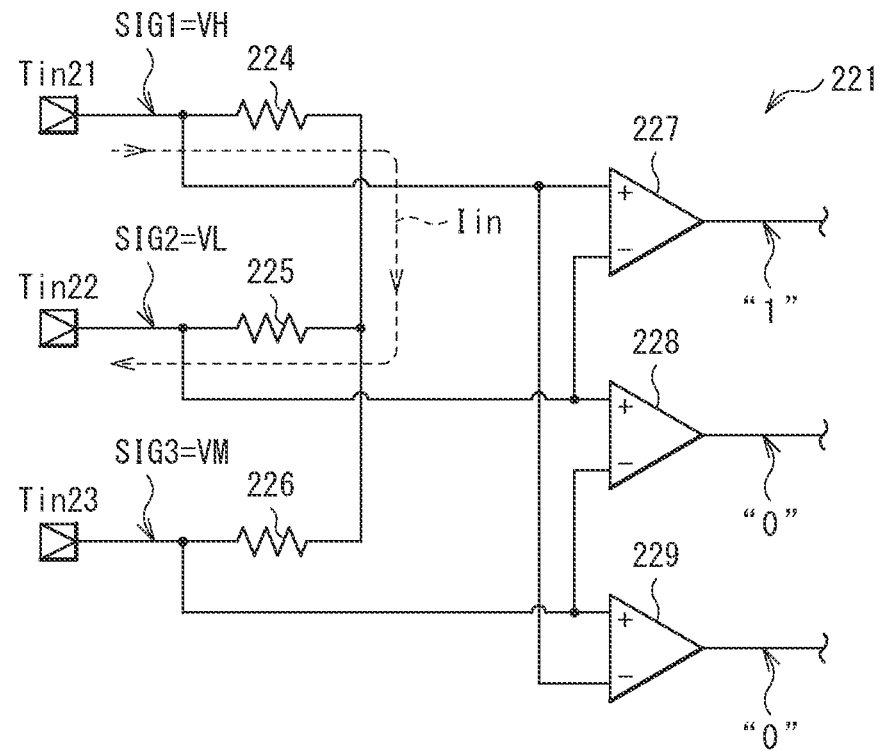

[FIG. 13]
| SYMBOL | SIGNAL SIG1 | SIGNAL SIG2 | SIGNAL SIG3 | OUTPUT SIGNAL OF AMPLIFIER 227 | OUTPUT SIGNAL OF AMPLIFIER 228 | OUTPUT SIGNAL OF AMPLIFIER 229 |
|---|---|---|---|---|---|---|
| +x | VH | VL | VM | 1 | 0 | 0 |
| −x | VL | VH | VM | 0 | 1 | 1 |
| +y | VM | VH | VL | 0 | 1 | 0 |
| −y | VM | VL | VH | 1 | 0 | 1 |
| +z | VL | VM | VH | 0 | 0 | 1 |
| −z | VH | VM | VL | 1 | 1 | 0 |
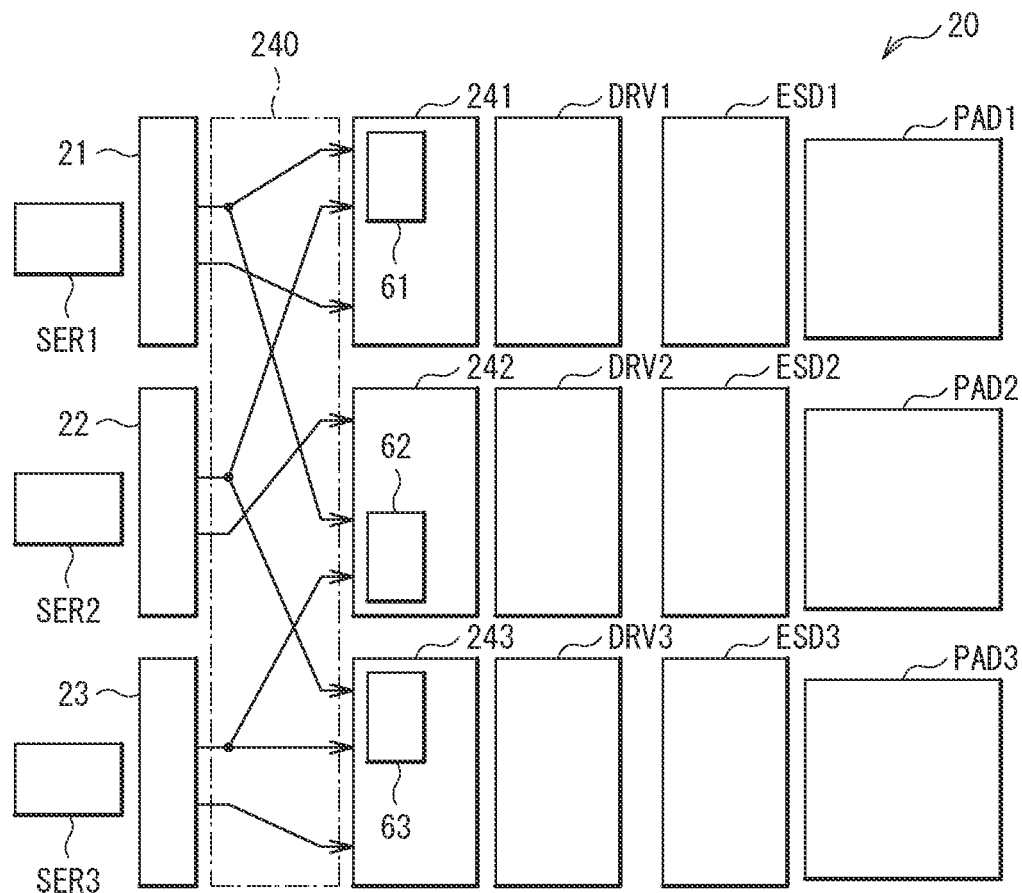
[FIG. 14]

[FIG. 15A]
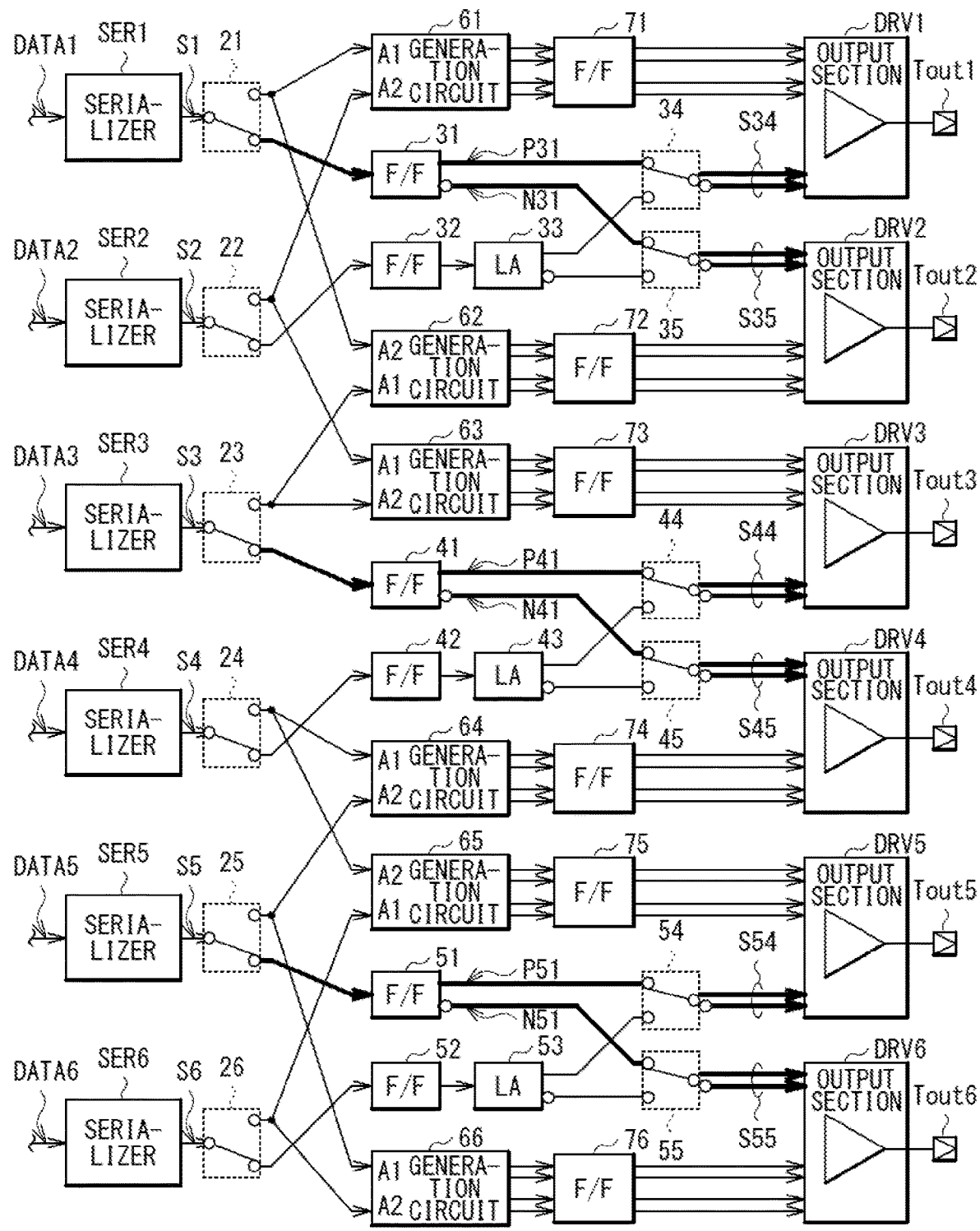

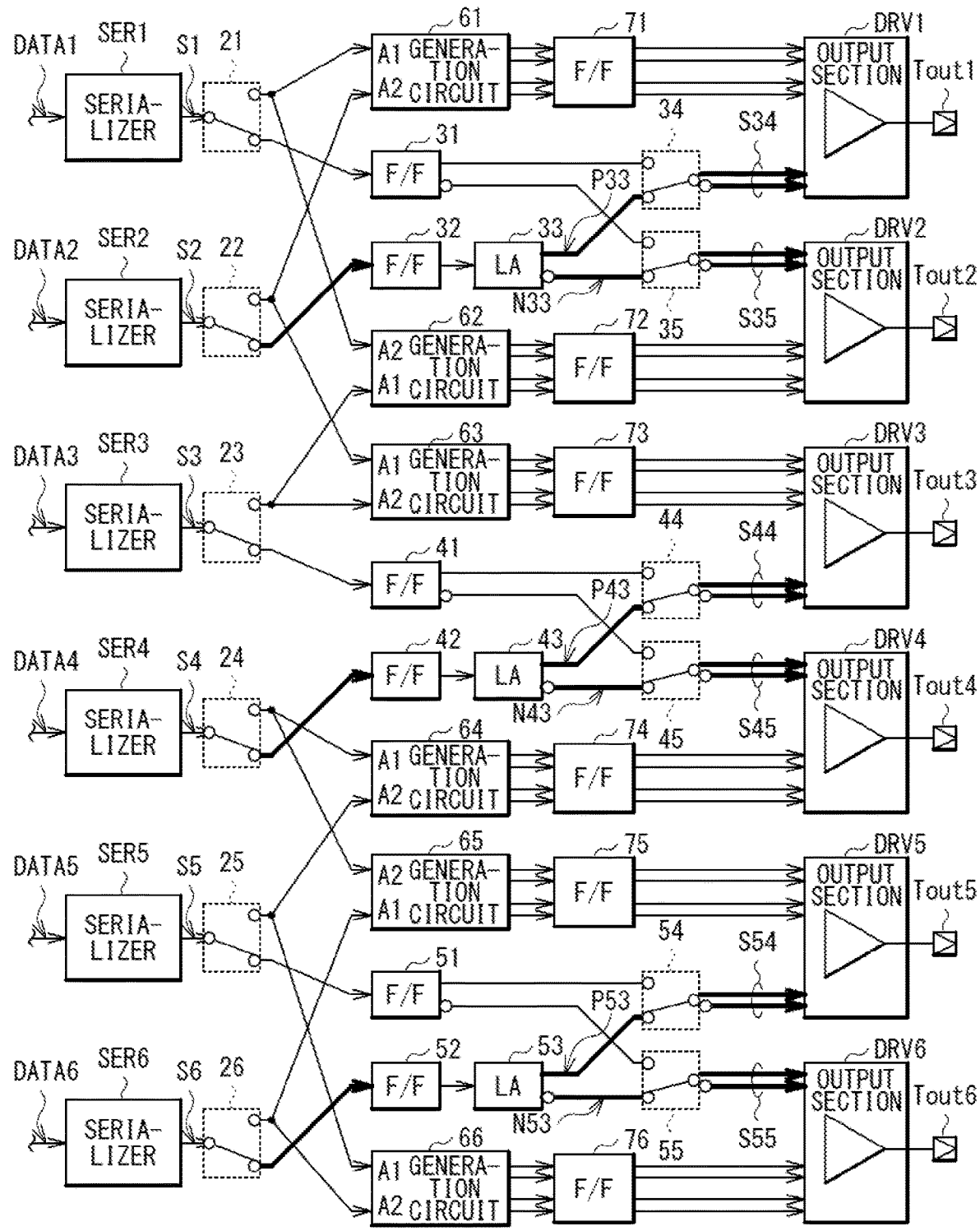
[FIG. 15B]

[ FIG. 16 ]
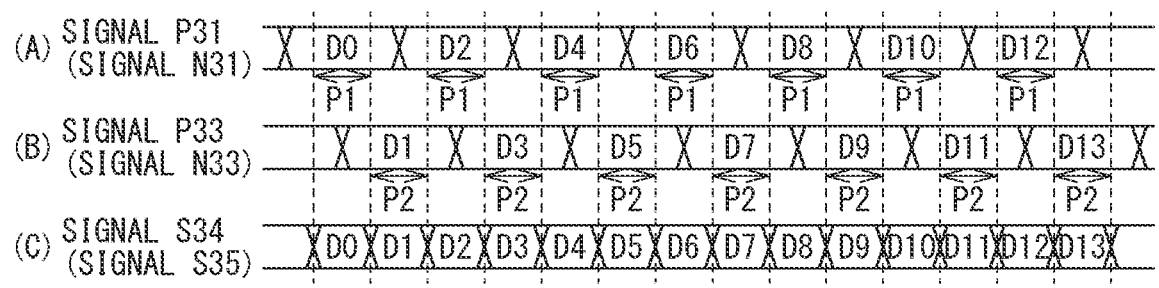

[FIG. 17]
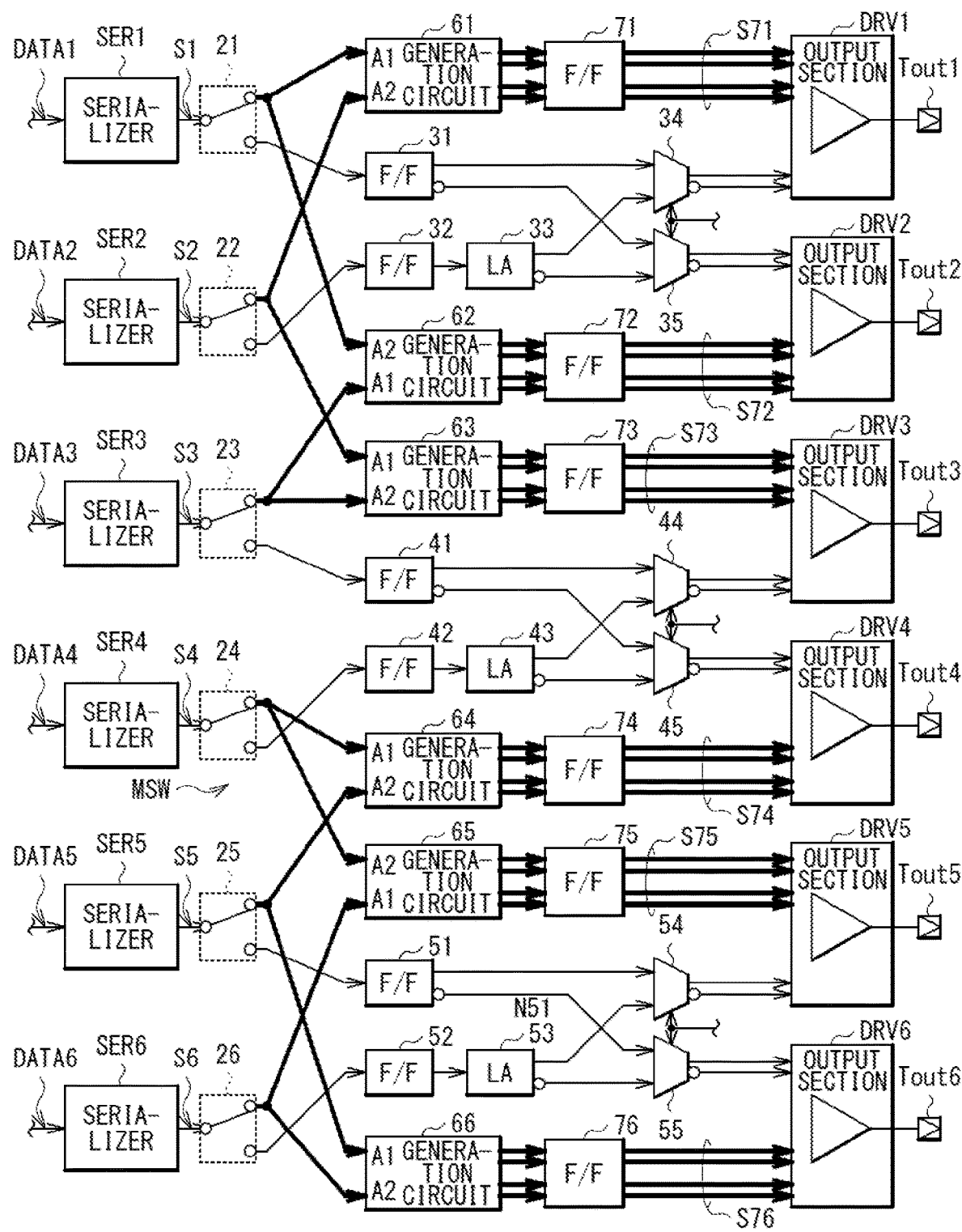

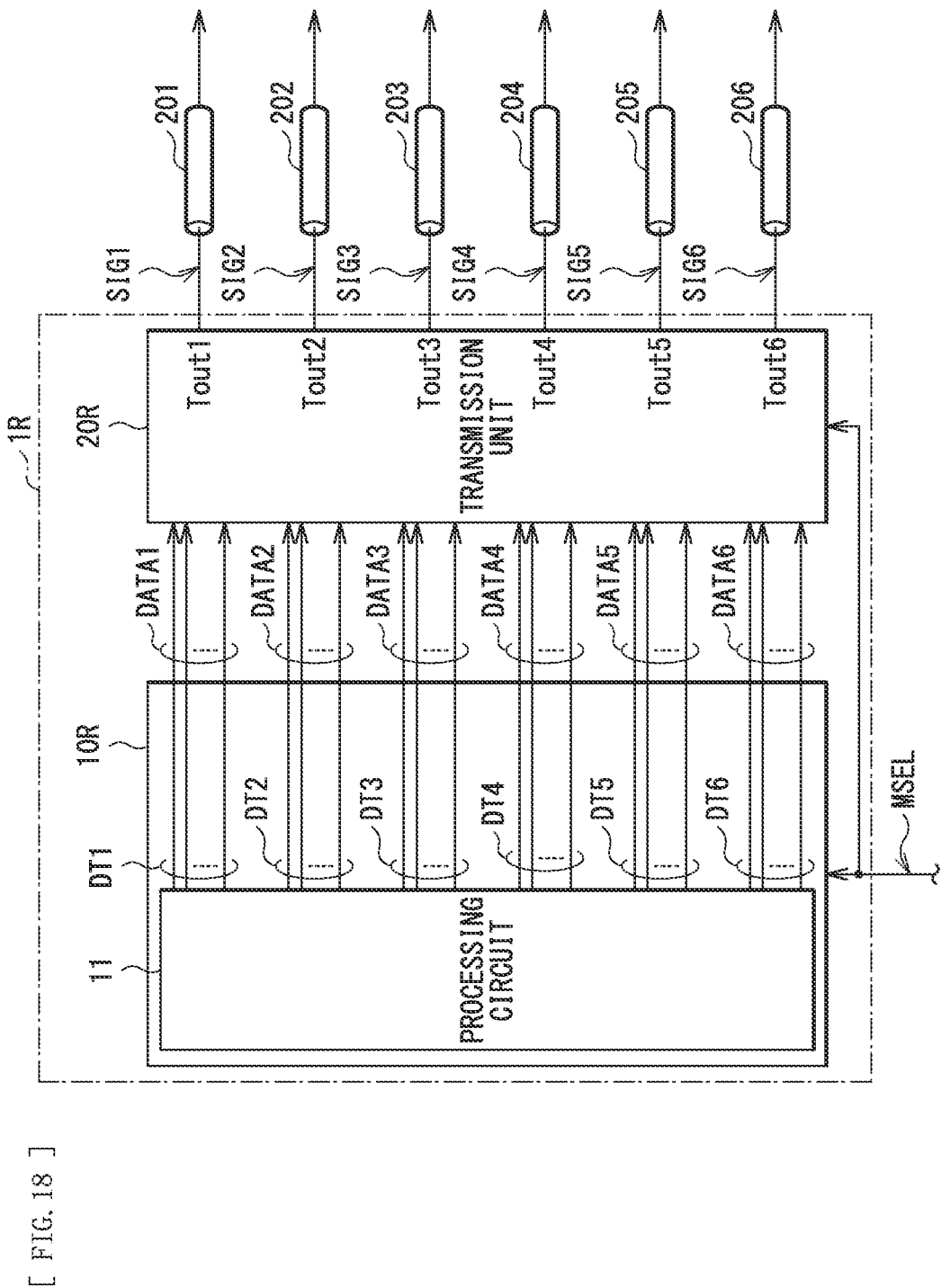
[FIG. 18]

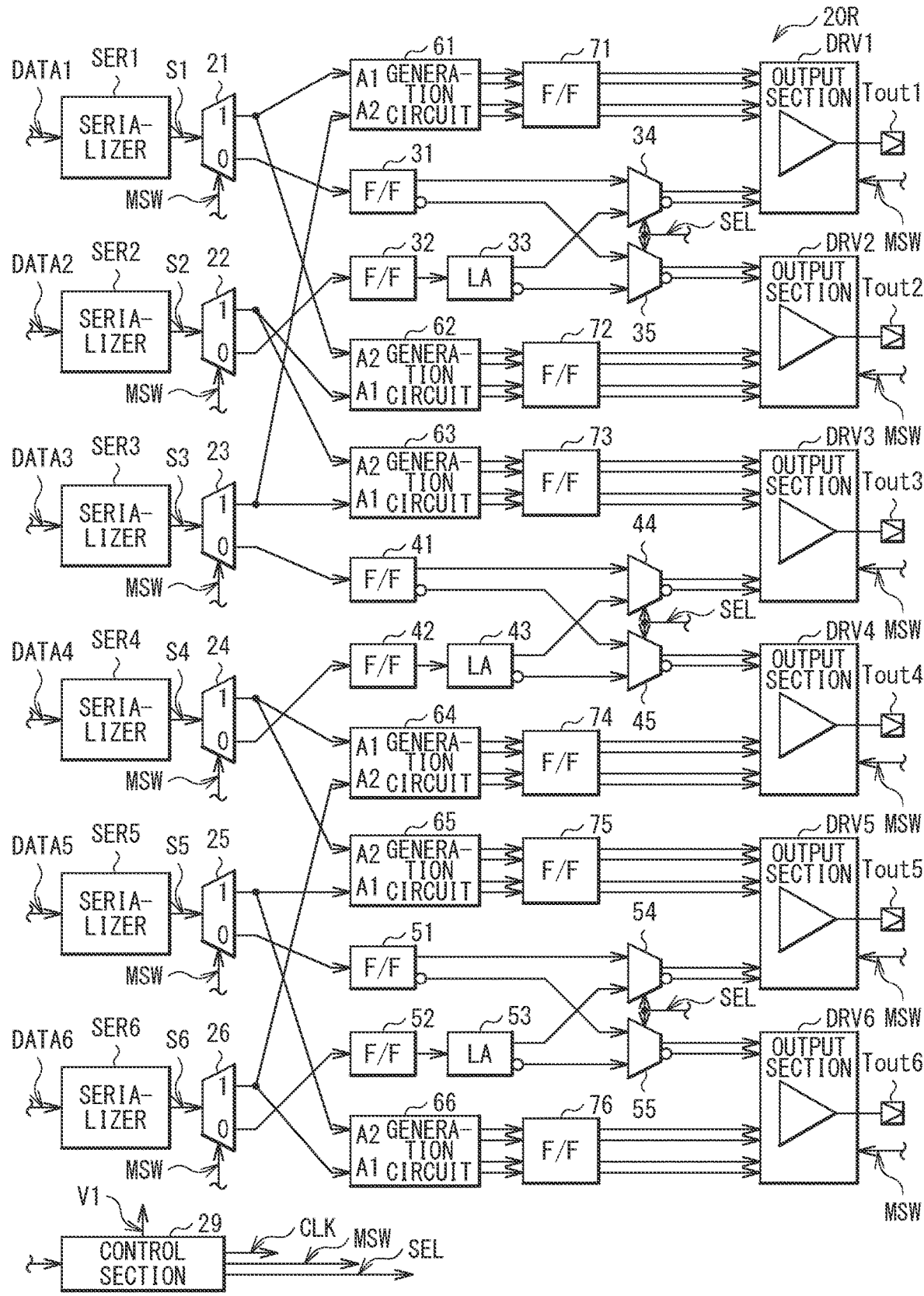
[FIG. 19]

[ FIG. 20 ]

| SYMBOL | SERIAL SIGNAL S1 | SERIAL SIGNAL S2 | SERIAL SIGNAL S3 | GENERATION CIRCUIT 61 | | GENERATION CIRCUIT 62 | | GENERATION CIRCUIT 63 | | SIGNAL SIG1 | SIGNAL SIG2 | SIGNAL SIG3 |
|---|---|---|---|---|---|---|---|---|---|---|---|---|
| | | | | SIGNAL SA1 | SIGNAL SA2 | SIGNAL SA1 | SIGNAL SA2 | SIGNAL SA1 | SIGNAL SA2 | | | |
| +x | 1 | 0 | 0 | 1 | 0 | 0 | 1 | 0 | 0 | VH | VL | VM |
| −x | 0 | 1 | 1 | 0 | 1 | 1 | 0 | 1 | 0 | VL | VH | VM |
| +y | 0 | 1 | 0 | 0 | 0 | 1 | 0 | 0 | 1 | VM | VH | VL |
| −y | 1 | 0 | 1 | 1 | 1 | 0 | 1 | 1 | 0 | VM | VL | VH |
| +z | 0 | 0 | 1 | 0 | 1 | 0 | 0 | 1 | 0 | VL | VM | VH |
| −z | 1 | 1 | 0 | 1 | 0 | 1 | 1 | 0 | 1 | VH | VM | VL |

[FIG. 21]
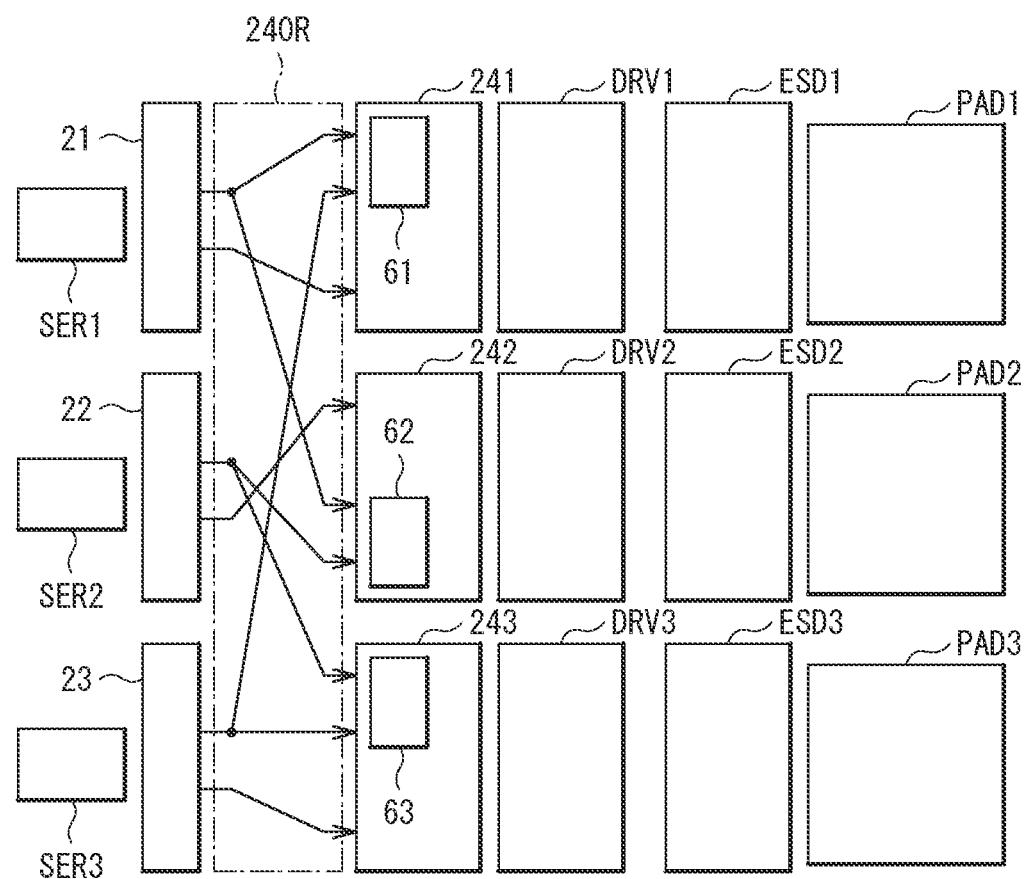

[ FIG. 22 ]
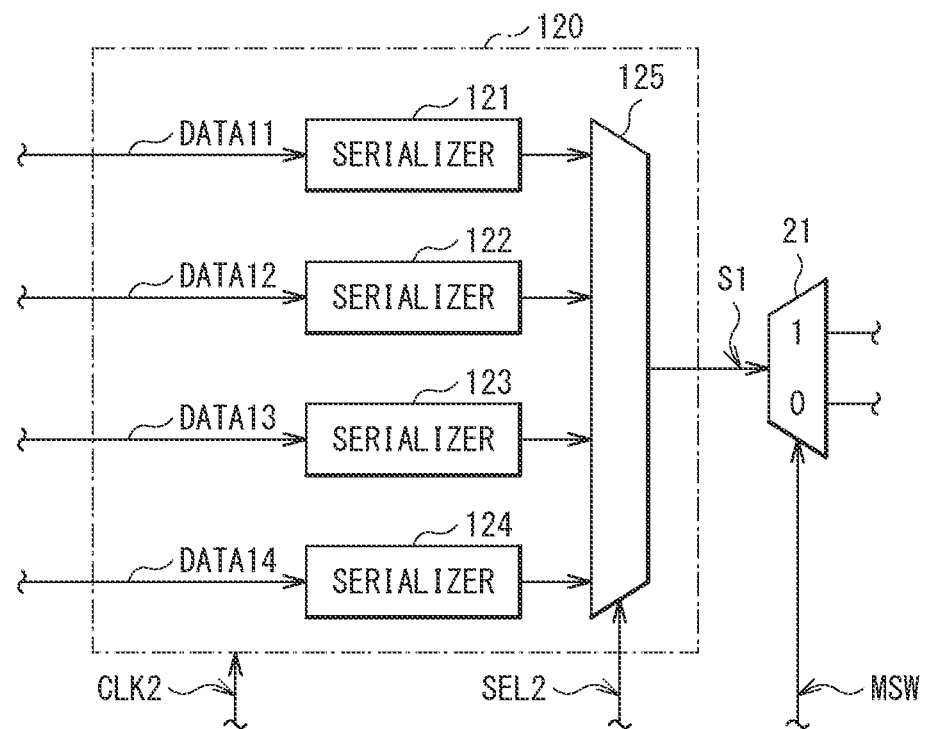
[ FIG. 23 ]
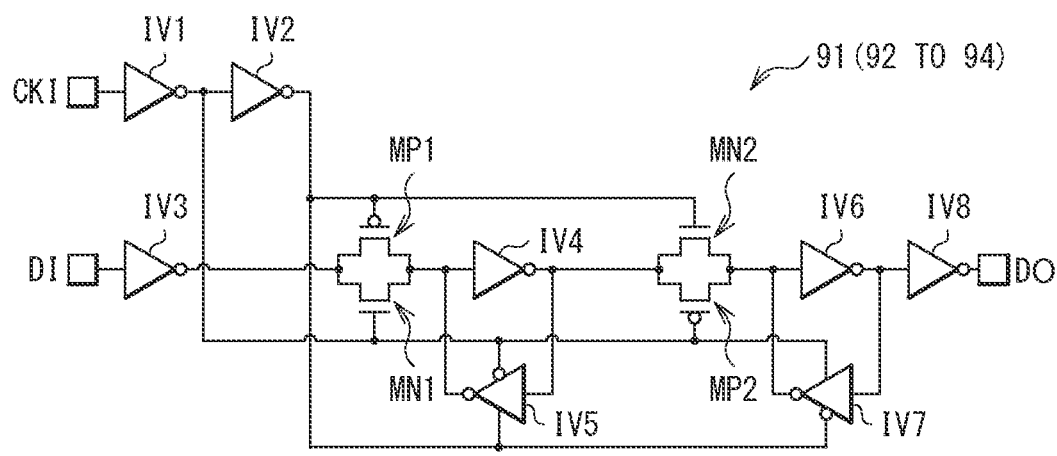

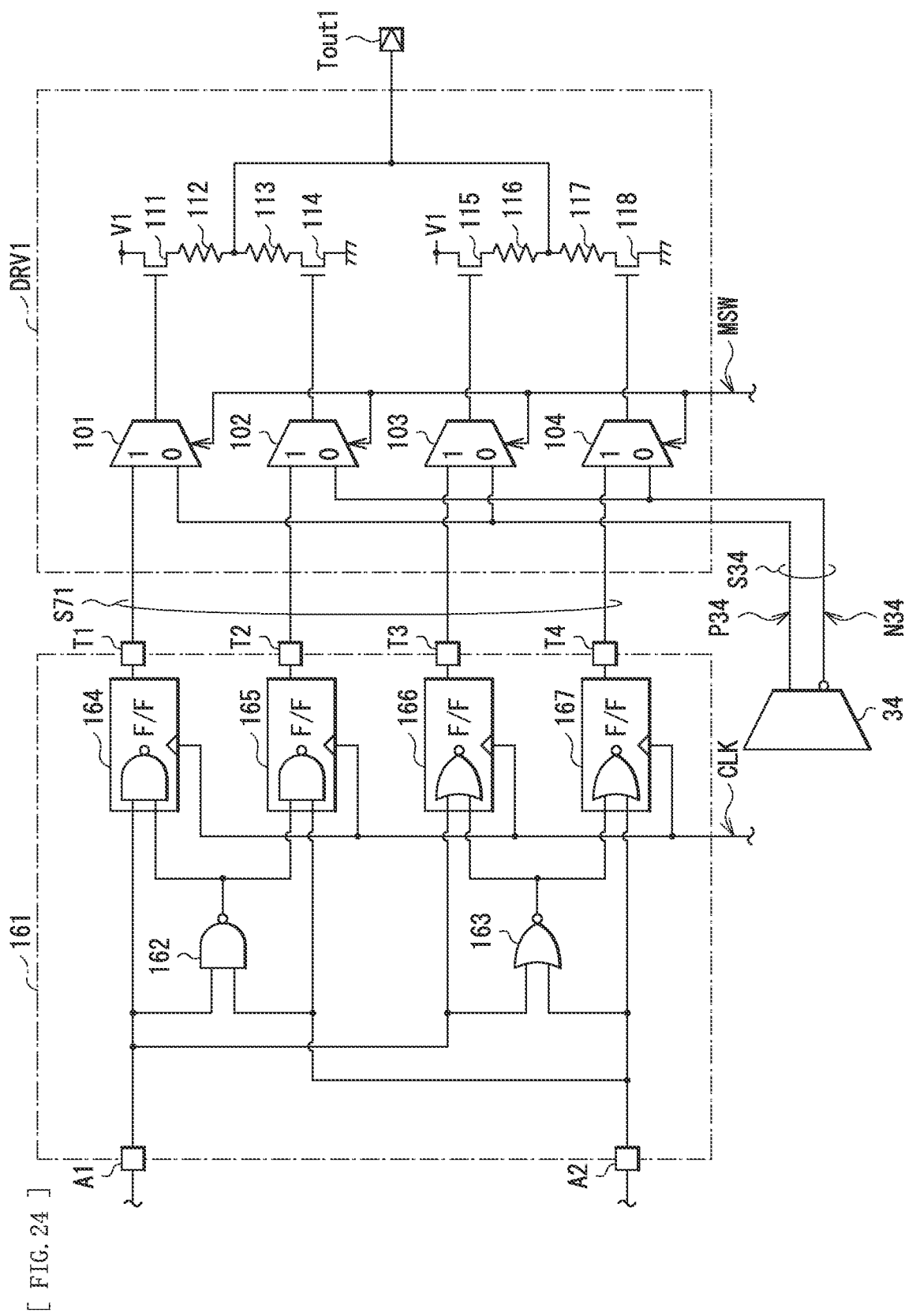
[ FIG. 24 ]

[ FIG. 25 ]
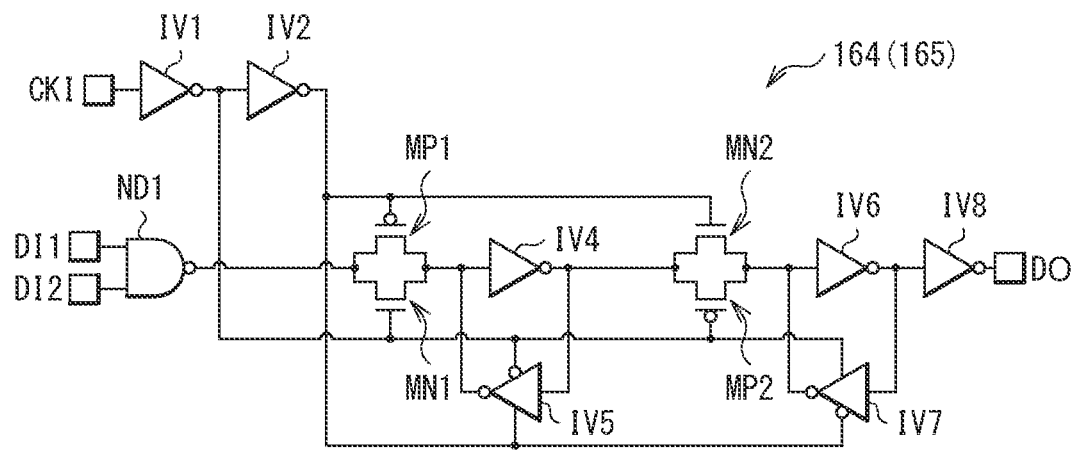
[ FIG. 26 ]
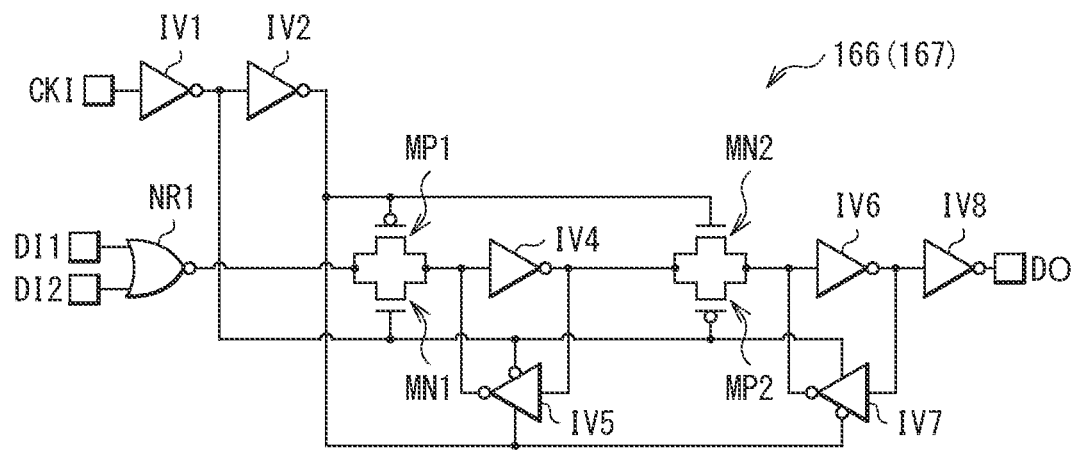

[ FIG. 27 ]
| SIGNAL SA1 | SIGNAL SA2 | SIGNAL ST1 | SIGNAL ST2 | SIGNAL ST3 | SIGNAL ST4 | SIGNAL SIG1 |
|---|---|---|---|---|---|---|
| 0 | 0 | 0 | 0 | 1 | 1 | VM |
| 0 | 1 | 0 | 1 | 0 | 1 | VL |
| 1 | 0 | 1 | 0 | 1 | 0 | VH |
| 1 | 1 | 0 | 0 | 1 | 1 | VM |
[ FIG. 28 ]
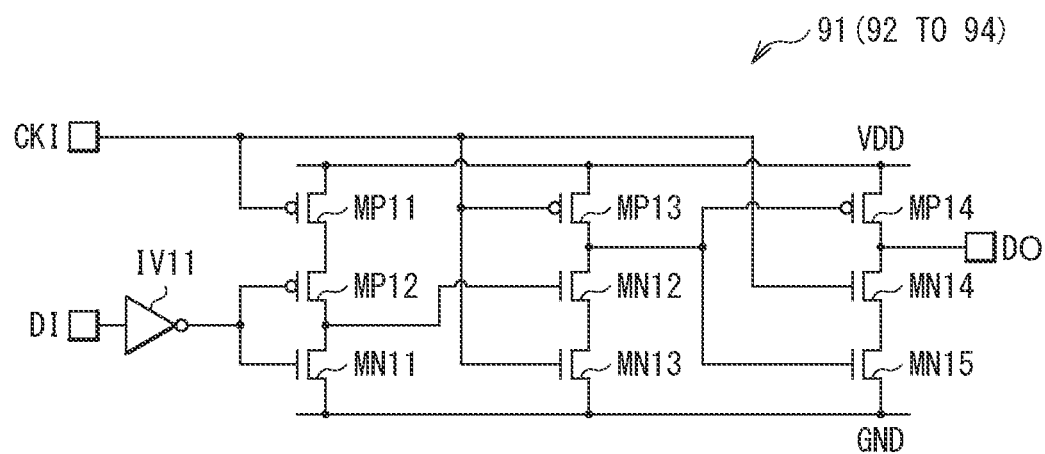

[ FIG. 29 ]
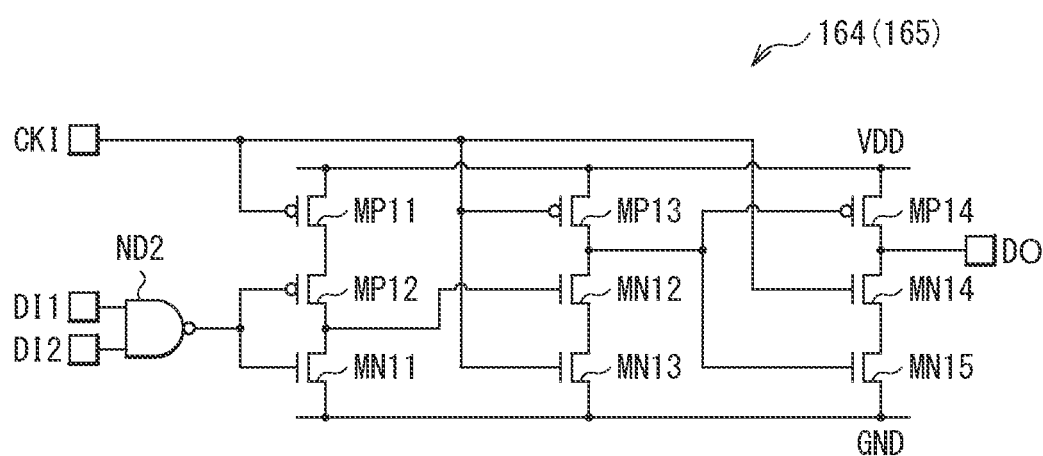
[ FIG. 30 ]
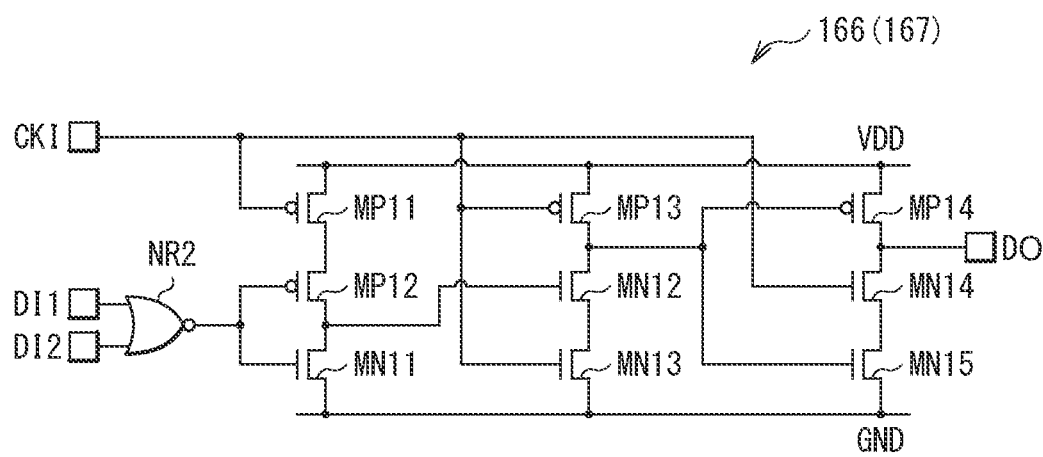

[FIG. 31]
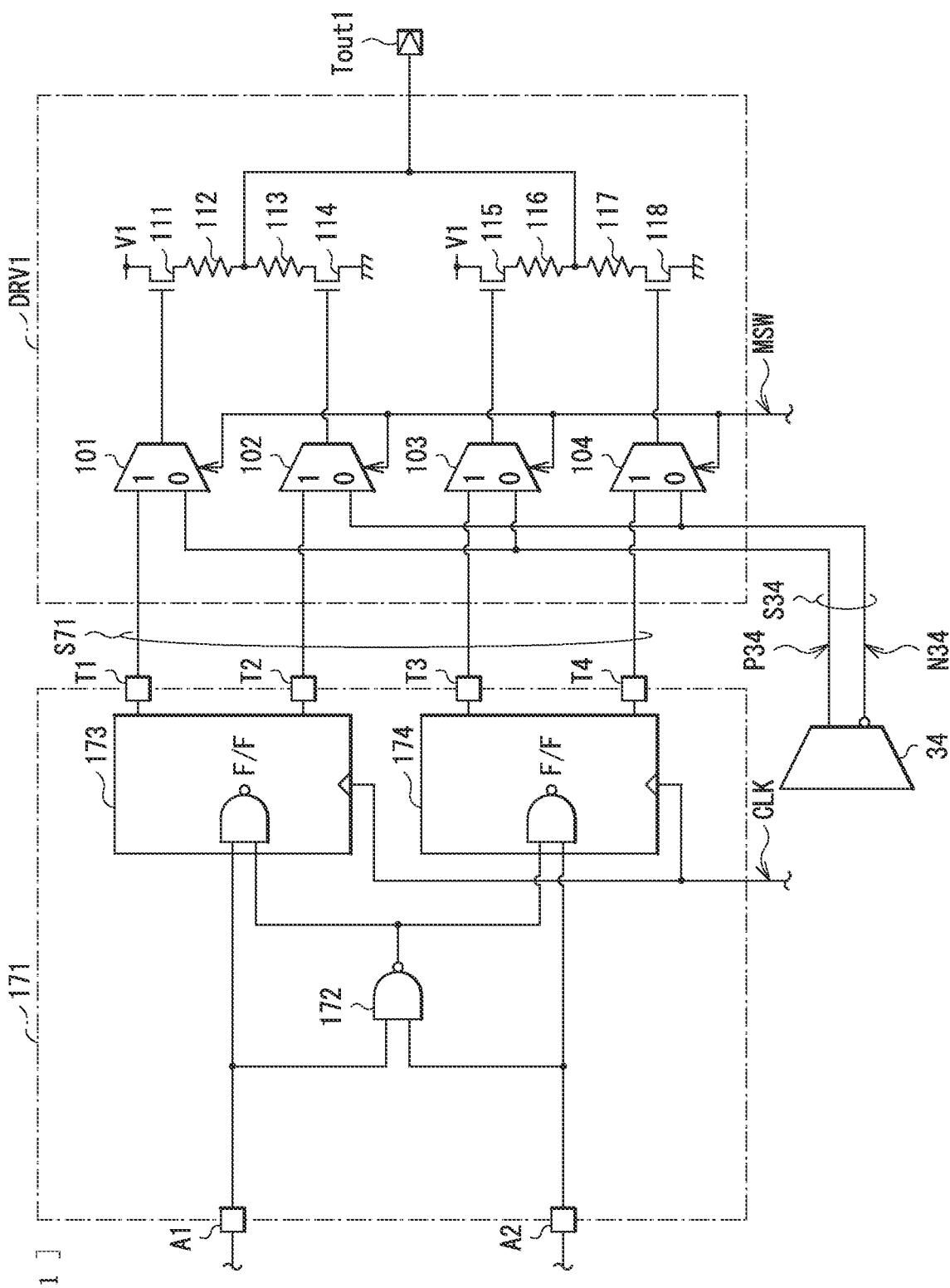

[ FIG. 32 ]
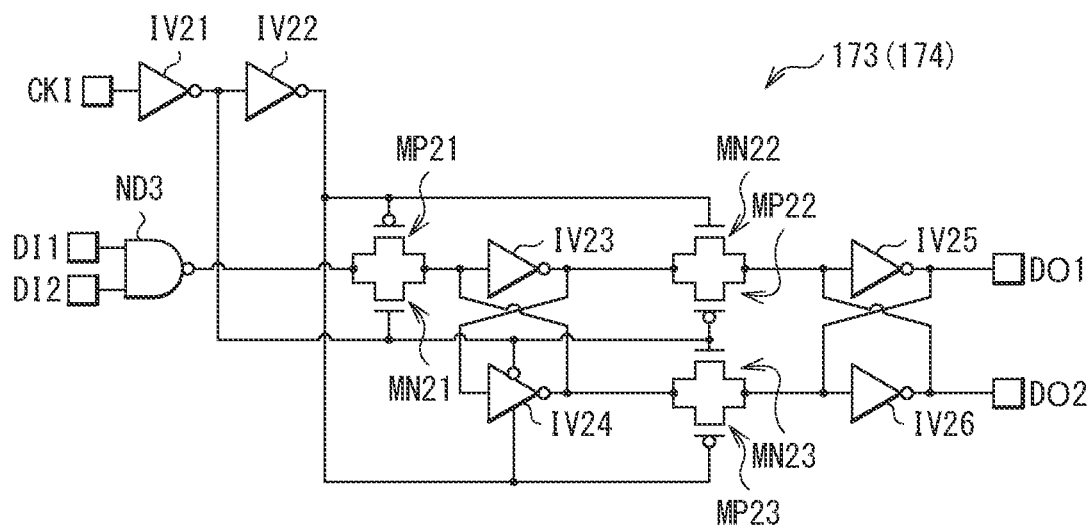

[FIG. 33]
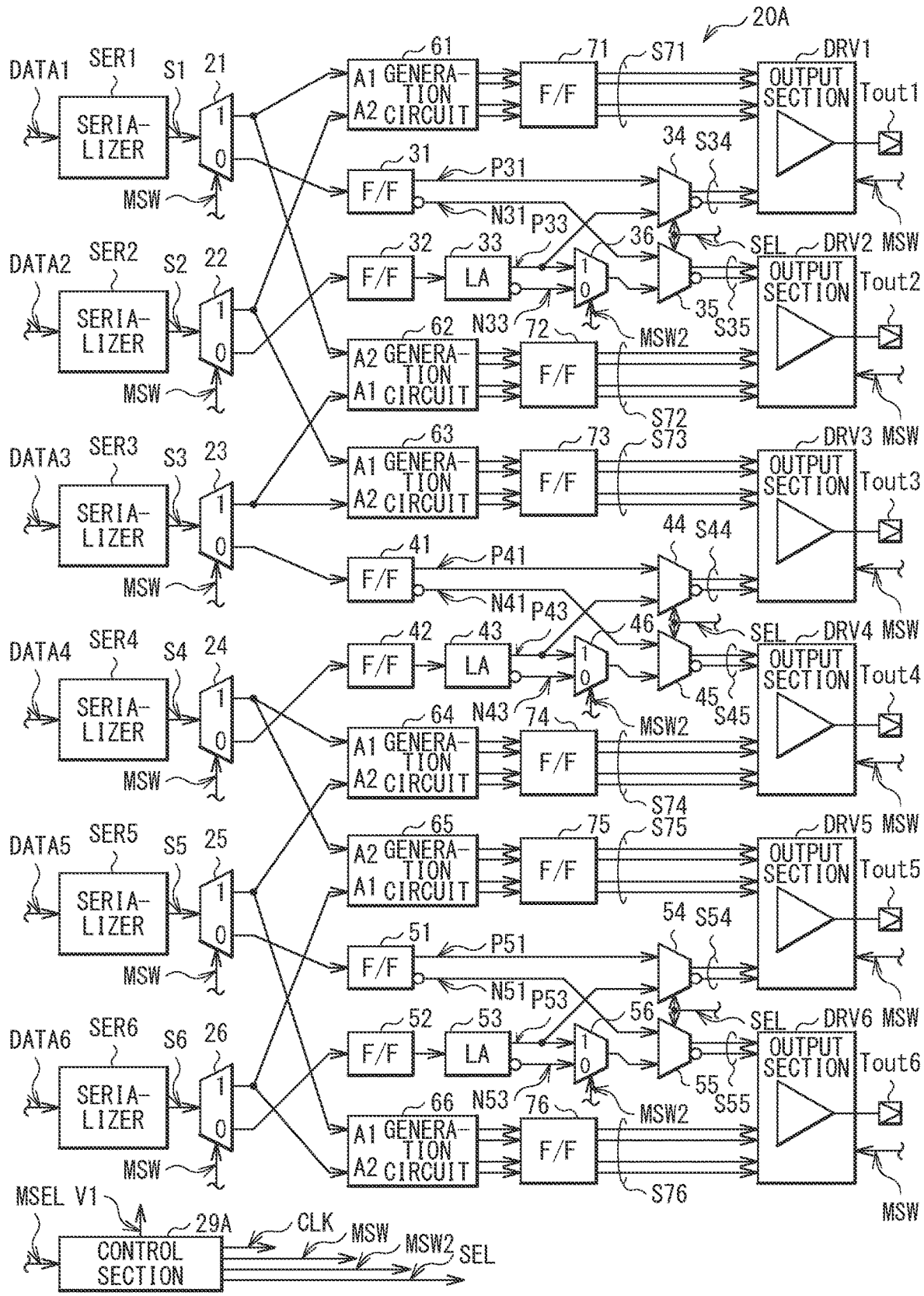

[ FIG. 34 ]
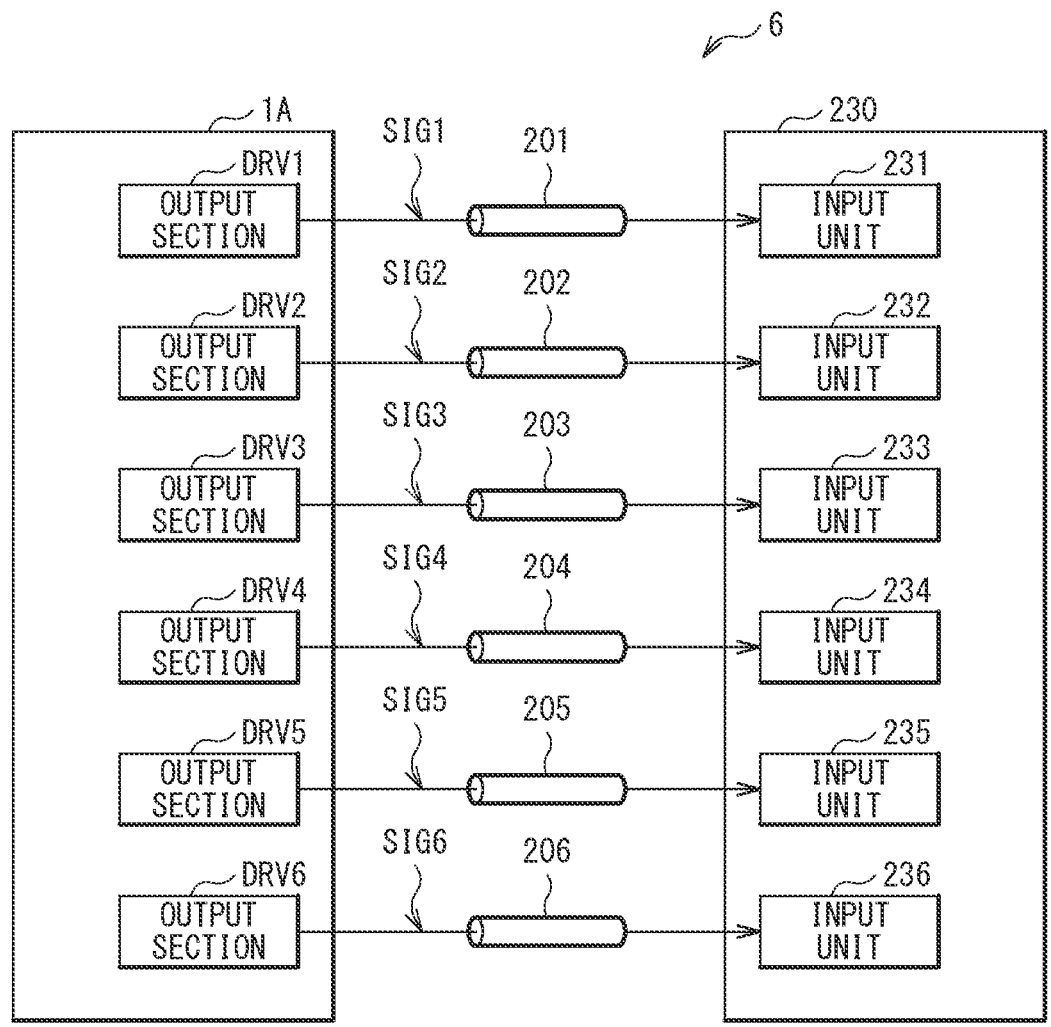
[ FIG. 35 ]
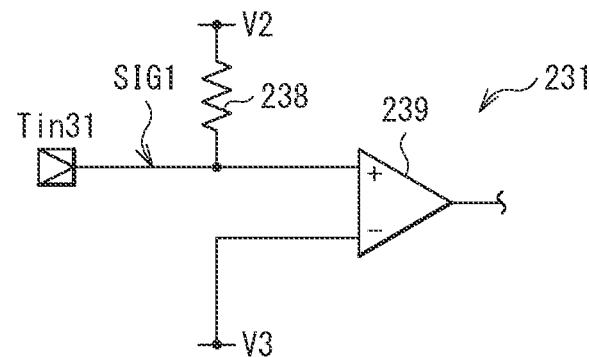

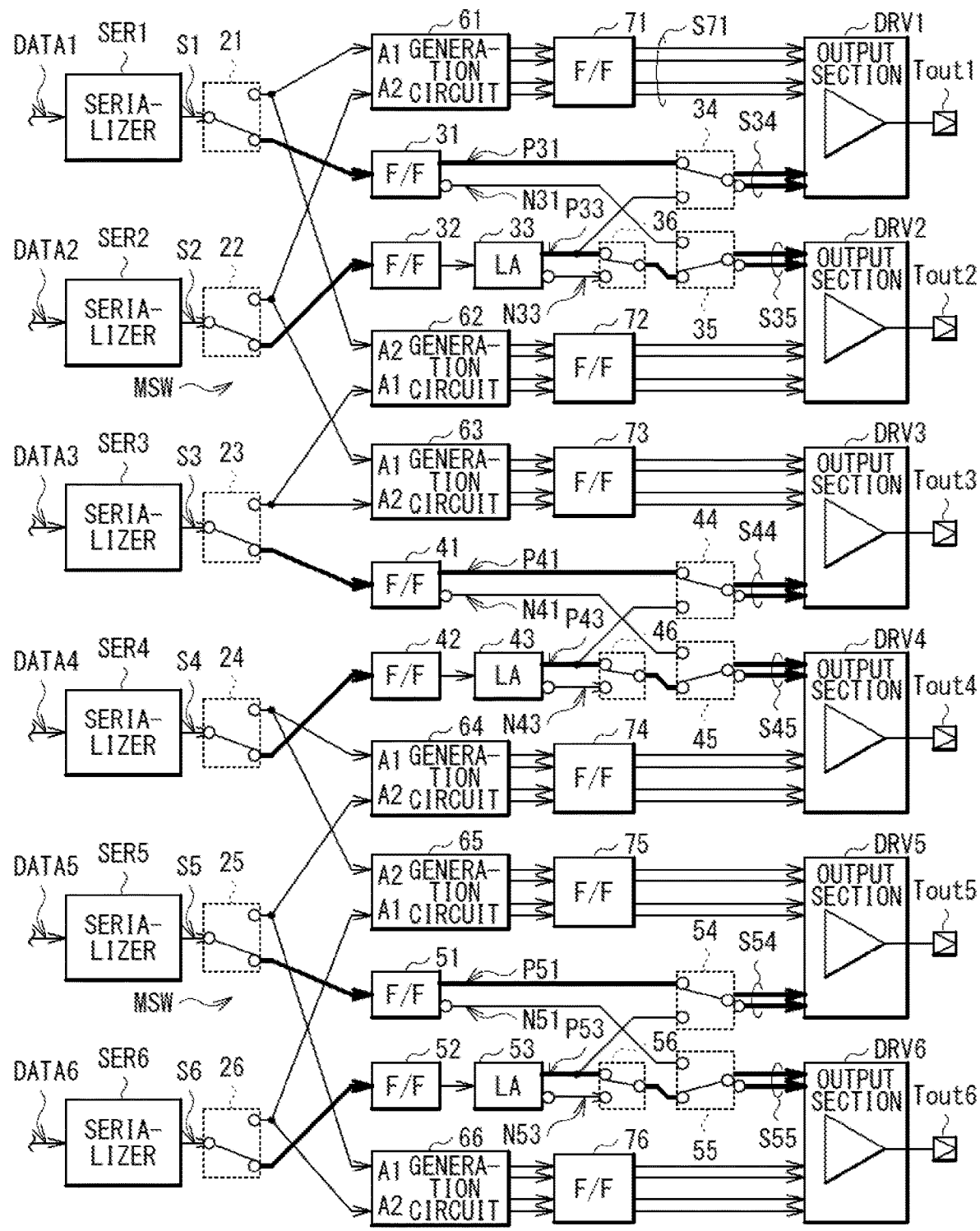
[FIG. 36]

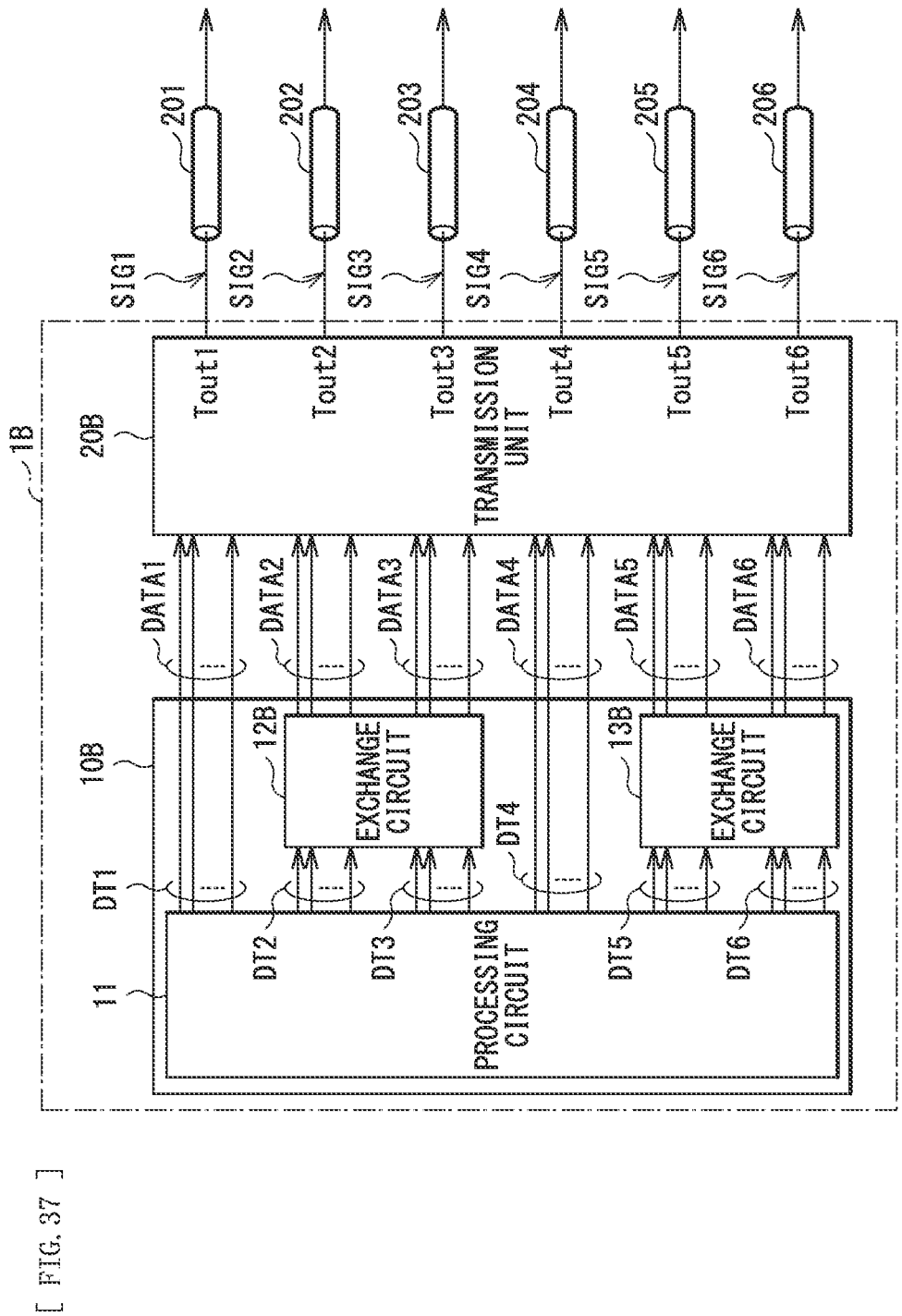
[ FIG. 37 ]

[FIG.38]
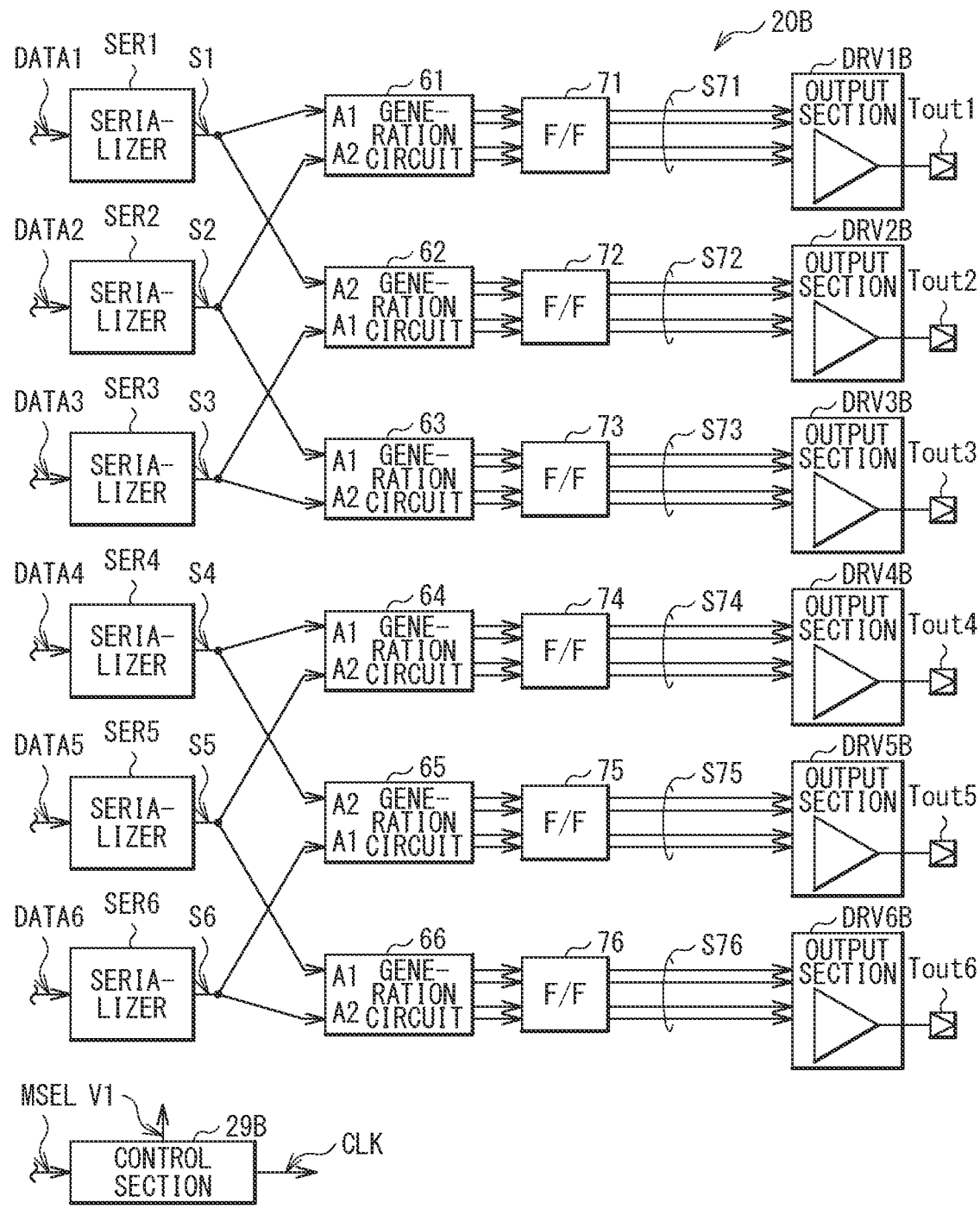

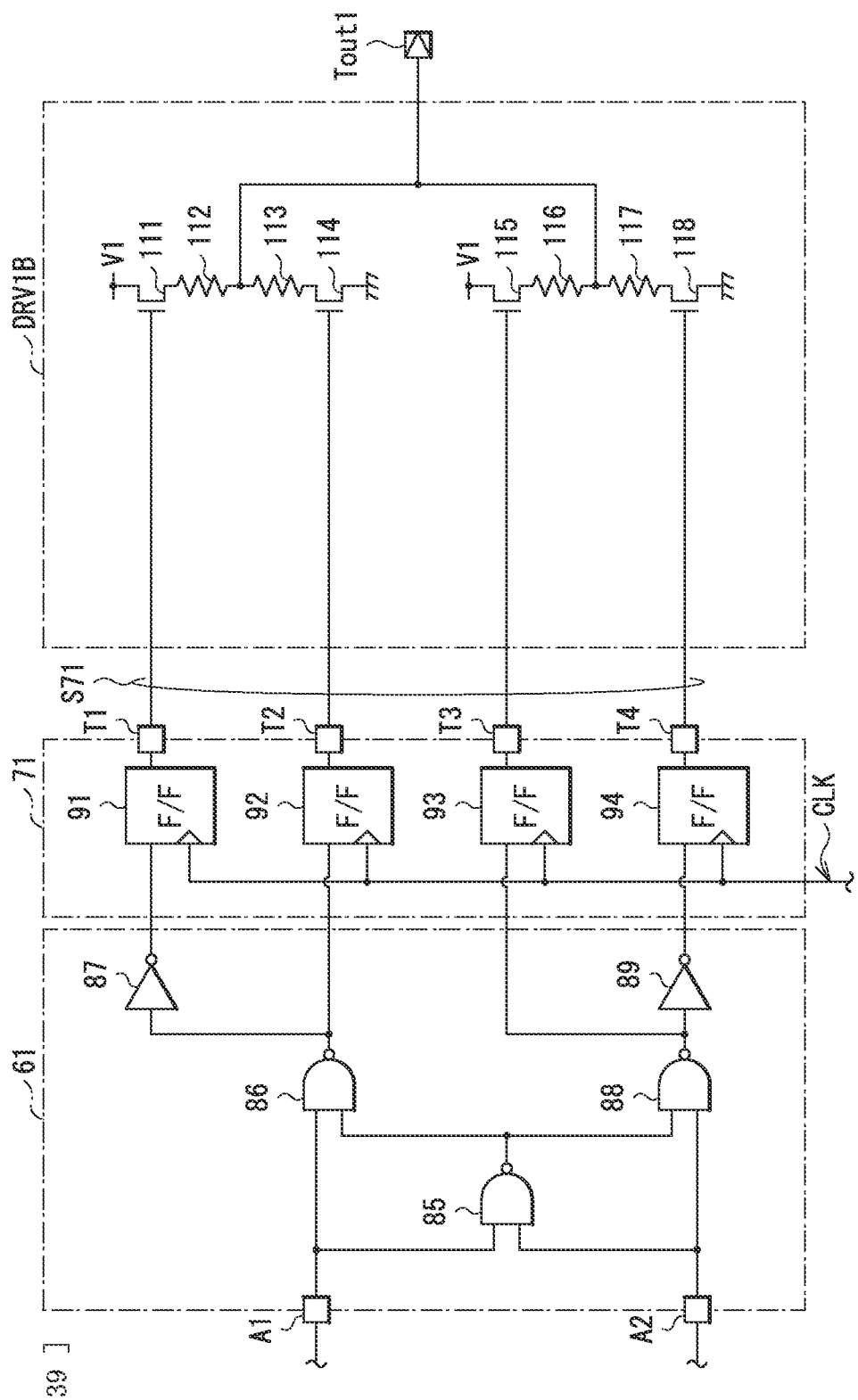
[FIG. 39]

[FIG. 40]
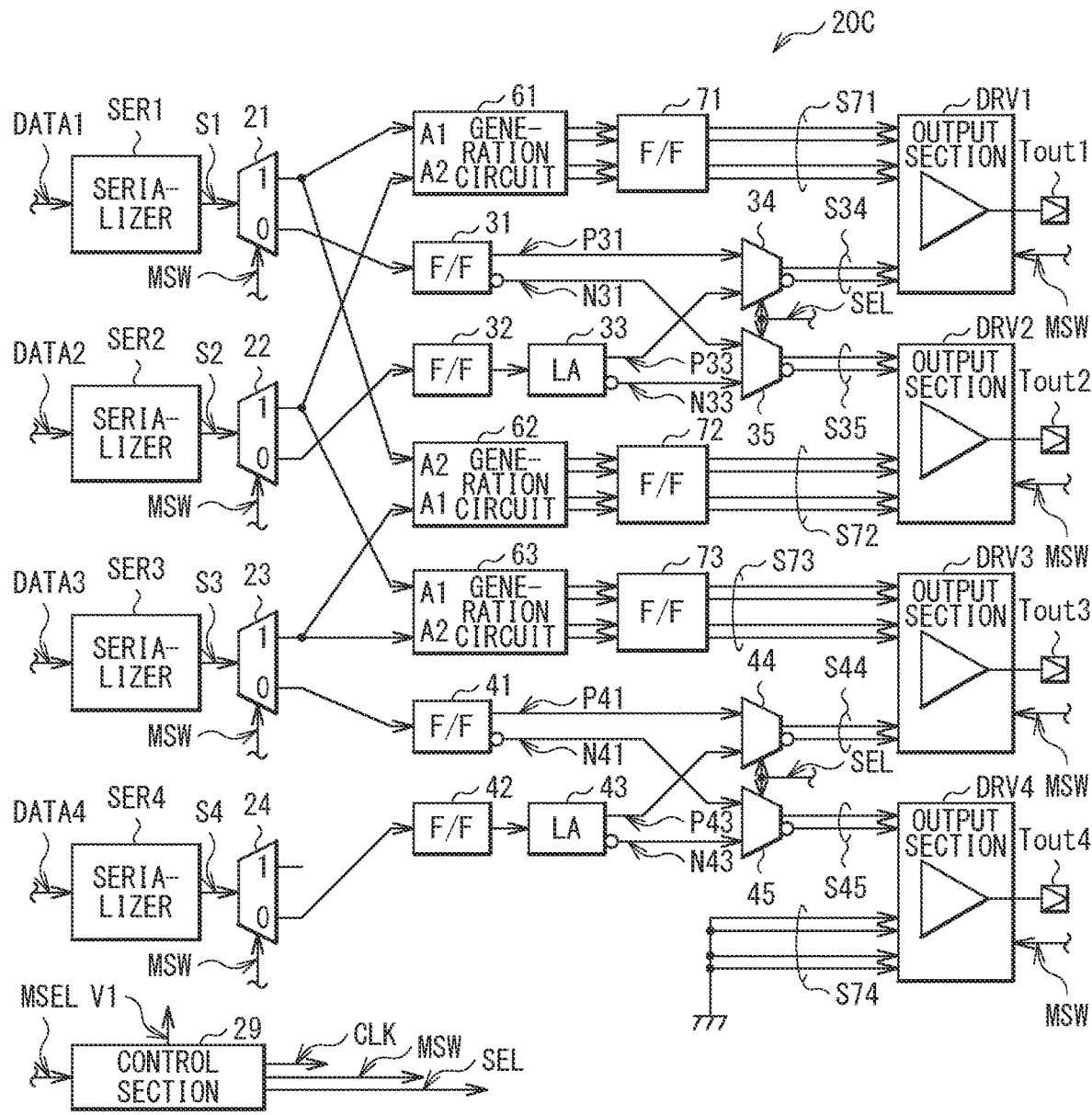

[ FIG. 41 ]
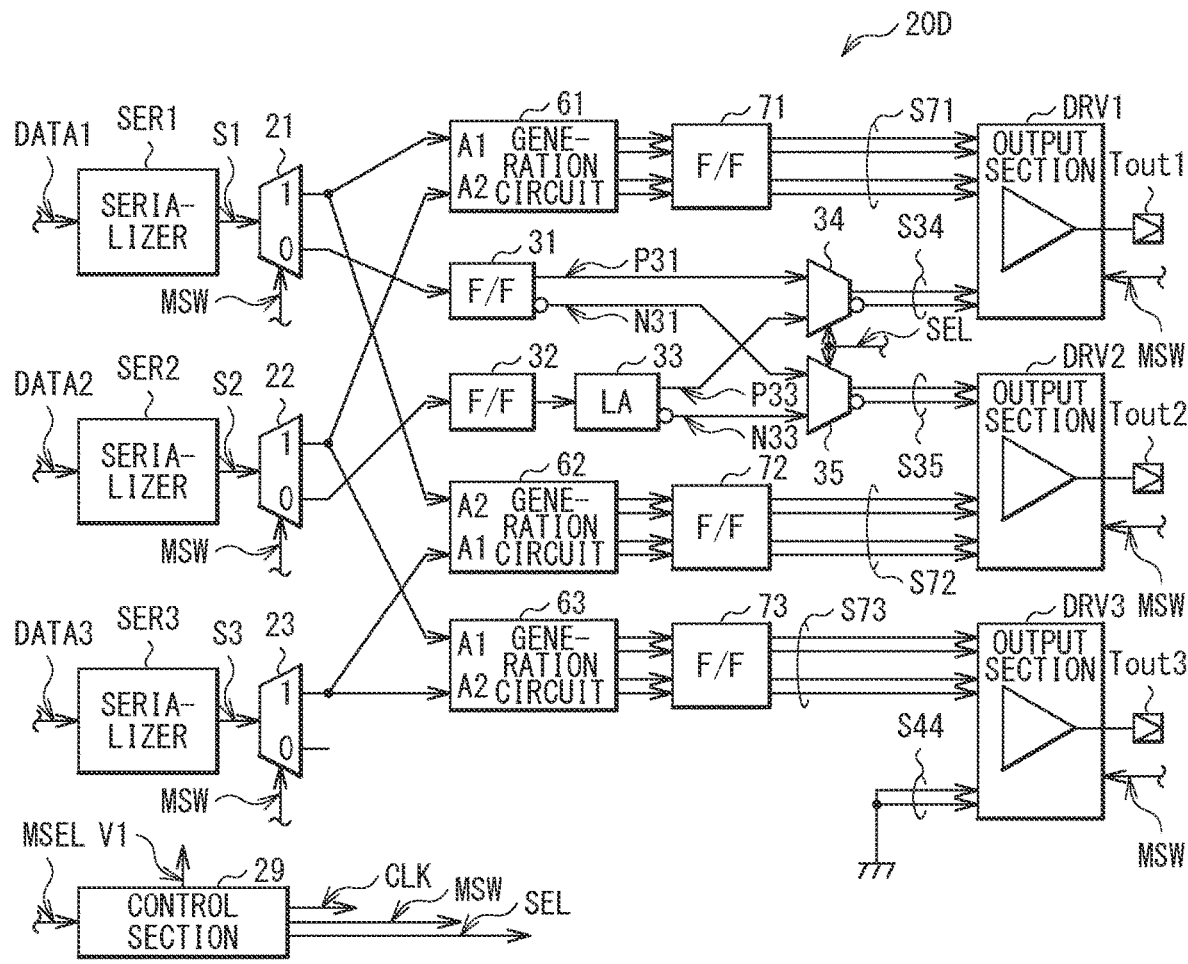

[ FIG. 42 ]
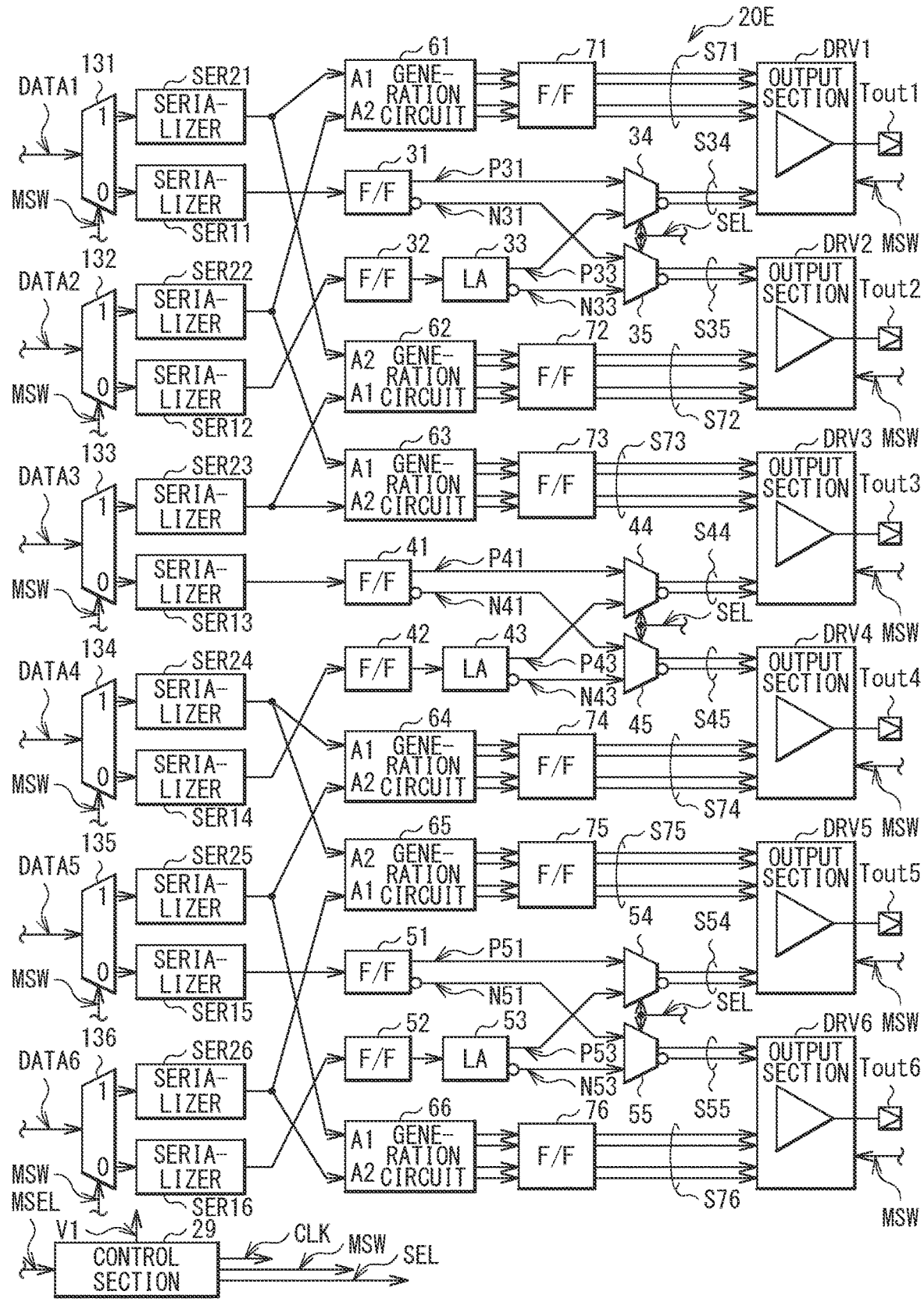

[ FIG. 43A ]
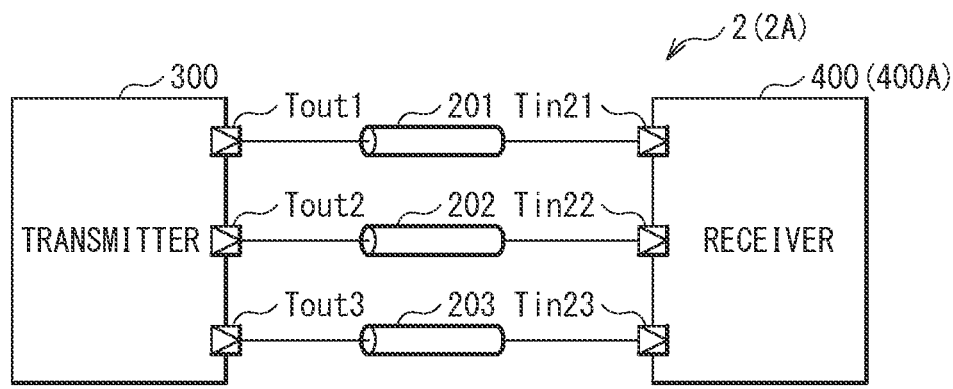
[ FIG. 43B ]
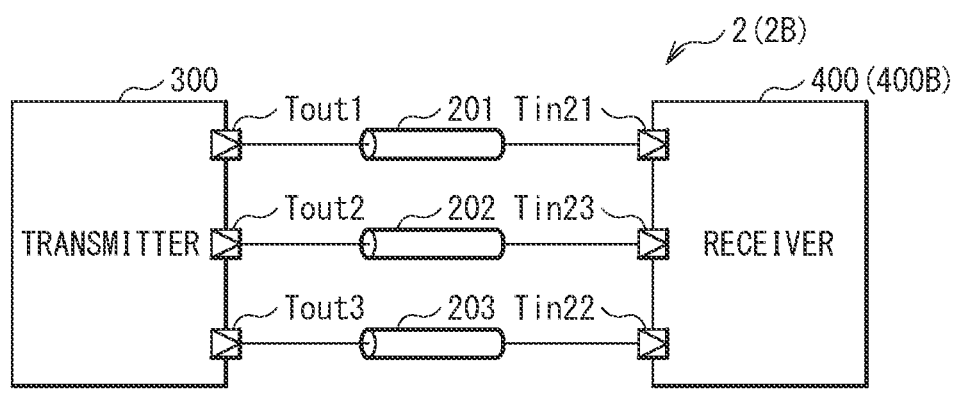
[ FIG. 43C ]
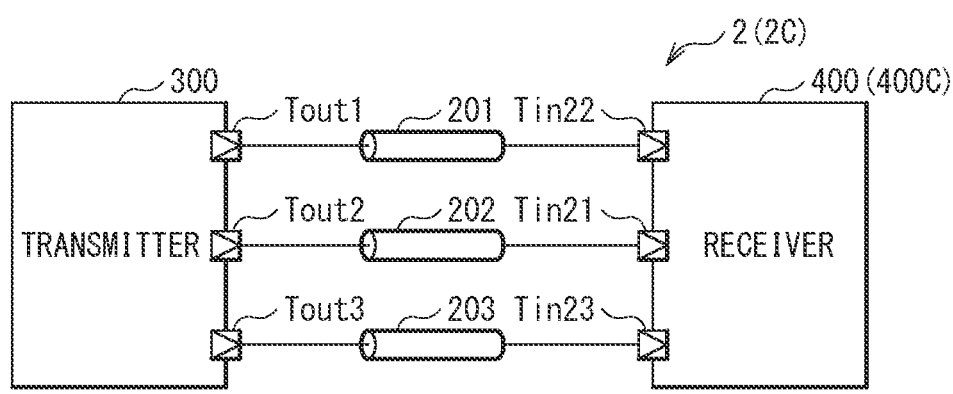

[ FIG. 43D ]
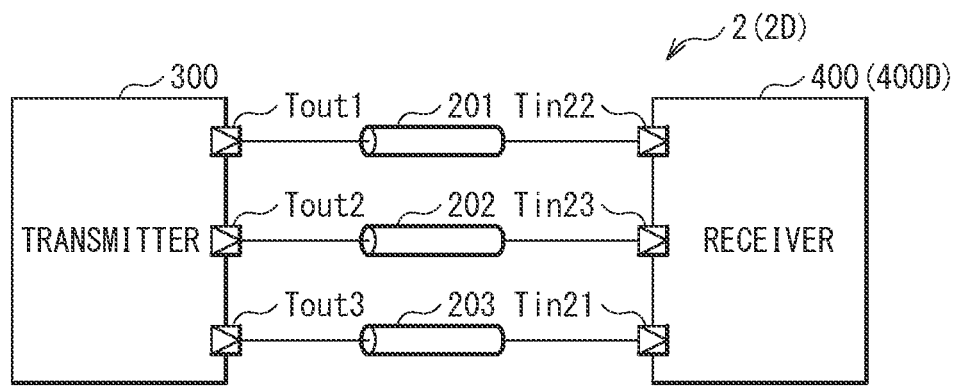
[ FIG. 43E ]
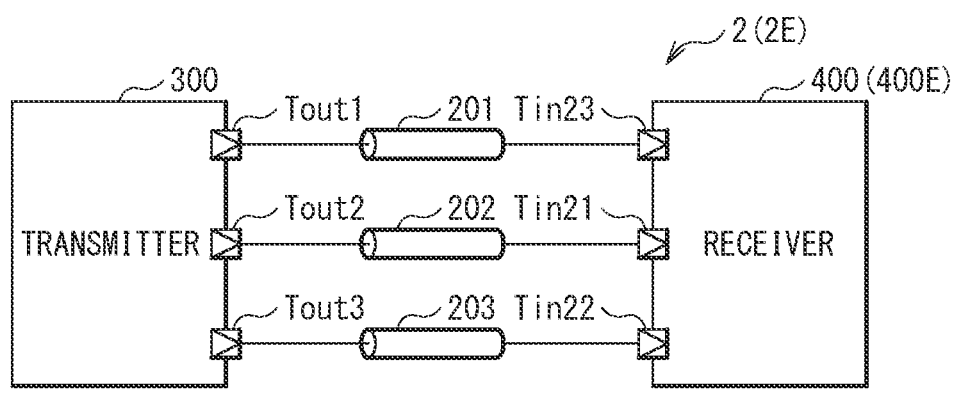
[ FIG. 43F ]
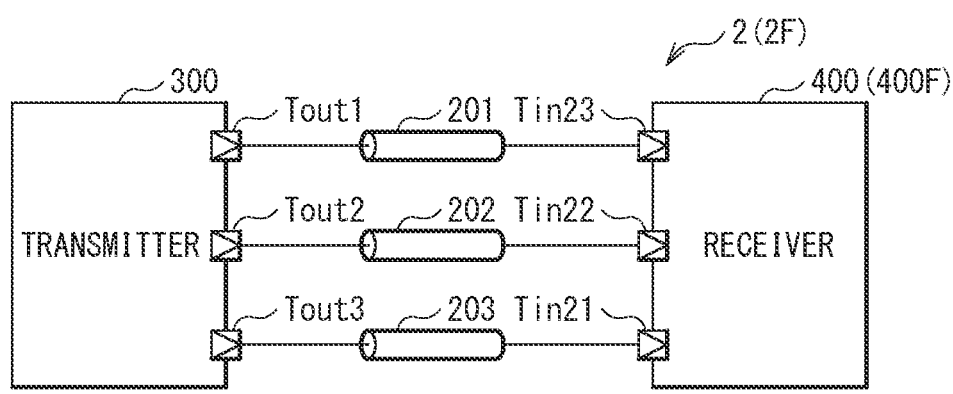

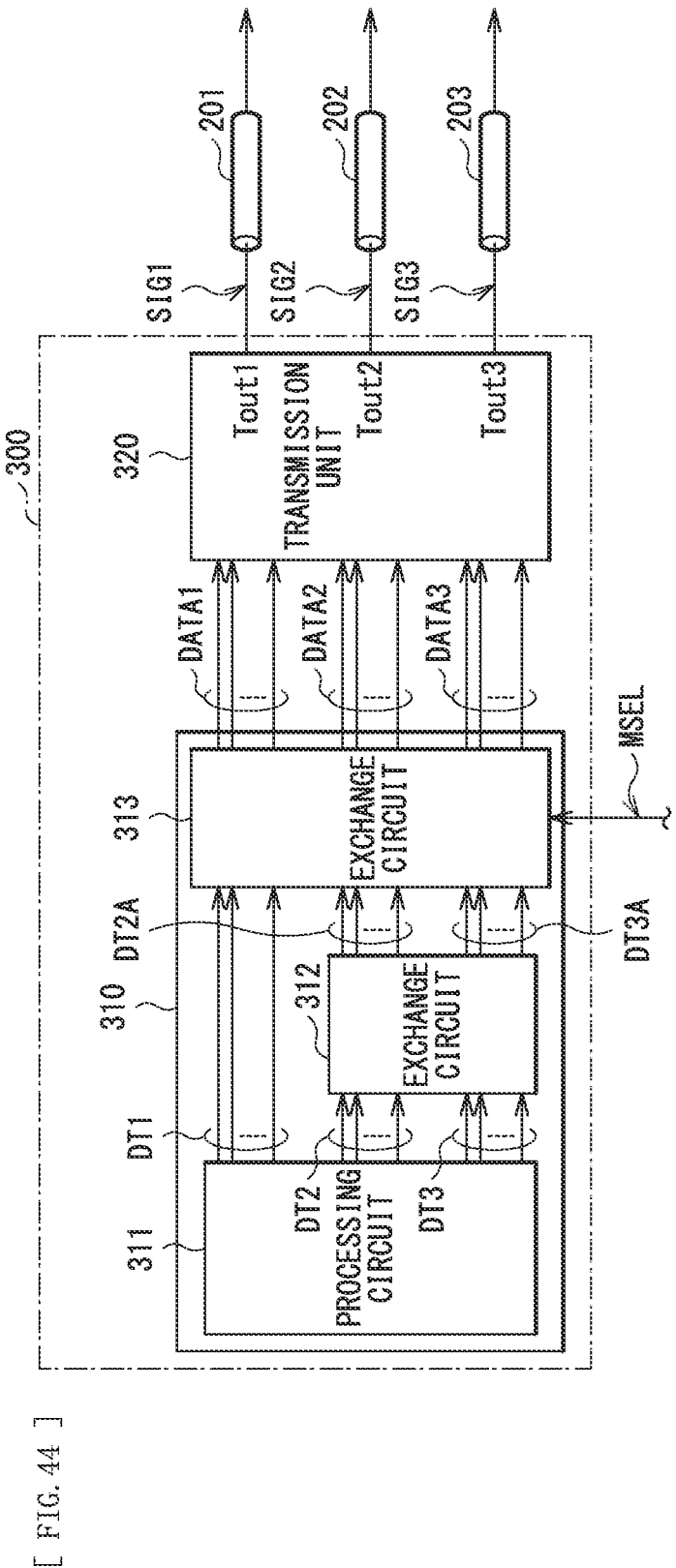
[FIG. 44]

[ FIG. 45 ]

| OPERA-TION MODE | ORDER OF INPUT TERMINALS IN RECEIVER 400 | PARALLEL SIGNAL DATA1 | PARALLEL SIGNAL DATA2 | PARALLEL SIGNAL DATA3 |
|---|---|---|---|---|
| MA | Tin21, Tin22, Tin23 | DT1 | DT2A | DT3A |
| MB | Tin21, Tin23, Tin22 | $\overline{DT3A}$ | $\overline{DT1}$ | $\overline{DT2A}$ |
| MC | Tin22, Tin21, Tin23 | $\overline{DT1}$ | $\overline{DT2A}$ | $\overline{DT3A}$ |
| MD | Tin22, Tin23, Tin21 | DT2A | DT1 | DT3A |
| ME | Tin23, Tin21, Tin22 | DT3A | DT2A | DT1 |
| MF | Tin23, Tin22, Tin21 | $\overline{DT2A}$ | $\overline{DT3A}$ | $\overline{DT1}$ |

[ FIG. 46 ]

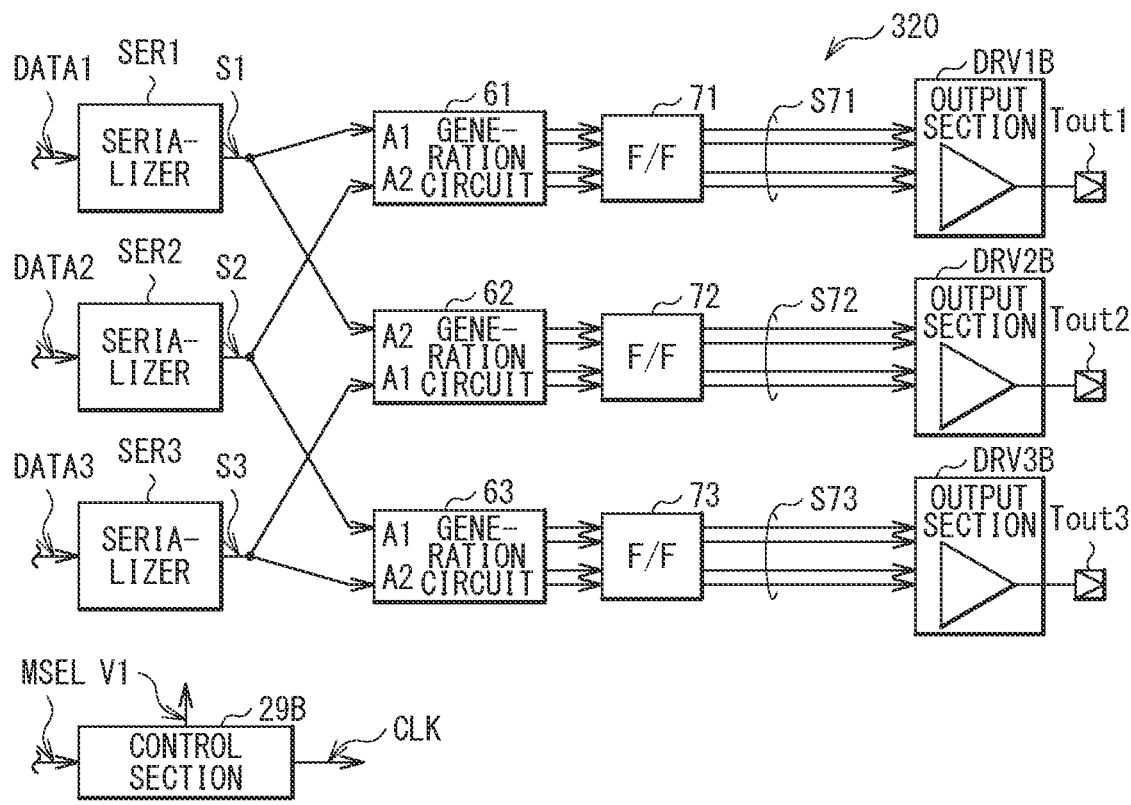

[ FIG. 47 ]

| OPERA-TION MODE | PARA-LLEL SIGNAL DT1 | PARA-LLEL SIGNAL DT2A | PARA-LLEL SIGNAL DT3A | PARA-LLEL SIGNAL DATA1 | PARA-LLEL SIGNAL DATA2 | PARA-LLEL SIGNAL DATA3 | OUTPUT TER-MINAL Tout1 | OUTPUT TER-MINAL Tout1 | OUTPUT TER-MINAL Tout1 | INPUT TER-MINAL Tin1 | INPUT TER-MINAL Tin2 | INPUT TER-MINAL Tin3 |
|---|---|---|---|---|---|---|---|---|---|---|---|---|
| MA | 1 | 0 | 0 | 1 | 0 | 0 | VH | VL | VM | VH | VL | VM |
| MB |   |   |   | 1 | 0 | 1 | VH | VM | VL | VH | VL | VM |
| MC |   |   |   | 0 | 1 | 1 | VL | VH | VM | VH | VL | VM |
| MD |   |   |   | 0 | 1 | 0 | VL | VM | VH | VH | VL | VM |
| ME |   |   |   | 0 | 0 | 1 | VM | VL | VL | VH | VL | VM |
| MF |   |   |   | 1 | 1 | 0 | VM | VL | VH | VH | VL | VM |

[ FIG. 48 ]
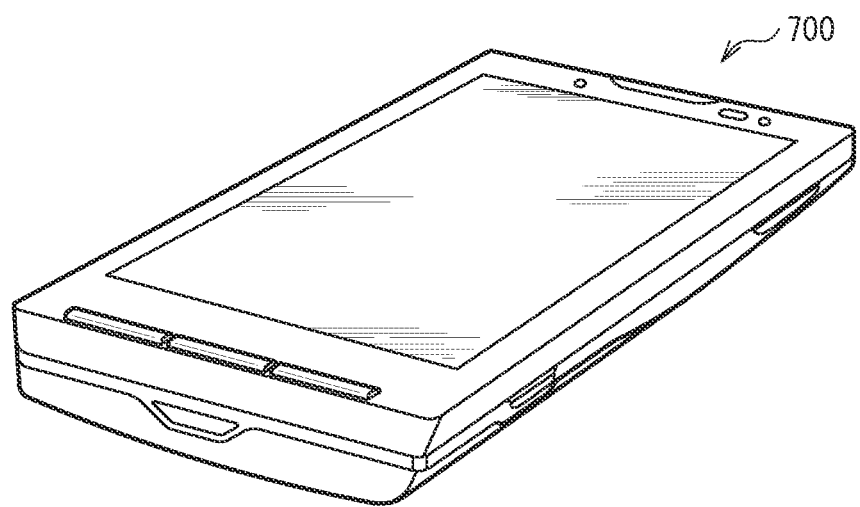

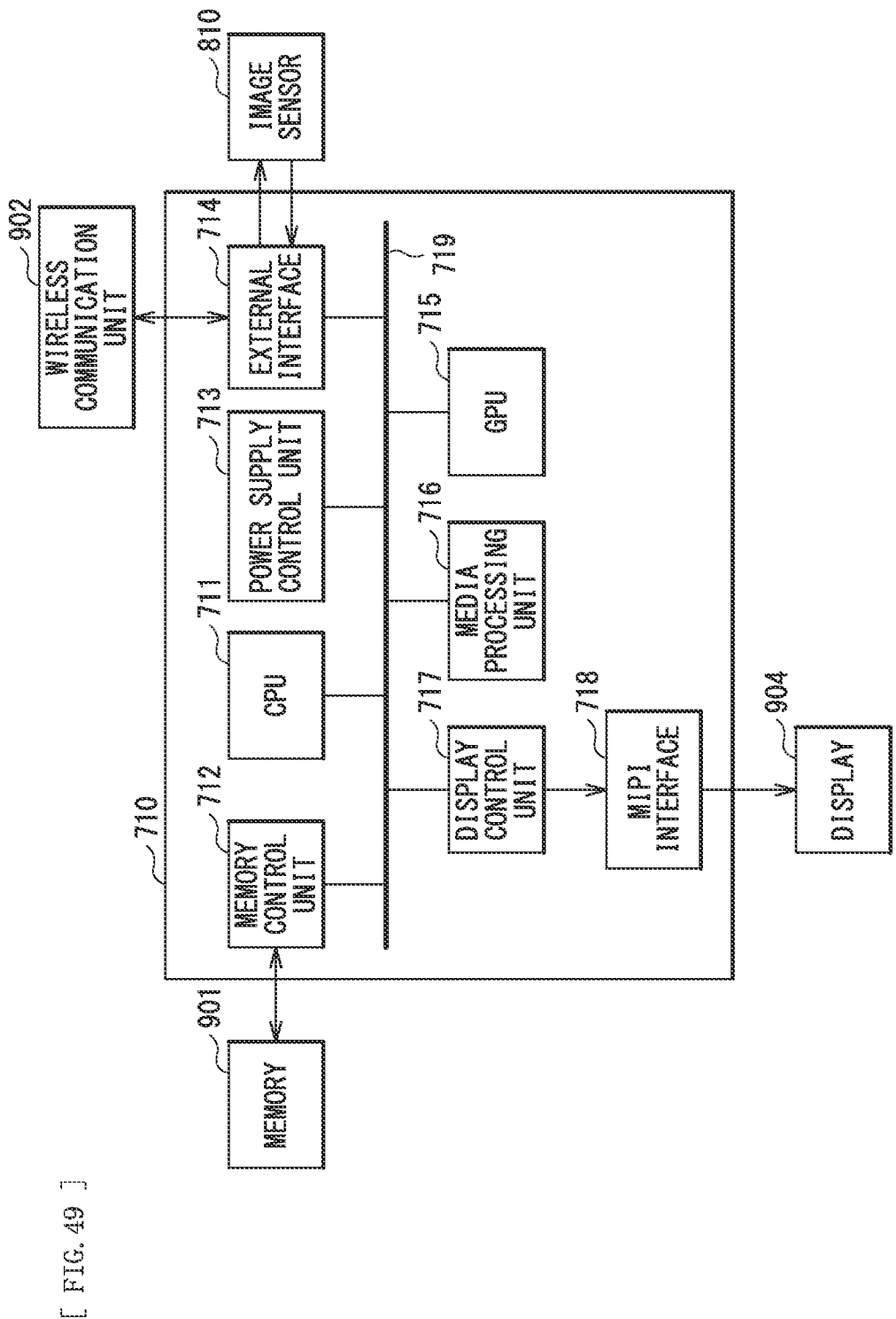
[FIG. 49]

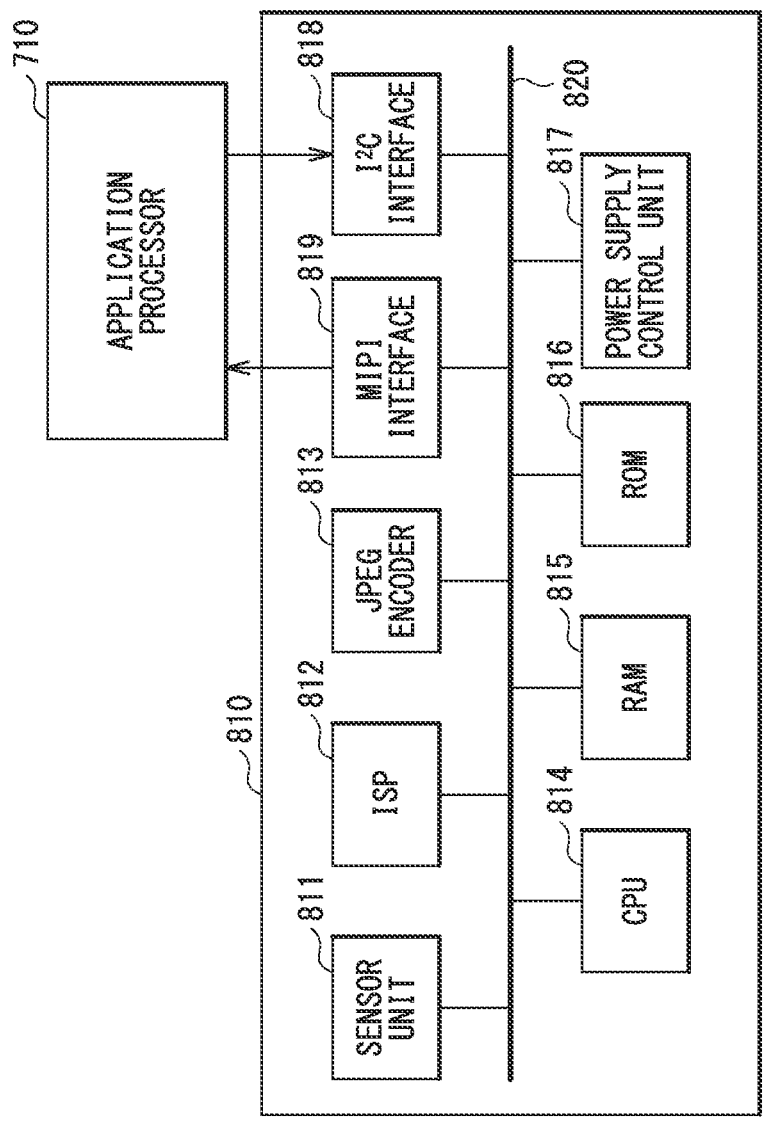
[FIG. 50]

TRANSMITTER AND COMMUNICATION SYSTEM

TECHNICAL FIELD

The present disclosure relates to a transmitter that transmits a signal and a communication system that includes such a transmitter.

BACKGROUND ART

In recent years, the sophistication and multifunctionality of an electronic apparatus have been enhanced. With such enhancement, the electronic apparatus has been mounted with a variety of devices such as a semiconductor chip, a sensor, and a display device. A large amount of data is exchanged between these devices. The amount of data has been increasing with the enhancement of the sophistication and multifunctionality of the electronic apparatus. Accordingly, data is often exchanged by using a high-speed interface that allows data to be transmitted and received, for example, at several Gbps.

There have been disclosed a variety of techniques for a method of further increasing the transmission capacity. For example, each of PTLs 1 and 2 discloses a communication system in which data is exchanged by using three signals each having three voltage levels.

CITATION LIST

Patent Literature

PTL 1: Japanese Unexamined Patent Application Publication (Published Japanese Translation of PCT Application) No. JP 2011-517159

PTL 2: Japanese Unexamined Patent Application Publication (Published Japanese Translation of PCT Application) No. JP 2010-520715

SUMMARY OF THE INVENTION

Such a high-speed interface is expected to have the symbol rate further increased.

It is desirable to provide a transmitter and a communication system each of which allows the symbol rate to be increased.

A transmitter according to an embodiment of the present disclosure includes a first serializer; a second serializer; a third serializer; a first output section; a first output control circuit; a second output section; a second output control circuit; a third output section; and a third output control circuit. The first serializer is configured to generate a first serial signal. The second serializer is configured to generate a second serial signal. The third serializer is configured to generate a third serial signal. The first output section is configured to set a voltage of a first output terminal to any of a first voltage, a second voltage, and a third voltage between the first voltage and the second voltage. The first output control circuit is configured to control an operation of the first output section on the basis of the first serial signal and the second serial signal. The second output section is configured to set a voltage of a second output terminal to any of the first voltage, the second voltage, and the third voltage. The second output control circuit is configured to control an operation of the second output section on the basis of the third serial signal and the first serial signal. The third output section is configured to set a voltage of a third output terminal to any of the first voltage, the second voltage, and the third voltage. The third output control circuit is configured to control an operation of the third output section on the basis of the second serial signal and the third serial signal. The first serializer, the second serializer, and the third serializer are disposed in this order on a semiconductor substrate and the first output control circuit, the second output control circuit, and the third output control circuit are disposed in this order on the semiconductor substrate.

A communication system according to an embodiment of the present disclosure includes the transmitter described above.

In the transmitter and the communication system according to the respective embodiments of the present disclosure, the first serializer, the second serializer, and the third serializer are disposed in this order on the semiconductor substrate and the first output control circuit, the second output control circuit, and the third output control circuit are disposed in this order on the semiconductor substrate. The first serializer generates a first serial signal, the second serializer generates a second serial signal, and the third serializer generates a third serial signal. The first output control circuit controls the operation of the first output section on the basis of the first serial signal and the second serial signal. The second output control circuit controls the operation of the second output section on the basis of the third serial signal and the first serial signal. The third output control circuit then controls the operation of the third output section on the basis of the second serial signal and the third serial signal.

BRIEF DESCRIPTION OF DRAWING

FIG. 1 is a block diagram illustrating a configuration example of a transmitter according to a first embodiment of the present disclosure.

FIG. 2 is an explanatory diagram illustrating an example of a three-phase signal.

FIG. 3 is a block diagram illustrating a configuration example of a transmission unit illustrated in FIG. 1.

FIG. 4 is a circuit diagram illustrating a configuration example of a distribution circuit illustrated in FIG. 3.

FIG. 5 is a circuit diagram illustrating a configuration example of a generation circuit illustrated in FIG. 3.

FIG. 6 is a table illustrating an operation example of the generation circuit illustrated in FIG. 5.

FIG. 7 is a table illustrating an operation example of the transmission unit illustrated in FIG. 3.

FIG. 8 is a block diagram illustrating a configuration example of a communication system to which the transmitter illustrated in FIG. 1 is applied.

FIG. 9 is a circuit diagram illustrating a configuration example of an input unit illustrated in FIG. 8.

FIG. 10 is a block diagram illustrating another configuration example of the communication system to which the transmitter illustrated in FIG. 1 is applied.

FIG. 11 is a circuit diagram illustrating a configuration example of the input unit illustrated in FIG. 10.

FIG. 12 is an explanatory diagram illustrating an operation example of the input unit illustrated in FIG. 11.

FIG. 13 is a table illustrating an operation example of the communication system illustrated in FIG. 10.

FIG. 14 is an explanatory diagram illustrating an example of a layout of the transmission unit illustrated in FIG. 3.

FIG. 15A is an explanatory diagram illustrating an operation state of the transmission unit illustrated in FIG. 3 in an operation mode.

FIG. 15B is an explanatory diagram illustrating another operation state of the transmission unit illustrated in FIG. 3 in an operation mode.

FIG. 16 is a timing waveform diagram illustrating an operation example of the transmission unit illustrated in FIG. 3.

FIG. 17 is an explanatory diagram illustrating an operation example of the transmission unit illustrated in FIG. 2 in another operation mode.

FIG. 18 is a block diagram illustrating a configuration example of a transmitter according to a comparative example.

FIG. 19 is a block diagram illustrating a configuration example of the transmission unit illustrated in FIG. 18.

FIG. 20 is a table illustrating an operation example of the transmission unit illustrated in FIG. 18.

FIG. 21 is an explanatory diagram illustrating an example of a layout of the transmission unit illustrated in FIG. 18.

FIG. 22 is a block diagram illustrating a configuration example of a serializer unit according to a modification example.

FIG. 23 is a circuit diagram illustrating a configuration example of a flip-flop.

FIG. 24 is a circuit diagram illustrating a configuration example of a generation circuit according to another modification example.

FIG. 25 is a circuit diagram illustrating a configuration example of the flip-flop illustrated in FIG. 24.

FIG. 26 is a circuit diagram illustrating a configuration example of another flip-flop illustrated in FIG. 24.

FIG. 27 is a table illustrating an operation example of the generation circuit illustrated in FIG. 24.

FIG. 28 is a circuit diagram illustrating another configuration example of the flip-flop.

FIG. 29 is a circuit diagram illustrating another configuration example of the flip-flop illustrated in FIG. 24.

FIG. 30 is a circuit diagram illustrating another configuration example of another flip-flop illustrated in FIG. 24.

FIG. 31 is a circuit diagram illustrating a configuration example of a generation circuit according to another modification example.

FIG. 32 is a circuit diagram illustrating a configuration example of the flip-flop illustrated in FIG. 31.

FIG. 33 is a block diagram illustrating a configuration example of a transmission unit according to another modification example.

FIG. 34 is a block diagram illustrating a configuration example of a communication system to which the transmission unit illustrated in FIG. 33 is applied.

FIG. 35 is a circuit diagram illustrating a configuration example of the input unit illustrated in FIG. 34.

FIG. 36 is an explanatory diagram illustrating an operation example of the transmission unit illustrated in FIG. 33 in another operation mode.

FIG. 37 is a block diagram illustrating a configuration example of a transmitter according to another modification example.

FIG. 38 is a block diagram illustrating a configuration example of the transmission unit illustrated in FIG. 37.

FIG. 39 is a circuit diagram illustrating a configuration example of the generation circuit illustrated in FIG. 38.

FIG. 40 is a block diagram illustrating a configuration example of a transmission unit according to another modification example.

FIG. 41 is a block diagram illustrating a configuration example of a transmission unit according to another modification example.

FIG. 42 is a block diagram illustrating a configuration example of a transmission unit according to another modification example.

FIG. 43A is a block diagram illustrating a configuration example of a communication system to which a transmitter according to a second embodiment is applied.

FIG. 43B is a block diagram illustrating another configuration example of the communication system to which the transmitter according to the second embodiment is applied.

FIG. 43C is a block diagram illustrating another configuration example of the communication system to which the transmitter according to the second embodiment is applied.

FIG. 43D is a block diagram illustrating another configuration example of the communication system to which the transmitter according to the second embodiment is applied.

FIG. 43E is a block diagram illustrating another configuration example of the communication system to which the transmitter according to the second embodiment is applied.

FIG. 43F is a block diagram illustrating another configuration example of the communication system to which the transmitter according to the second embodiment is applied.

FIG. 44 is a block diagram illustrating a configuration example of the transmitter according to the second embodiment.

FIG. 45 is a table illustrating an operation example of an exchange circuit illustrated in FIG. 44.

FIG. 46 is a block diagram illustrating an operation example of the transmission unit illustrated in FIG. 44.

FIG. 47 is a table illustrating an operation example of the communication system illustrated in each of FIGS. 43A to 43F.

FIG. 48 is a perspective view of an appearance configuration of a smartphone to which a transmitter according to an embodiment is applied.

FIG. 49 is a block diagram illustrating a configuration example of an application processor to which a transmitter according to an embodiment is applied.

FIG. 50 is a block diagram illustrating a configuration example of an image sensor to which a transmitter according to an embodiment is applied.

MODES FOR CARRYING OUT THE INVENTION

The following describes embodiments of the present disclosure in detail with reference to the drawings. It is to be noted that description is given in the following order.
1. First Embodiment
2. Second Embodiment
3. Application Example

1. First Embodiment

Configuration Example

FIG. 1 illustrates a configuration example of a transmitter (a transmitter 1) according to a first embodiment. The transmitter 1 is configured to achieve a plurality of interfaces. It is to be noted that a communication system according to an embodiment of the present disclosure is embodied by the present embodiment and is thus described together.

The transmitter 1 is configured to generate six signals SIG1 to SIG6 by performing a predetermined process and transmit these signals SIG1 to SIG6 to a receiver (not illustrated) through transmission lines 201 to 206. In this example, each of the transmission lines 201 to 206 has a characteristic impedance of 50[Ω]. The transmitter 1 operates in an operation mode M corresponding to a mode control signal MSEL. The transmitter 1 has two operation modes M1 and M2.

The operation mode M1 is a mode (a differential mode) for transmitting data to a receiver by using a differential signal. In this operation mode M1, the transmitter 1 transmits the signals SIG1 and SIG2 as a differential signal, transmits the signals SIG3 and SIG4 as a differential signal, and transmits the signals SIG5 and SIG6 as a differential signal.

The operation mode M2 is a mode (a three-phase mode) for transmitting data to a receiver by using a three-phase signal. In this operation mode M2, the transmitter 1 transmits the signals SIG1 to SIG3 as a three-phase signal and transmits the signals SIG4 to SIG6 as a three-phase signal. The respective signals included in a three-phase signal are signals each of which may have three voltage levels (a high level voltage VH, a medium level voltage VM, and a low level voltage VL). The voltage levels of these three signals are set different from each other.

FIG. 2 illustrates the voltages of the three signals SIG1, SIG2, and SIG3 included in a three-phase signal. The transmitter 1 transmits six symbols "+x", "−x", "+y", "−y", "+z", and "−z" by using the three signals SIG1, SIG2, and SIG3. For example, in a case where the symbol "+x" is transmitted, the transmitter 1 sets the signal SIG1 to the high level voltage VH, sets the signal SIG2 to the low level voltage VL, and sets the signal SIG3 to the medium level voltage VM. In a case where the symbol "−x" is transmitted, the transmitter 1 sets the signal SIG1 to the low level voltage VL, sets the signal SIG2 to the high level voltage VH, and sets the signal SIG3 to the medium level voltage VM. In a case where the symbol "+y" is transmitted, the transmitter 1 sets the signal SIG1 to the medium level voltage VM, sets the signal SIG2 to the high level voltage VH, and sets the signal SIG3 to the low level voltage VL. In a case where the symbol "−y" is transmitted, the transmitter 1 sets the signal SIG1 to the medium level voltage VM, sets the signal SIG2 to the low level voltage VL, and sets the signal SIG3 to the high level voltage VH. In a case where the symbol "+z" is transmitted, the transmitter 1 sets the signal SIG1 to the low level voltage VL, sets the signal SIG2 to the medium level voltage VM, and sets the signal SIG3 to the high level voltage VH. In a case where the symbol "−z" is transmitted, the transmitter 1 sets the signal SIG1 to the high level voltage VH, sets the signal SIG2 to the medium level voltage VM, and sets the signal SIG3 to the low level voltage VL. It is to be noted that the signals SIG1, SIG2, and SIG3 have been described as an example in this example, but the same applies to the signals SIG4, SIG5, and SIG6. The transmitter 1 generates the signals SIG1 to SIG3 like these and transmits the generated signals SIG1 to SIG3. Similarly, the transmitter 1 generates the signals SIG4 to SIG6 and transmits the generated signals SIG4 to SIG6.

The transmitter 1 includes a processing unit 10 and a transmission unit 20 as illustrated in FIG. 1.

The processing unit 10 is configured to generate six sets of parallel signals DATA1 to DATA6 by performing a predetermined process. Each of the parallel signals DATA1 to DATA6 is a signal having a bit width of up to eight bits in this example. In other words, the transmitter 1 is compatible with a plurality of applications. The processing unit 10 generates, for example, any of the parallel signals DATA1 to DATA6 each having a bit width of 4 bits, the parallel signals DATA1 to DATA6 each having a bit width of five bits, the parallel signals DATA1 to DATA6 each having a bit width of six bits, the parallel signals DATA1 to DATA6 each having a bit width of seven bits, and the parallel signals DATA1 to DATA6 each having a bit width of eight bits in accordance with an application. It is to be noted that each of the parallel signals DATA1 to DATA6 has a bit width of up to eight bits in this example, but this is not limitative. Each of the parallel signals DATA1 to DATA6 may further have a bit width of nine bits or more.

The processing unit 10 includes a processing circuit 11 and exchange circuits 12 and 13.

The processing circuit 11 is configured to generate six sets of parallel signals DT1 to DT6 by performing a predetermined process. Each of the parallel signals DT1 to DT6 is a signal having a bit width of up to eight bits in this example as with each of the six sets of parallel signals DATA1 to DATA6. The processing unit 10 outputs the parallel signal DT1 as the parallel signal DATA1 and outputs the parallel signal DT4 as the parallel signal DATA4 among the parallel signals DT1 to DT6 generated by the processing circuit 11.

The exchange circuit 12 is configured to exchange the parallel signal DT2 and the parallel signal DT3 with each other on the basis of the mode control signal MSEL. Specifically, the exchange circuit 12 does not exchange the parallel signal DT2 and the parallel signal DT3 with each other, but outputs the parallel signal DT2 and the parallel signal DT3 as they are in a case where the operation mode M is the operation mode M1 (the differential mode). This causes the processing unit 10 to output the parallel signal DT2 as the parallel signal DATA2 and output the parallel signal DT3 as the parallel signal DATA3. In addition, the exchange circuit 12 exchanges the parallel signal DT2 and the parallel signal DT3 with each other in a case where the operation mode M is the operation mode M2 (the three-phase mode). This causes the processing unit 10 to output the parallel signal DT3 as the parallel signal DATA2 and output the parallel signal DT2 as the parallel signal DATA3.

The exchange circuit 13 is configured to exchange the parallel signal DT5 and the parallel signal DT6 with each other on the basis of the mode control signal MSEL as with the exchange circuit 12. Specifically, the exchange circuit 13 does not exchange the parallel signal DT5 and the parallel signal DT6 with each other, but outputs the parallel signal DT5 and the parallel signal DT6 as they are in a case where the operation mode M is the operation mode M1 (the differential mode). This causes the processing unit 10 to output the parallel signal DT5 as the parallel signal DATA5 and output the parallel signal DT6 as the parallel signal DATA6. In addition, the exchange circuit 13 exchanges the parallel signal DT5 and the parallel signal DT6 with each other in a case where the operation mode M is the operation mode M2 (the three-phase mode). This causes the processing unit 10 to output the parallel signal DT6 as the parallel signal DATA5 and output the parallel signal DT5 as the parallel signal DATA6.

The transmission unit 20 is configured to generate the signals SIG1 to SIG6 on the basis of the parallel signals DATA1 to DATA6 and the mode control signal MSEL and respectively output these signals SIG1 to SIG6 from output terminals Tout1 to Tout6.

FIG. 3 illustrates a configuration example of the transmission unit 20. The transmission unit 20 includes serializers SER1 to SER6, distribution circuits 21 to 26, flip-flops (F/Fs) 31 and 32, a latch (LA) 33, selectors 34 and 35, flip-flops (F/Fs) 41 and 42, a latch (LA) 43, selectors 44 and 45, flip-flops (F/Fs) 51 and 52, a latch (LA) 53, selectors 54 and 55, generation circuits 61 to 66, flip-flop (F/F) sections 71 to 76, output sections DRV1 to DRV6, and a control section 29. It is to be noted that a signal connecting these blocks may be a differential signal or a single-phase signal.

The serializer SER1 is configured to serialize the parallel signal DATA1 on the basis of a clock signal CLK to generate a serial signal S1. The serializer SER1 is supplied with the parallel signal DATA1 having a bit width of up to eight bits in accordance with an application. In a case where the parallel signal DATA1 is a signal having a bit width of four bits, the serializer SER1 serializes this parallel signal DATA1 having a bit width of four bits. In a case where the parallel signal DATA1 is a signal having a bit width of five bits, the serializer SER1 serializes this parallel signal DATA1 having a bit width of five bits. In a case where the parallel signal DATA1 is a signal having a bit width of six bits, the serializer SER1 serializes this parallel signal DATA1 having a bit width of six bits. In a case where the parallel signal DATA1 is a signal having a bit width of seven bits, the serializer SER1 serializes this parallel signal DATA1 having a bit width of seven bits. In a case where the parallel signal DATA1 is a signal having a bit width of eight bits, the serializer SER1 serializes this parallel signal DATA1 having a bit width of eight bits. Similarly, the serializer SER2 is configured to serialize the parallel signal DATA2 on the basis of a clock signal CLK to generate a serial signal S2. The serializer SER3 is configured to serialize the parallel signal DATA3 on the basis of a clock signal CLK to generate a serial signal S3. The serializer SER4 is configured to serialize the parallel signal DATA4 on the basis of a clock signal CLK to generate a serial signal S4. The serializer SER5 is configured to serialize the parallel signal DATA5 on the basis of a clock signal CLK to generate a serial signal S5. The serializer SER6 is configured to serialize the parallel signal DATA6 on the basis of a clock signal CLK to generate a serial signal S6. It is to be noted that each of the parallel signals DATA1 to DATA6 has a bit width of up to eight bits in this example, but this is not limitative. Each of the parallel signals DATA1 to DATA6 may further have a bit width of nine bits or more.

The distribution circuit 21 is configured to selectively supply the serial signal S1 outputted from the serializer SER1 to the generation circuits 61 and 62 or the flip-flop 31 on the basis of a control signal MSW. The control signal MSW is set to a low level ("0") in the operation mode M1 (the differential mode) and is set to a high level ("1") in the operation mode M2 (the three-phase mode). In a case where the control signal MSW is at the high level ("1"), the distribution circuit 21 supplies the serial signal S1 to the generation circuit 61 and the generation circuit 62. In a case where the control signal MSW is at the low level ("0"), the distribution circuit 21 supplies the serial signal S1 to the flip-flop 31. Similarly, the distribution circuit 22 is configured to selectively supply the serial signal S2 outputted from the serializer SER2 to the generation circuits 61 and 63 or the flip-flop 32 on the basis of the control signal MSW. The distribution circuit 23 is configured to selectively supply the serial signal S3 outputted from the serializer SER3 to the generation circuits 62 and 63 or the flip-flop 41 on the basis of the control signal MSW. The distribution circuit 24 is configured to selectively supply the serial signal S4 outputted from the serializer SER4 to the generation circuits 64 and 65 or the flip-flop 42 on the basis of the control signal MSW. The distribution circuit 25 is configured to selectively supply the serial signal S5 outputted from the serializer SER5 to the generation circuits 64 and 66 or the flip-flop 51 on the basis of the control signal MSW. The distribution circuit 26 is configured to selectively supply the serial signal S6 outputted from the serializer SER6 to the generation circuits 65 and 66 or the flip-flop 52 on the basis of the control signal MSW.

FIG. 4 illustrates a configuration example of the distribution circuit 21. It is to be noted that the same applies to each of the distribution circuits 22 to 26. The distribution circuit 21 includes an inverter 81 and logical conjunction (AND) circuits 82 to 84. The inverter 81 is configured to output a signal obtained by inverting the control signal MSW. The logical conjunction circuit 82 is configured to output a signal indicating the logical conjunction of the serial signal S1 and the control signal MSW. The logical conjunction circuit 83 is configured to output a signal indicating the logical conjunction of the serial signal S1 and the control signal MSW. The logical conjunction circuit 84 is configured to output a signal indicating the logical conjunction of the serial signal S1 and an output signal of the inverter 81.

According to this configuration, in a case where the control signal MSW is at the high level ("1"), the logical conjunction circuit 82 of the distribution circuit 21 supplies the serial signal S1 to the generation circuit 61, the logical conjunction circuit 83 supplies the serial signal S1 to the generation circuit 62, and the logical conjunction circuit 84 supplies a signal at the low level to the flip-flop 31. In addition, in a case where the control signal MSW is at the low level ("0"), the distribution circuit 21 causes the logical conjunction circuit 84 of the distribution circuit 21 to supply the serial signal S1 to the flip-flop 31, causes the logical conjunction circuit 82 to supply a signal at the low level to the generation circuit 61, and causes the logical conjunction circuit 83 to supply a signal at the low level to the generation circuit 62.

The flip-flop 31 (FIG. 3) is configured to sample an output signal (the serial signal S1) of the distribution circuit 21 in the operation mode M1 on the basis of the clock signal CLK, output the sampled signal as a signal P31, and output an inverted signal of the signal P31 as a signal N31.

The flip-flop 32 is configured to sample an output signal (the serial signal S2) of the distribution circuit 22 in the operation mode M1 on the basis of the clock signal CLK and output the sampled signal. The latch 33 is configured to latch an output signal of the flip-flop 32 in the operation mode M1 on the basis of the clock signal CLK, output the latched signal as a signal P33, and output an inverted signal of the signal P33 as a signal N33.

The selector 34 is configured to select one of the signals P31 and P33 in the operation mode M1 on the basis of a control signal SEL and output the selected signal as a signal S34. Specifically, the selector 34 outputs, as a signal P34, a signal of the signals P31 and P33 that has been selected and outputs an inverted signal of the signal P34 as a signal N34. The selector 35 is configured to select one of the signals N31 and N33 in the operation mode M1 on the basis of a control signal SEL and output the selected signal as a signal S35. Specifically, the selector 35 outputs, as a signal P35, a signal of the signals N31 and N33 that has been selected and outputs an inverted signal of the signal P35 as a signal N35.

The flip-flop 41 is configured to sample an output signal (the serial signal S3) of the distribution circuit 23 in the operation mode M1 on the basis of the clock signal CLK, output the sampled signal as a signal P41, and output an inverted signal of the signal P41 as a signal N41.

The flip-flop 42 is configured to sample an output signal (the serial signal S4) of the distribution circuit 24 in the operation mode M1 on the basis of the clock signal CLK and output the sampled signal. The latch 43 is configured to latch an output signal of the flip-flop 42 in the operation mode M1 on the basis of the clock signal CLK, output the latched signal as a signal P43, and output an inverted signal of the signal P43 as a signal N43.

The selector 44 is configured to select one of the signals P41 and P43 in the operation mode M1 on the basis of a control signal SEL and output the selected signal as a signal S44. Specifically, the selector 44 outputs, as a signal P44, a signal of the signals N41 and P43 that has been selected and outputs an inverted signal of the signal P44 as a signal N44. The selector 45 is configured to select one of the signals N41 and N43 in the operation mode M1 on the basis of a control signal SEL and output the selected signal as a signal S45. Specifically, the selector 45 outputs, as a signal P45, a signal of the signals N41 and N43 that has been selected and outputs an inverted signal of the signal P45 as a signal N45.

The flip-flop 51 is configured to sample an output signal (the serial signal S5) of the distribution circuit 25 in the operation mode M1 on the basis of the clock signal CLK, output the sampled signal as a signal P51, and output an inverted signal of the signal P51 as a signal N51.

The flip-flop 52 is configured to sample an output signal (the serial signal S6) of the distribution circuit 26 in the operation mode M1 on the basis of the clock signal CLK and output the sampled signal. The latch 53 is configured to latch an output signal of the flip-flop 52 in the operation mode M1 on the basis of the clock signal CLK, output the latched signal as a signal P53, and output an inverted signal of the signal P53 as a signal N53.

The selector 54 is configured to select one of the signals P51 and P53 in the operation mode M1 on the basis of a control signal SEL and output the selected signal as a signal S54. Specifically, the selector 54 outputs, as a signal P54, a signal of the signals P51 and P53 that has been selected and outputs an inverted signal of the signal P54 as a signal N54. The selector 55 is configured to select one of the signals N51 and N53 in the operation mode M1 on the basis of a control signal SEL and output the selected signal as a signal S55. Specifically, the selector 55 outputs, as a signal P55, a signal of the signals N51 and N53 that has been selected and outputs an inverted signal of the signal P55 as a signal N55.

The generation circuit 61 is configured to generate four signals in the operation mode M2 on the basis of an output signal (the serial signal S1) of the distribution circuit 21 and an output signal (the serial signal S2) of the distribution circuit 22. An input terminal A1 of the generation circuit 61 is coupled to the distribution circuit 21 and an input terminal A2 thereof is coupled to the distribution circuit 22. The flip-flop section 71 is configured to sample the four signals outputted from the generation circuit 61 on the basis of the clock signal CLK and output a signal S71 including the four sampled signals.

The generation circuit 62 is configured to generate four signals in the operation mode M2 on the basis of an output signal (the serial signal S3) of the distribution circuit 23 and an output signal (the serial signal S1) of the distribution circuit 21. The input terminal A1 of the generation circuit 62 is coupled to the distribution circuit 23 and the input terminal A2 thereof is coupled to the distribution circuit 21. The flip-flop section 72 is configured to sample the four signals outputted from the generation circuit 62 on the basis of the clock signal CLK and output a signal S72 including the four sampled signals.

The generation circuit 63 is configured to generate four signals in the operation mode M2 on the basis of an output signal (the serial signal S2) of the distribution circuit 22 and an output signal (the serial signal S3) of the distribution circuit 23. The input terminal A1 of the generation circuit 63 is coupled to the distribution circuit 22 and the input terminal A2 thereof is coupled to the distribution circuit 23. The flip-flop section 73 is configured to sample the four signals outputted from the generation circuit 63 on the basis of the clock signal CLK and output a signal S73 including the four sampled signals.

The generation circuit 64 is configured to generate four signals in the operation mode M2 on the basis of an output signal (the serial signal S4) of the distribution circuit 24 and an output signal (the serial signal S5) of the distribution circuit 25. The input terminal A1 of the generation circuit 64 is coupled to the distribution circuit 24 and the input terminal A2 thereof is coupled to the distribution circuit 25. The flip-flop section 74 is configured to sample the four signals outputted from the generation circuit 64 on the basis of the clock signal CLK and output a signal S74 including the four sampled signals.

The generation circuit 65 is configured to generate four signals in the operation mode M2 on the basis of an output signal (the serial signal S6) of the distribution circuit 26 and an output signal (the serial signal S4) of the distribution circuit 24. The input terminal A1 of the generation circuit 65 is coupled to the distribution circuit 26 and the input terminal A2 thereof is coupled to the distribution circuit 24. The flip-flop section 75 is configured to sample the four signals outputted from the generation circuit 65 on the basis of the clock signal CLK and output a signal S75 including the four sampled signals.

The generation circuit 66 is configured to generate four signals in the operation mode M2 on the basis of an output signal (the serial signal S5) of the distribution circuit 25 and an output signal (the serial signal S6) of the distribution circuit 26. The input terminal A1 of the generation circuit 66 is coupled to the distribution circuit 25 and the input terminal A2 thereof is coupled to the distribution circuit 26. The flip-flop section 76 is configured to sample the four signals outputted from the generation circuit 66 on the basis of the clock signal CLK and output a signal S76 including the four sampled signals.

FIG. 5 illustrates a configuration example of the generation circuit 61 and the flip-flop section 71. It is to be noted that the same applies to the generation circuits 62 to 66 and the flip-flop sections 72 to 76.

The generation circuit 61 includes a non-logical conjunction (NAND) circuit 85, a non-logical conjunction circuit 86, an inverter 87, a non-logical conjunction circuit 88, and an inverter 89. The first input terminal of the non-logical conjunction circuit 85 is coupled to the input terminal A1 of the generation circuit 61, the second input terminal thereof is coupled to the input terminal A2 of the generation circuit 61, and the output terminal thereof is coupled to the second input terminal of the non-logical conjunction circuit 86 and the first input terminal of the non-logical conjunction circuit 88. The first input terminal of the non-logical conjunction circuit 86 is coupled to the input terminal A1 of the generation circuit 61, the second input terminal thereof is coupled to the output terminal of the non-logical conjunction circuit 85, and the output terminal thereof is coupled to the input terminal of the inverter 87 and the flip-flop section 71. The input terminal of the inverter 87 is coupled to the output terminal of the non-logical conjunction circuit 86 and the output terminal thereof is coupled to the flip-flop section 71. The first input terminal of the non-logical conjunction circuit 88 is coupled to the output terminal of the non-logical conjunction circuit 85, the second input terminal thereof is coupled to the input terminal A2 of the generation circuit 61, and the output terminal thereof is coupled to the flip-flop section 71 and the input terminal of the inverter 89. The input terminal of the inverter 89 is coupled to the output terminal of the non-logical conjunction circuit 88 and the output terminal thereof is coupled to the flip-flop section 71.

The flip-flop section 71 includes four flip-flops 91 to 94. The flip-flop section 91 is configured to sample an output signal of the inverter 87 on the basis of the clock signal CLK and output the sampled signal. The flip-flop section 92 is configured to sample an output signal of the non-logical conjunction circuit 86 on the basis of the clock signal CLK and output the sampled signal. The flip-flop section 93 is configured to sample an output signal of the non-logical conjunction circuit 88 on the basis of the clock signal CLK and output the sampled signal. The flip-flop section 94 is configured to sample an output signal of the inverter 89 on the basis of the clock signal CLK and output the sampled signal. The flip-flop section 71 outputs an output signal of the flip-flop 91 from an output terminal T1, outputs an output signal of the flip-flop 92 from an output terminal T2, outputs an output signal of the flip-flop 93 from an output terminal T3, and outputs an output signal of the flip-flop 94 from an output terminal T4.

FIG. 6 illustrates an operation example of the generation circuit 61 and the flip-flop section 71. Signals SA1 and SA2 are input signals of the input terminals A1 and A2 of the generation circuit 61. Signals ST1, ST2, ST3, and ST4 are output signals of the output terminals T1, T2, T3, and T4 of the flip-flop section 71. In a case where the signals SA1 and SA2 are "0, 0" or "1, 1", the signals ST1, ST2, ST3, and ST4 are "0, 1, 1, 0". In addition, in a case where the signals SA1 and SA2 are "0, 1", the signals ST1, ST2, ST3, and ST4 are "0, 1, 0, 1". In addition, in a case where the signals SA1 and SA2 are "1, 0", the signals ST1, ST2, ST3, and ST4 are "1, 0, 1, 0".

The output section DRV1 (FIG. 3) is configured to set the voltage of the output terminal Tout1 on the basis of the signal S71 outputted from the flip-flop section 71 and the signal S34 outputted from the selector 34. The output section DRV2 is configured to set the voltage of the output terminal Tout2 on the basis of the signal S72 outputted from the flip-flop section 72 and the signal S35 outputted from the selector 35. The output section DRV3 is configured to set the voltage of the output terminal Tout3 on the basis of the signal S73 outputted from the flip-flop section 73 and the signal S44 outputted from the selector 44. The output section DRV4 is configured to set the voltage of the output terminal Tout4 on the basis of the signal S74 outputted from the flip-flop section 74 and the signal S45 outputted from the selector 45. The output section DRV5 is configured to set the voltage of the output terminal Tout5 on the basis of the signal S75 outputted from the flip-flop section 75 and the signal S54 outputted from the selector 54. The output section DRV6 is configured to set the voltage of the output terminal Tout6 on the basis of the signal S76 outputted from the flip-flop section 76 and the signal S55 outputted from the selector 55.

As illustrated in FIG. 5, the output section DRV1 includes selectors 101 to 104, transistors 111, 114, 115, and 118, and resistors 112, 113, 116, and 117. Each of the transistors 111, 114, 115, and 118 is an N-type MOS (Metal Oxide Semiconductor) transistor.

The selector 101 is configured to select one of an output signal of the flip-flop 91 and the signal P34 on the basis of the control signal MSW and output the selected signal. Specifically, in a case where the control signal MSW is at the high level ("1"), the selector 101 selects an output signal of the flip-flop 91. In a case where the control signal MSW is at the low level ("0"), the selector 101 selects the signal P34. Similarly, the selector 102 is configured to select one of an output signal of the flip-flop 92 and the signal N34 on the basis of the control signal MSW and output the selected signal. The selector 103 is configured to select one of an output signal of the flip-flop 93 and the signal P34 on the basis of the control signal MSW and output the selected signal. The selector 104 is configured to select one of an output signal of the flip-flop 94 and the signal N34 on the basis of the control signal MSW and output the selected signal.

The gate of the transistor 111 is supplied with an output signal of the selector 101, the drain thereof is supplied with a voltage V1, and the source thereof is coupled to one end of the resistor 112. The one end of the resistor 112 is coupled to the source of the transistor 111 and the other end thereof is coupled to one end of the resistor 113 and the output terminal Tout1. The one end of the resistor 113 is coupled to the other end of the resistor 112 and the output terminal Tout1 and the other end thereof is coupled to the drain of the transistor 114. The gate of the transistor 114 is supplied with an output signal of the selector 102, the drain thereof is coupled to the other end of the resistor 113, and the source thereof is grounded. The total value of the resistance value of the on-resistance of the transistor 111 and the resistance value of the resistor 112 is set to about 100Ω. Similarly, the total value of the resistance value of the on-resistance of the transistor 114 and the resistance value of the resistor 113 is set to about 100Ω.

The gate of the transistor 115 is supplied with an output signal of the selector 103, the drain thereof is supplied with a voltage V1, and the source thereof is coupled to one end of the resistor 116. The one end of the resistor 116 is coupled to the source of the transistor 115 and the other end thereof is coupled to one end of the resistor 117 and the output terminal Tout1. The one end of the resistor 117 is coupled to the other end of the resistor 116 and the output terminal Tout1 and the other end thereof is coupled to the drain of the transistor 118. The gate of the transistor 118 is supplied with an output signal of the selector 104, the drain thereof is coupled to the other end of the resistor 117, and the source thereof is grounded. The total value of the resistance value of the on-resistance of the transistor 115 and the resistance value of the resistor 116 is set to about 100Ω. Similarly, the total value of the resistance value of the on-resistance of the transistor 118 and the resistance value of the resistor 117 is set to about 100Ω.

The above has described the output section DRV1 as an example and the same applies to the output sections DRV2 to DRV6.

In the operation mode M1 (the differential mode), the control signal MSW is set to the low level ("0"). This causes the distribution circuit 21 to supply the serial signal S1 to the flip-flop 31, causes the distribution circuit 22 to supply the serial signal S2 to the flip-flop 32, causes the distribution circuit 23 to supply the serial signal S3 to the flip-flop 41, causes the distribution circuit 24 to supply the serial signal S4 to the flip-flop 42, causes the distribution circuit 25 to supply the serial signal S5 to the flip-flop 51, and causes the distribution circuit 26 to supply the serial signal S6 to the flip-flop 52 in FIG. 3. As a result, the selector 34 outputs the signal S34 (the signals P34 and N34), the selector 35 outputs the signal S35 (the signals P35 and N35), the selector 44 outputs the signal S44 (the signals P44 and N44), the selector 45 outputs the signal S45 (the signals P45 and N45), the selector 54 outputs the signal S54 (the signals P54 and N54), and the selector 55 outputs the signal S55 (the signals P55 and N55). The control signal MSW is at the low level ("0"). For example, in the output section DRV1 (FIG. 5), each of the selectors 101 and 103 thus selects the signal P34 outputted from the selector 34 and each of the selectors 102 and 104 selects the signal N34 outputted from the selector 34. In a case where the signal P34 is at the high level and the signal N34 is at the low level, the transistors 111 and 115 are turned on and the transistors 114 and 118 are turned off. This sets the voltage of the output terminal Tout1 to the high level voltage VH and sets the output impedance of the output section DRV1 to about 50Ω. In addition, in a case where the signal P34 is at the low level and the signal N34 is at the high level, the transistors 114 and 118 are turned on and the transistors 111 and 115 are turned off. This sets the voltage of the output terminal Tout1 to the low level voltage VL and sets the output impedance of the output section DRV1 to about 50Ω. The same applies to the output sections DRV2 to DRV6.

In addition, in the operation mode M2 (the three-phase mode), the control signal MSW is set to the high level ("1"). This causes the distribution circuit 21 to supply the serial signal S1 to each of the generation circuits 61 and 62, causes the distribution circuit 22 to supply the serial signal S2 to each of the generation circuits 61 and 63, causes the distribution circuit 23 to supply the serial signal S3 to each of the generation circuits 62 and 63, causes the distribution circuit 24 to supply the serial signal S4 to each of the generation circuits 64 and 65, causes the distribution circuit 25 to supply the serial signal S5 to each of the generation circuits 64 and 66, and causes the distribution circuit 26 to supply the serial signal S6 to each of the generation circuits 65 and 66 in FIG. 3. As a result, the flip-flop sections 71 to 76 respectively output the signals S71 to S76. The control signal MSW is at the low level ("0"). For example, in the output section DRV1 (FIG. 5), each of the selectors 101 to 104 thus selects the signal S71 outputted from the flip-flop section 71. As illustrated in FIG. 6, in a case where the four signals ST1 to ST4 included in the signal S71 are "1, 0, 1, 0", the transistors 111 and 115 are turned on and the transistors 114 and 118 are turned off. This sets the voltage of the output terminal Tout1 to the high level voltage VH and sets the output impedance of the output section DRV1 to about 50Ω. In a case where the signals ST1 to ST4 are "0, 1, 0, 1", the transistors 114 and 118 are turned on and the transistors 111 and 115 are turned off. This sets the voltage of the output terminal Tout1 to the low level voltage VL and sets the output impedance of the output section DRV1 to about 50Ω. In addition, in a case where the signals ST1 to ST4 are "0, 1, 1, 0", the transistors 114 and 115 are turned on and the transistors 111 and 118 are turned off. This sets the voltage of the output terminal Tout1 to the medium level voltage VM and sets the output impedance of the output section DRV1 to about 50Ω. The same applies to the output sections DRV2 to DRV6.

FIG. 7 illustrates an example of an operation based on the serial signals S1 to S3 in the operation mode M2 (the three-phase mode). The same applies to the serial signals S4 to S6. A case where the serial signals S1, S2, and S3 are "1, 0, 0" is described in detail as an example.

As illustrated in FIG. 3, the serial signal S1 is inputted to the input terminal A1 of the generation circuit 61 and the serial signal S2 is inputted to the input terminal A2 thereof. The signals SA1 and SA2 in the generation circuit 61 are thus "1, 0". In this case, as illustrated in FIG. 6, the signals ST1, ST2, ST3, and ST4 are "1, 0, 1, 0". As illustrated in FIG. 7, the voltage of the signal SIG1 is thus the high level voltage VII.

In addition, as illustrated in FIG. 3, the serial signal S3 is inputted to the input terminal A1 of the generation circuit 62 and the serial signal S1 is inputted to the input terminal A2 thereof. The signals SA1 and SA2 in the generation circuit 62 are thus "0, 1". In this case, as illustrated in FIG. 6, the signals ST1, ST2, ST3, and ST4 are "0, 1, 0, 1". As illustrated in FIG. 7, the voltage of the signal SIG2 is thus the low level voltage VL.

In addition, as illustrated in FIG. 3, the serial signal S2 is inputted to the input terminal A1 of the generation circuit 63 and the serial signal S3 is inputted to the input terminal A2 thereof. The signals SA1 and SA2 in the generation circuit 63 are thus "0, 0". In this case, as illustrated in FIG. 6, the signals ST1, ST2, ST3, and ST4 are "0, 1, 1, 0". As illustrated in FIG. 7, the voltage of the signal SIG3 is thus the medium level voltage VM.

In this way, in a case where the serial signals S1, S2, and S3 are "1, 0, 0", the voltage of the signal SIG1 is the high level voltage VH, the voltage of the signal SIG2 is the low level voltage VL, and the voltage of the signal SIG3 is the medium level voltage VM. The transmission unit 20 therefore transmits the symbol "+x" as illustrated in FIGS. 2 and 7.

Similarly, the transmission unit 20 transmits the symbol "−x" in a case where the serial signals S1, S2, and S3 are "0, 1, 1". The transmission unit 20 transmits the symbol "+y" in a case where the serial signals S1, S2, and S3 are "0, 0, 1". The transmission unit 20 transmits the symbol "−y" in a case where the serial signals S1, S2, and S3 are "1, 1, 0". The transmission unit 20 transmits the symbol "+z" in a case where the serial signals S1, S2, and S3 are "0, 1, 0". The transmission unit 20 transmits the symbol "−z" in a case where the serial signals S1, S2, and S3 are "1, 0, 1".

The control section 29 (FIG. 3) is configured to select one of the two operation modes M1 and M2 on the basis of the mode control signal MSEL and control the transmission unit 20 to cause the transmission unit 20 to operate in the selected operation mode. The mode control signal MSEL is supplied, for example, from the outside of the transmitter 1. The control section 29 selects one of these two operation modes M1 and M2 on the basis of this mode control signal MSEL. The control section 29 generates the clock signal CLK and the control signals MSW and SEL in accordance with the selected operation mode. In a case where the operation mode M is the operation mode M1, the control section 29 sets the control signal MSW to the low level ("0"). In a case where the operation mode M is the operation mode M2, the control section 29 sets the control signal MSW to the high level ("1"). In addition, the control section 29 generates the voltage V1 to be used in each of the output sections DRV1 to DRV6 in accordance with the selected operation mode. The voltage V1 in the operation mode M1 and the voltage V1 in the operation mode M2 may be the same or different from each other.

(Regarding Communication System)

FIG. 8 illustrates a configuration example of a communication system 4 in a case where the transmitter 1 operates in the operation mode M1 (the differential mode). The communication system 4 includes the transmitter 1 and a receiver 210. The receiver 210 includes input units 211 to 213. In the operation mode M1, the output sections DRV1 and DRV2 transmit the signals SIG1 and SIG2 as a differential signal and the input unit 211 receives these signals SIG1 and SIG2. Similarly, the output sections DRV3 and DRV4 transmit the signals SIG3 and SIG4 as a differential signal and the input unit 212 receives these signals SIG3 and SIG4. The output sections DRV5 and DRV6 transmit the signals SIG5 and SIG6 as a differential signal and the input unit 213 receives these signals SIG5 and SIG6. It is to be noted that the one receiver 210 is provided with the three input units 211 to 213 in this example to transmit data to the receiver 210, but this is not limitative. Alternatively, for example, each of three receivers may be provided with one input unit and pieces of data may be transmitted to these three receivers.

FIG. 9 illustrates a configuration example of the input unit 211. It is to be noted that the following describes the input unit 211 as an example, but the same applies to the input units 212 and 213. The input unit 211 includes a resistor 216 and an amplifier 217. The resistor 216 functions as a terminating resistor of the communication system 4 and the resistance value is about 100[Ω] in this example. One end of the resistor 216 is coupled to an input terminal Tin11 and the other end thereof is coupled to an input terminal Tin12. The amplifier 217 is configured to output "1" or "0" in accordance with a difference between the signal of a positive input terminal and the signal of a negative input terminal. The positive input terminal of the amplifier 217 is coupled to one end of the resistor 216 and the input terminal Tin11 and the negative input terminal thereof is coupled to the other end of the resistor 216 and the input terminal Tin12.

This configuration allows the communication system 4 to transmit and receive data by using differential signals.

FIG. 10 illustrates a configuration example of a communication system 5 in which the transmitter 1 operates in the operation mode M2 (the three-phase mode). The communication system 5 includes the transmitter 1 and a receiver 220. The receiver 220 includes input units 221 and 222. In this mode, the output sections DRV1 to DRV3 transmit the signals SIG1 to SIG3 as a three-phase signal and the input unit 221 receives these signals SIG1 to SIG3. Similarly, the output sections DRV4 to DRV6 transmit the signals SIG4 to SIG6 as a three-phase signal and the input unit 222 receives these signals SIG4 to SIG6.

FIG. 11 illustrates a configuration example of the input unit 221. It is to be noted that the following describes the input unit 221 as an example, but the same applies to the input unit 222. The input unit 221 includes resistors 224 to 226 and amplifiers 227 to 229. Each of the resistors 224 to 226 functions as a terminating resistor of the communication system 5 and the resistance value is about 50[Ω] in this example. One end of the resistor 224 is coupled to an input terminal Tin21 and the other end thereof is coupled to the other end of each of the resistors 225 and 226. One end of the resistor 225 is coupled to an input terminal Tin22 and the other end thereof is coupled to the other end of each of the resistors 224 and 226. One end of the resistor 226 is coupled to an input terminal Tin23 and the other end thereof is coupled to the other end of each of the resistors 224 and 226. The positive input terminal of the amplifier 227 is coupled to the negative input terminal of the amplifier 229, the one end of the resistor 226, and the input terminal Tin21. The negative input terminal thereof is coupled to the positive input terminal of the amplifier 228, the one end of the resistor 225, and the input terminal Tin22. The positive input terminal of the amplifier 228 is coupled to the negative input terminal of the amplifier 227, the one end of the resistor 225, and the input terminal Tin22. The negative input terminal thereof is coupled to the positive input terminal of the amplifier 229, the one end of the resistor 226, and the input terminal Tin23. The positive input terminal of the amplifier 229 is coupled to the negative input terminal of the amplifier 228, the one end of the resistor 226, and the input terminal Tin23. The negative input terminal thereof is coupled to the positive input terminal of the amplifier 227, the one end of the resistor 224, and the input terminal Tin21.

FIG. 12 illustrates an operation example of the input unit 221. In this example, the input unit 221 receives the symbol "+x". In other words, the voltage of the signal SIG1 is the high level voltage VH, the voltage of the signal SIG2 is the low level voltage VL, and the voltage of the signal SIG3 is the medium level voltage VM. In this case, a current Iin flows through the input terminal Tin21, the resistor 224, the resistor 225, and the input terminal Tin22 in this order. The positive input terminal of the amplifier 227 is then supplied with the high level voltage VH and the negative input terminal thereof is supplied with the low level voltage VL. The amplifier 227 outputs "1". In addition, the positive input terminal of the amplifier 228 is supplied with the low level voltage VL and the negative input terminal thereof is supplied with the medium level voltage VM. The amplifier 228 outputs "0". In addition, the positive input terminal of the amplifier 229 is supplied with the medium level voltage VM and the negative input terminal thereof is supplied with the high level voltage VH. The amplifier 227 outputs "0". In this way, output signals of the amplifiers 227, 228, and 229 are "1, 0, 0".

FIG. 13 illustrates an operation example of the input unit 221. As described above, in a case where the input unit 221 receives the symbol "+x", output signals of the amplifiers 227, 228, and 229 are "1, 0, 0". Similarly, in a case where the input unit 221 receives the symbol "−x", output signals of the amplifiers 227, 228, and 229 are "1, 1, 1". In a case where the input unit 221 receives the symbol "+y", output signals of the amplifiers 227, 228, and 229 are "0, 1, 0". In a case where the input unit 221 receives the symbol "−y", output signals of the amplifiers 227, 228, and 229 are "1, 0, 1". In a case where the input unit 221 receives the symbol "+z", output signals of the amplifiers 227, 228, and 229 are "0, 0, 1". In a case where the input unit 221 receives the symbol "−z", output signals of the amplifiers 227, 228, and 229 are "1, 1, 0". As illustrated in FIGS. 7 and 13, an output signal of the amplifier 227 corresponds to the serial signal S1 of the transmission unit 20, an output signal of the amplifier 228 corresponds to the serial signal S3 of the transmission unit 20, and an output signal of the amplifier 229 corresponds to the serial signal S2 of the transmission unit 20.

This configuration allows the communication system 5 to transmit and receive data by using three-phase signals.

(Regarding Layout of Transmission Unit 20)

FIG. 14 illustrates an example of the circuit disposition of respective blocks for the serial signals S1 to S3 on the semiconductor substrate in the transmission unit 20. FIG. 14 also illustrates pads PAD1 to PAD3 and ESD (Electro-Static Discharge) protection circuits ESD1 to ESD3. The pads PAD1 to PAD3 correspond to the output terminals Tout1 to Tout3 and the ESD protection circuits ESD1 to ESD3 are respectively disposed near these pads PAD1 to PAD3. In this example, the serializer SER1, the distribution circuit 21, a circuit 241, the output section DRV1, the ESD protection circuit ESD1, and the pad PAD1 are disposed in the uppermost stage of FIG. 14. The serializer SER2, the distribution circuit 22, a circuit 242, the output section DRV2, the ESD protection circuit ESD2, and the pad PAD2 are disposed in the lower stage. The serializer SER3, the distribution circuit 23, a circuit 243, the output section DRV3, the ESD protection circuit ESD3, and the pad PAD3 are disposed in the still lower stage. The circuit 241 includes the generation circuit 61, the flip-flop section 71, the flip-flop 31, and the selector 34. Similarly, the circuit 242 includes the generation circuit 62, the flip-flop section 72, the flip-flop 32, the latch 33, and the selector 35. The circuit 243 includes the generation circuit 63, the flip-flop section 73, the flip-flop 41, and the selector 44.

There is provided a wiring region 240 between the distribution circuits 21 to 23 and the circuits 241 to 243. In this wiring region 240, a plurality of wiring lines is disposed that transmits signals from the distribution circuits 21 to 23 to the circuits 241 to 243. In FIG. 14, an arrow indicates the flow of a signal in the wiring region 240. Specifically, in the wiring region 240, signals are transmitted from the distribution circuit 21 to the circuits 241 and 242, signals are transmitted from the distribution circuit 22 to the circuits 241 and 243, and signals are transmitted from the distribution circuit 23 to the circuits 242 and 243.

Here, the serializer SER1 corresponds to a specific example of a "first serializer" according to the present disclosure. The serializer SER2 corresponds to a specific example of a "second serializer" according to the present disclosure. The serializer SER3 corresponds to a specific example of a "third serializer" according to the present disclosure. The serial signal S1 corresponds to a specific example of a "first serial signal" according to the present disclosure. The serial signal S2 corresponds to a specific example of a "second serial signal" according to the present disclosure. The serial signal S3 corresponds to a specific example of a "third serial signal" according to the present disclosure. The generation circuit 61 corresponds to a specific example of a "first output control circuit" according to the present disclosure. The generation circuit 62 corresponds to a specific example of a "second output control circuit" according to the present disclosure. The generation circuit 63 corresponds to a specific example of a "third output control circuit" according to the present disclosure. The selector 34 corresponds to a specific example of a "fourth output control circuit" according to the present disclosure. The selector 35 corresponds to a specific example of a "fifth output control circuit" according to the present disclosure. The output section DRV1 corresponds to a specific example of a "first output section" according to the present disclosure. The output section DRV2 corresponds to a specific example of a "second output section" according to the present disclosure. The output section DRV3 corresponds to a specific example of a "third output section" according to the present disclosure. The transistor 111 corresponds to a specific example of a "first switch" according to the present disclosure. The transistor 114 corresponds to a specific example of a "second switch" according to the present disclosure. The transistor 115 corresponds to a specific example of a "third switch" according to the present disclosure. The transistor 118 corresponds to a specific example of a "fourth switch" according to the present disclosure. The operation mode M2 corresponds to a specific example of a "first operation mode" according to the present disclosure. The operation mode M1 corresponds to a specific example of a "second operation mode" according to the present disclosure. The processing unit 10 corresponds to a specific example of a "processing unit" according to the present disclosure. The processing circuit 11 corresponds to a specific example of a "first processing circuit" according to the present disclosure. The exchange circuit 12 corresponds to a specific example of a "second processing circuit" according to the present disclosure. The parallel signal DATA1 corresponds to a specific example of a "first transmission parallel signal" according to the present disclosure. The parallel signal DATA2 corresponds to a specific example of a "second transmission parallel signal" according to the present disclosure. The parallel signal DATA3 corresponds to a specific example of a "third transmission parallel signal" according to the present disclosure. The parallel signal DT1 corresponds to a specific example of a "first parallel signal" according to the present disclosure. The parallel signal DT2 corresponds to a specific example of a "second parallel signal" according to the present disclosure. The parallel signal DT3 corresponds to a specific example of a "third parallel signal" according to the present disclosure.

[Operations and Workings]

Subsequently, the operations and workings of the transmitter 1 according to the present embodiment are described.

(Overview of Overall Operation)

First, an overview of the overall operation of the transmitter 1 is described with reference to FIG. 1.

The processing unit 10 generates the six sets of parallel signals DATA1 to DATA6 by performing a predetermined process. Specifically, the processing circuit 11 of the processing unit 10 generates the six sets of parallel signals DT1 to DT6 by performing a predetermined process. The exchange circuit 12 exchanges the parallel signal DT2 and the parallel signal DT3 with each other on the basis of the mode control signal MSEL. The exchange circuit 13 exchanges the parallel signal DT5 and the parallel signal DT6 with each other on the basis of the mode control signal MSEL as with the exchange circuit 12. This causes the processing unit 10 to respectively output the parallel signals DT1, DT2, DT3, DT4, DT5, and DT6 as the parallel signals DATA1, DATA2, DATA3, DATA4, DATA5, and DATA6 in a case where the operation mode M is the operation mode M1 (the differential mode). In addition, the processing unit 10 respectively outputs the parallel signals DT1, DT3, DT2, DT4, DT6, and DT5 as the parallel signals DATA1, DATA2, DATA3, DATA4, DATA5, and DATA6 in a case where the operation mode M is the operation mode M2 (the three-phase mode).

The transmission unit 20 generates the signals SIG1 to SIG6 on the basis of the parallel signals DATA1 to DATA6 and the mode control signal MSEL and respectively outputs these signals SIG1 to SIG6 from the output terminals Tout1 to Tout6. In a case where the operation mode M is the operation mode M1 (the differential mode), the transmission unit 20 transmits the signals SIG1 and SIG2 as a differential signal, transmits the signals SIG3 and SIG4 as a differential signal, and transmits the signals SIG5 and SIG6 as a differential signal. In addition, in a case where the operation mode M is the operation mode M2 (the three-phase mode), the transmission unit 20 transmits the signals SIG1 to SIG3 as a three-phase signal and transmits the signals SIG4 to SIG6 as a three-phase signal.

(Detailed Operation)

Next, operations of the transmission unit 20 in the operation modes M1 and M2 are described in detail.

(Operation Mode M1)

Each of FIGS. 15A and 15B illustrates an operation example of the transmission unit 20 in the operation mode M1. FIG. 15A illustrates a certain operation state and FIG. 15B illustrates another operation state. In the operation mode M1, the transmission unit 20 transmits data to the receiver by using a differential signal.

In the operation mode M1, the control section 29 generates the clock signal CLK, the control signal MSW at the low level ("0"), and the control signal SEL that alternately changes between the high level and the low level.

The serializers SER1 to SER6 respectively generate the serial signals S1 to S6 by serializing the parallel signals DATA1 to DATA6 on the basis of the clock signal CLK.

The control signal MSW is at the low level ("0"). This causes the distribution circuit 21 to supply the serial signal S1 to the flip-flop 31, causes the distribution circuit 22 to supply the serial signal S2 to the flip-flop 32, causes the distribution circuit 23 to supply the serial signal S3 to the flip-flop 41, causes the distribution circuit 24 to supply the serial signal S4 to the flip-flop 42, causes the distribution circuit 25 to supply the serial signal S5 to the flip-flop 51, and causes the distribution circuit 26 to supply the serial signal S6 to the flip-flop 52.

The flip-flop 31 samples an output signal (the serial signal S1) of the distribution circuit 21 on the basis of the clock signal CLK, outputs the sampled signal as the signal P31, and outputs an inverted signal of the signal P31 as the signal N31.

The flip-flop 32 samples an output signal (the serial signal S2) of the distribution circuit 22 on the basis of the clock signal CLK and outputs the sampled signal. The latch 33 latches an output signal of the flip-flop 32 on the basis of the clock signal CLK, outputs the latched signal as the signal P33, and outputs an inverted signal of the signal P33 as the signal N33.

The selector 34 generates the signal S34 by alternately selecting the signal P31 and signal P33 on the basis of the control signal SEL that alternately changes between the high level and the low level. The selector 35 generates the signal S35 by alternately selecting the signal N31 and the signal N33 on the basis of the control signal SEL. In a case where the selector 34 selects the signal P31, the selector 35 selects the signal N31 (FIG. 15A). In a case where the selector 34 selects the signal P33, the selector 35 selects the signal N33 (FIG. 15B).

FIG. 16 illustrates a timing waveform chart illustrating an operation example of each of the selectors 34 and 35. (A) illustrates the waveform of the signal P31 or the signal N31. (B) illustrates the waveform of the signal P33 or the signal N33. (C) illustrates the waveform of the signal S34 or the signal S35. In this example, the serializer SER1 outputs pieces of data D0, D2, D4, . . . in this order as the serial signal S1 in synchronization with the clock signal CLK. The serializer SER2 outputs pieces of data D1, D3, D5, . . . in this order as the serial signal S2 in synchronization with the clock signal CLK. The flip-flop 31 generates the signals P31 and N31 by sampling the serial signal S1 in synchronization with the clock signal CLK (FIG. 16(A)). In addition, the flip-flop 32 and the latch 33 generate the signals P33 and N33 by sampling the serial signal S2 in synchronization with the clock signal CLK (FIG. 16(B)). The latch 33 causes a transition timing of the signals P33 and N33 to shift from a transition timing of the signals P31 and N31. In a period P1 in which the data of the signals P31 and N31 is stable (FIG. 16(A)), the selector 34 generates the signal S34 by selecting the signal P31 and the selector 35 generates the signal S35 by selecting the signal N31 (FIG. 16(C)). In addition, in a period P2 in which the data of the signals P33 and N33 is stable (FIG. 16(B)), the selector 34 generates the signal S34 by selecting the signal P33 and the selector 35 generates the signal S35 by selecting the signal N33 (FIG. 16(C)). As a result of such an operation, the pieces of data D0, D1, D2, . . . are arranged in this order in the signals S34 and S35. In other words, in the operation mode M1, the selectors 34 and 35 operate as serializers of 2:1.

Here, the signal N31 is an inverted signal of the signal P31 and the signal N33 is an inverted signal of the signal P33. Therefore, the signal S35 is an inverted signal of the signal S34. Specifically, the signal P35 of the signal S35 is an inverted signal of the signal P34 of the signal S34 and the signal N35 of the signal S35 is an inverted signal of the signal N34 of the signal S34.

The control signal MSW is at the low level ("0") and the output section DRV1 thus generates the signal SIG1 on the basis of the signal S34. Specifically, the output section DRV1 sets the voltage of the signal SIG1 to the high level voltage VH in a case where the signal P34 included in the signal S34 is at the high level and the signal N34 is at the low level. The output section DRV1 sets the voltage of the signal SIG1 to the low level voltage VL in a case where the signal P34 included in the signal S34 is at the low level and the signal N34 is at the high level. Similarly, the output section DRV2 generates the signal SIG2 on the basis of the signal S35. In this way, the transmission unit 20 transmits the signals SIG1 and SIG2 as a differential signal.

Similarly, the flip-flop 41 samples an output signal (the serial signal S3) of the distribution circuit 23 on the basis of the clock signal CLK, outputs the sampled signal as the signal P41, and outputs an inverted signal of the signal P41 as the signal N41.

The flip-flop 42 samples an output signal (the serial signal S4) of the distribution circuit 24 on the basis of the clock signal CLK and outputs the sampled signal. The latch 43 latches an output signal of the flip-flop 42 on the basis of the clock signal CLK, outputs the latched signal as the signal P43, and outputs an inverted signal of the signal P43 as the signal N43.

The selector 44 generates the signal S44 by alternately selecting the signal P41 and signal P43 on the basis of the control signal SEL. The selector 45 generates the signal S45 by alternately selecting the signal N41 and the signal N43 on the basis of the control signal SEL. In a case where the selector 44 selects the signal P41, the selector 45 selects the signal N41. In a case where the selector 44 selects the signal P43, the selector 45 selects the signal N43.

The output section DRV3 then generates the signal SIG3 on the basis of the signal S44 and the output section DRV4 generates the signal SIG4 on the basis of the signal S45. In this way, the transmission unit 20 transmits the signals SIG3 and SIG4 as a differential signal.

Similarly, the flip-flop 51 samples an output signal (the serial signal S5) of the distribution circuit 25 on the basis of the clock signal CLK, outputs the sampled signal as the signal P51, and outputs an inverted signal of the signal P51 as the signal N51.

The flip-flop 52 samples an output signal (the serial signal S6) of the distribution circuit 26 on the basis of the clock signal CLK and outputs the sampled signal. The latch 53 latches an output signal of the flip-flop 52 on the basis of the clock signal CLK, outputs the latched signal as the signal P53, and outputs an inverted signal of the signal P53 as the signal N53.

The selector 54 generates the signal S54 by alternately selecting the signal P51 and signal P53 on the basis of the control signal SEL. The selector 55 generates the signal S55 by alternately selecting the signal N51 and the signal N53 on the basis of the control signal SEL. In a case where the selector 54 selects the signal P51, the selector 55 selects the signal N51. In a case where the selector 54 selects the signal P53, the selector 55 selects the signal N53.

The output section DRV5 then generates the signal SIG5 on the basis of the signal S54 and the output section DRV6 generates the signal SIG6 on the basis of the signal S55. In this way, the transmission unit 20 transmits the signals SIG5 and SIG6 as a differential signal.

In this way, in the operation mode M1, the transmitter 1 transmits data to the receiver by using a differential signal.

(Operation Mode M2)

FIG. 17 illustrates an operation example of the transmission unit 20 in the operation mode M2. In the operation mode M1, the transmission unit 20 transmits data to the receiver by using a differential signal.

In the operation mode M2, the control section 29 generates the clock signal CLK and the control signal MSW at the high level ("0").

The serializers SER1 to SER6 respectively generate the serial signals S1 to S6 by serializing the parallel signals DATA1 to DATA6 on the basis of the clock signal CLK.

The control signal MSW is at the high level ("1"). This causes the distribution circuit 21 to supply the serial signal S1 to each of the generation circuits 61 and 62, causes the distribution circuit 22 to supply the serial signal S2 to each of the generation circuits 61 and 63, causes the distribution circuit 23 to supply the serial signal S3 to each of the generation circuits 62 and 63, causes the distribution circuit 24 to supply the serial signal S4 to each of the generation circuits 64 and 65, causes the distribution circuit 25 to supply the serial signal S5 to each of the generation circuits 64 and 66, and causes the distribution circuit 26 to supply the serial signal S6 to each of the generation circuits 65 and 66.

The generation circuit 61 generates four signals on the basis of an output signal (the serial signal S1) of the distribution circuit 21 and an output signal of the distribution circuit 22 (the serial signal S2). The flip-flop section 71 samples the four signals outputted from the generation circuit 61 on the basis of the clock signal CLK and outputs the signal S71 including the four sampled signals.

The control signal MSW is at the low level ("1") and the output section DRV1 thus generates the signal SIG1 on the basis of the signal S71. Specifically, in a case where the four signals ST1 to ST4 included in the signal S71 are "1, 0, 1, 0" as illustrated in FIG. 6, the output section DRV1 sets the voltage of the signal SIG1 to the high level voltage VH. In a case where the four signals ST1 to ST4 included in the signal S71 are "0, 1, 0, 1", the output section DRV1 sets the voltage of the signal SIG1 to the low level voltage VL. In a case where the four signals ST1 to ST4 included in the signal S71 are "0, 1, 1, 0", the output section DRV1 sets the voltage of the signal SIG1 to the medium level voltage VM.

Similarly, the generation circuit 62 generates four signals on the basis of an output signal (the serial signal S3) of the distribution circuit 23 and an output signal (the serial signal S1) of the distribution circuit 21. The flip-flop section 72 samples the four signals outputted from the generation circuit 62 on the basis of the clock signal CLK and outputs the signal S72 including the four sampled signals. The output section DRV2 generates the signal SIG2 on the basis of the signal S72.

The generation circuit 63 generates four signals on the basis of an output signal (the serial signal S2) of the distribution circuit 22 and an output signal (the serial signal S3) of the distribution circuit 23. The flip-flop section 73 samples the four signals outputted from the generation circuit 63 on the basis of the clock signal CLK and outputs the signal S73 including the four sampled signals. The output section DRV3 generates the signal SIG3 on the basis of the signal S73.

This causes the transmission unit 20 to set the voltage of the signal SIG1 to the high level voltage VH, set the voltage of the signal SIG2 to the low level voltage VL, and set the voltage of the signal SIG3 to the medium level voltage VM in a case where the serial signals S1, S2, and S3 are "1, 0, 0" as illustrated in FIG. 7. This causes the transmission unit 20 to transmit the symbol "+x". Similarly, the transmission unit 20 transmits the symbol "−x" in a case where the serial signals S1, S2, and S3 are "0, 1, 1". The transmission unit 20 transmits the symbol "+y" in a case where the serial signals S1, S2, and S3 are "0, 0, 1". The transmission unit 20 transmits the symbol "−y" in a case where the serial signals S1, S2, and S3 are "1, 1, 0". The transmission unit 20 transmits the symbol "+z" in a case where the serial signals S1, S2, and S3 are "0, 1, 0". The transmission unit 20 transmits the symbol "−z" in a case where the serial signals S1, S2, and S3 are "1, 0, 1". In this way, the transmission unit 20 transmits the signals SIG1 to SIG3 as a three-phase signal.

The generation circuit 64 generates four signals on the basis of an output signal (the serial signal S4) of the distribution circuit 24 and an output signal (the serial signal S5) of the distribution circuit 25. The flip-flop section 74 samples the four signals outputted from the generation circuit 64 on the basis of the clock signal CLK and outputs the signal S74 including the four sampled signals. The output section DRV4 generates the signal SIG4 on the basis of the signal S74.

The generation circuit 65 generates four signals on the basis of an output signal (the serial signal S6) of the distribution circuit 26 and an output signal (the serial signal S4) of the distribution circuit 24. The flip-flop section 75 samples the four signals outputted from the generation circuit 65 on the basis of the clock signal CLK and outputs the signal S75 including the four sampled signals. The output section DRV5 generates the signal SIG5 on the basis of the signal S75.

The generation circuit 66 generates four signals on the basis of an output signal (the serial signal S5) of the distribution circuit 25 and an output signal (the serial signal S6) of the distribution circuit 26. The flip-flop section 76 samples the four signals outputted from the generation circuit 66 on the basis of the clock signal CLK and outputs the signal S76 including the four sampled signals. The output section DRV6 generates the signal SIG6 on the basis of the signal S76.

This causes the transmission unit 20 to set the voltage of the signal SIG4 to the high level voltage VH, set the voltage of the signal SIG4 to the low level voltage VL, and set the voltage of the signal SIG5 to the medium level voltage VM in a case where the serial signals S4, S5, and S6 are "1, 0, 0" as in a case of the serial signals S1 to S4 (FIG. 7). This causes the transmission unit 20 to transmit the symbol "+x". Similarly, the transmission unit 20 transmits the symbol "−x" in a case where the serial signals S4, S5, and S6 are 0, 1, 1". The transmission unit 20 transmits the symbol "+y" in a case where the serial signals S4, S5, and S6 are "0, 0, 1". The transmission unit 20 transmits the symbol "−y" in a case where the serial signals S4, S5, and S6 are 1, 1, 0". The transmission unit 20 transmits the symbol "+z" in a case where the serial signals S4, S5, and S6 are "0, 1, 0". The transmission unit 20 transmits the symbol "−z" in a case where the serial signals S4, S5, and S6 are "1, 0, 1". In this way, the transmission unit 20 transmits the signals SIG4 to SIG6 as a three-phase signal.

In this way, in the operation mode M2, the transmitter 1 transmits data to the receiver by using a three-phase signal.

As described above, the transmitter 1 is provided with the plurality of operation modes M1 and M2 and it is possible to transmit data to the receiver by using a differential signal and a three-phase signal. This makes it possible to achieve a variety of interfaces.

This makes it possible to increase the degree of freedom, for example, to design the system of an electronic apparatus.

Specifically, for example, in a case where this transmission unit 20 is mounted on a processor, it is possible to configure an electronic apparatus by using a peripheral device supporting a three-phase signal or it is also possible to configure an electronic apparatus by using a peripheral device supporting a differential signal. In addition, for example, it is possible to achieve a variety of interfaces by using one processor. This eliminates the necessity to prepare a processor for each of the interfaces. It is thus possible to narrow down the number of types of processors and reduce the cost. In addition, the serializers SER1 to SER6, the output sections DRV1 to DRV6, and the like are shared in each of the operation modes M1 and M2. This makes it possible to suppress necessary area to dispose a circuit in comparison with a case where different circuits are provided for different interfaces.

In addition, the serializer SER1, the serializer SER2, and the serializer SER3 are disposed in this order on the semiconductor substrate in the transmitter 1 as illustrated in FIG. 14. The serializer SER1 generates the serial signal S1. The serializer SER2 generates the serial signal S2. The serializer SER3 generates the serial signal S3. In addition, as illustrated in FIG. 14, the generation circuit 61, the generation circuit 62, and the generation circuit 63 are disposed in this order on the semiconductor substrate. The generation circuit 61 operates in the operation mode M2 on the basis of the serial signals S1 and S2. The generation circuit 62 operates in the operation mode M2 on the basis of the serial signals S1 and S3. The generation circuit 63 operates in the operation mode M2 on the basis of the serial signals S2 and S3. This makes it possible to reduce the possibility of the unbalanced length of wiring lines that transmit the serial signals S1, S2, and S3 as described below in comparison with a comparative example. It is thus possible to increase the symbol rate Comparative Example Next, the workings according to the present embodiment are described in comparison with a transmitter 1R according to a comparative example.

FIG. 18 illustrates a configuration example of the transmitter 1R according to the comparative example. The transmitter 1R includes a processing unit 10R and a transmission unit 20R.

The processing unit 10R is configured to generate the six sets of parallel signals DATA1 to DATA6 by performing a predetermined process as with the processing unit 10 according to the present embodiment. This processing unit 10R includes a processing circuit 11. The processing circuit 11 is configured to generate the six sets of parallel signals DT1 to DT6 by performing a predetermined process. The processing unit 10R respectively outputs the parallel signals DT1, DT2, DT3, DT4, DT5, and DT6 as the parallel signals DATA1, DATA2, DATA3, DATA4, DATA5, and DATA6 regardless of the operation mode M. In other words, the processing unit 10 (FIG. 1) according to the present embodiment is provided with the exchange circuits 12 and 13. In a case where the operation mode M is the operation mode M2, the exchange circuit 12 exchanges the parallel signals DT2 and DT3 with each other and the exchange circuit 13 exchanges the parallel signals DT5 and DT6 with each other. The processing unit 10R according to this comparative example is not, however, provided with the exchange circuits 12 and 13. The processing unit 10R does not exchange the parallel signals DT2 and DT3 with each other, but outputs the parallel signals DT2 and DT3 as they are as the parallel signals DATA2 and DATA3. The processing unit 10R does not exchange the parallel signals DT5 and DT6 with each other, but outputs the parallel signals DT5 and DT6 as they are as the parallel signals DATA5 and DATA6.

The transmission unit 20R is configured to generate the signals SIG1 to SIG6 on the basis of the parallel signals DATA1 to DATA6 and the mode control signal MSEL and respectively output these signals SIG1 to SIG6 from the output terminals Tout1 to Tout6.

FIG. 19 illustrates a configuration example of the transmission unit 20R. The transmission unit 20R according to the present modification example has different wiring lines from those of the transmission unit 20 (FIG. 3) according to the present embodiment between the serializers SER1 to SER6 and the distribution circuits 21 to 26 and the generation circuits 61 to 66.

The distribution circuit 21 is configured to selectively supply the serial signal S1 outputted from the serializer SER1 to the generation circuits 61 and 62 or the flip-flop 31 on the basis of the control signal MSW. The distribution circuit 22 is configured to selectively supply the serial signal S2 outputted from the serializer SER2 to the generation circuits 62 and 63 or the flip-flop 32 on the basis of the control signal MSW. The distribution circuit 23 is configured to selectively supply the serial signal S3 outputted from the serializer SER3 to the generation circuits 61 and 63 or the flip-flop 41 on the basis of the control signal MSW. The distribution circuit 24 is configured to selectively supply the serial signal S4 outputted from the serializer SER4 to the generation circuits 64 and 65 or the flip-flop 42 on the basis of the control signal MSW. The distribution circuit 25 is configured to selectively supply the serial signal S5 outputted from the serializer SER5 to the generation circuits 65 and 66 or the flip-flop 51 on the basis of the control signal MSW. The distribution circuit 26 is configured to selectively supply the serial signal S6 outputted from the serializer SER6 to the generation circuits 64 and 66 or the flip-flop 52 on the basis of the control signal MSW.

The generation circuit 61 is configured to generate four signals in the operation mode M2 on the basis of an output signal (the serial signal S1) of the distribution circuit 21 and an output signal (the serial signal S3) of the distribution circuit 23. The input terminal A1 of the generation circuit 61 is coupled to the distribution circuit 21 and the input terminal A2 thereof is coupled to the distribution circuit 23.

The generation circuit 62 is configured to generate four signals in the operation mode M2 on the basis of an output signal (the serial signal S2) of the distribution circuit 22 and an output signal (the serial signal S1) of the distribution circuit 21. The input terminal A1 of the generation circuit 62 is coupled to the distribution circuit 22 and the input terminal A2 thereof is coupled to the distribution circuit 21.

The generation circuit 63 is configured to generate four signals in the operation mode M2 on the basis of an output signal (the serial signal S3) of the distribution circuit 23 and an output signal (the serial signal S2) of the distribution circuit 22. The input terminal A1 of the generation circuit 63 is coupled to the distribution circuit 23 and the input terminal A2 thereof is coupled to the distribution circuit 22.

The generation circuit 64 is configured to generate four signals in the operation mode M2 on the basis of an output signal (the serial signal S4) of the distribution circuit 24 and an output signal (the serial signal S6) of the distribution circuit 26. The input terminal A1 of the generation circuit 64 is coupled to the distribution circuit 24 and the input terminal A2 thereof is coupled to the distribution circuit 26.

The generation circuit 65 is configured to generate four signals in the operation mode M2 on the basis of an output signal (the serial signal S5) of the distribution circuit 25 and an output signal (the serial signal S4) of the distribution circuit 24. The input terminal A1 of the generation circuit 65 is coupled to the distribution circuit 25 and the input terminal A2 thereof is coupled to the distribution circuit 24.

The generation circuit 66 is configured to generate four signals in the operation mode M2 on the basis of an output signal (the serial signal S6) of the distribution circuit 26 and an output signal (the serial signal S5) of the distribution circuit 25. The input terminal A1 of the generation circuit 66 is coupled to the distribution circuit 26 and the input terminal A2 thereof is coupled to the distribution circuit 25.

FIG. 20 illustrates an example of an operation based on the serial signals S1 to S3 in the operation mode M2 (the three-phase mode). The transmission unit 20R transmits the symbol "+x" in a case where the serial signals S1, S2, and S3 are "1, 0, 0". The transmission unit 20R transmits the symbol "−x" in a case where the serial signals S1, S2, and S3 are "0, 1, 1". The transmission unit 20R transmits the symbol "+y" in a case where the serial signals S1, S2, and S3 are "0, 1, 0". The transmission unit 20R transmits the symbol "−y" in a case where the serial signals S1, S2, and S3 are "1, 0, 1". The transmission unit 20R transmits the symbol "+z" in a case where the serial signals S1, S2, and S3 are "0, 0, 1". The transmission unit 20R transmits the symbol "−z" in a case where the serial signals S1, S2, and S3 are "1, 1, 0". Different from the transmitter 1 according to the present embodiment, the transmitter 1R according to the comparative example does not cause, for example, the processing unit 10R to exchange the parallel signals DT2 and DT3 with each other in the operation mode M2. This exchanges the serial signals S2 and S3 (FIG. 20) according to the comparative example with the serial signals S2 and S3 (FIG. 7) according to the present embodiment.

In the operation mode M2, as in the example illustrated in FIG. 10, it is possible to configure a communication system 5R by using the transmitter 1R and the receiver 220. As illustrated in FIG. 13, in a case where the input unit 221 of the receiver 220 receives the symbol "+x", output signals of the amplifiers 227, 228, and 229 are "1, 0, 0". In a case where the input unit 221 receives the symbol "−x", output signals of the amplifiers 227, 228, and 229 are "1, 1, 1". In a case where the input unit 221 receives the symbol "+y", output signals of the amplifiers 227, 228, and 229 are "0, 1, 0". In a case where the input unit 221 receives the symbol "−y", output signals of the amplifiers 227, 228, and 229 are "1, 0, 1". In a case where the input unit 221 receives the symbol "+z", output signals of the amplifiers 227, 228, and 229 are "0, 0, 1". In a case where the input unit 221 receives the symbol "−z", output signals of the amplifiers 227, 228, and 229 are "1, 1, 0". As illustrated in FIGS. 7 and 20, an output signal of the amplifier 227 corresponds to the serial signal S1 of the transmission unit 20, an output signal of the amplifier 228 corresponds to the serial signal S2 of the transmission unit 20, and an output signal of the amplifier 229 corresponds to the serial signal S3 of the transmission unit 20. In other words, in the present embodiment, as illustrated in FIGS. 7 and 13, output signals of the amplifiers 227, 228, and 229 respectively correspond to the serial signals S1, S3, and S2 in the transmission unit 20. However, in the present comparative example, as illustrated in FIGS. 13 and 20, output signals of the amplifiers 227, 228, and 229 respectively correspond to the serial signals S1, S2, and S3 in the transmission unit 20.

FIG. 21 illustrates an example of the circuit disposition of respective blocks for the serial signals S1 to S3 on the semiconductor substrate in the transmission unit 20R. In this example, the serializer SER1, the distribution circuit 21, the circuit 241, the output section DRV1, the ESD protection circuit ESD1, and the pad PAD1 are disposed in the uppermost stage of FIG. 14. The serializer SER2, the distribution circuit 22, the circuit 242, the output section DRV2, the ESD protection circuit ESD2, and the pad PAD2 are disposed in the lower stage. The serializer SER3, the distribution circuit 23, the circuit 243, the output section DRV3, the ESD protection circuit ESD3, and the pad PAD3 are disposed in the still lower stage.

There is provided a wiring region 240R between the distribution circuits 21 to 23 and the circuits 241 to 243. In this wiring region 240R, a plurality of wiring lines is disposed that transmits signals from the distribution circuits 21 to 23 to the circuits 241 to 243. In the wiring region 240R, signals are transmitted from the distribution circuit 21 to the circuits 241 and 242, signals are transmitted from the distribution circuit 22 to the circuits 242 and 243, and signals are transmitted from the distribution circuit 23 to the circuits 241 and 243. In this way, in the transmission unit 20R, a signal is transmitted from the distribution circuit 23 disposed in the lowermost stage of FIG. 21 to the circuit 241 disposed in the uppermost stage through a long wiring line.

In this way, in the transmitter 1R according to the comparative example, as illustrated in FIG. 21, the serializer SER1, the serializer SER2, and the serializer SER3 are disposed in this order on the semiconductor substrate. The generation circuit 61, the generation circuit 62, and the generation circuit 63 are disposed in this order on the semiconductor substrate. The serializer SER1 generates the serial signal S1. The serializer SER2 generates the serial signal S2. The serializer SER3 generates the serial signal S3. The generation circuit 61 operates on the basis of the serial signals S1 and S3. The generation circuit 62 operates on the basis of the serial signals S1 and S2. The generation circuit 63 operates on the basis of the serial signals S2 and S3. This provides a long signal path between the distribution circuit 23 and the circuit 241 in the transmission unit 20R. It is difficult to transmit a high-speed signal through such a long signal path. As a result, the symbol rate of the communication system in which the transmitter 1R is used may decrease.

In contrast, in the transmitter 1 according to the present embodiment, as illustrated in FIG. 14, the serializer SER1, the serializer SER2, and the serializer SER3 are disposed in this order on the semiconductor substrate. The generation circuit 61, the generation circuit 62, and the generation circuit 63 are disposed in this order on the semiconductor substrate. The serializer SER1 generates the serial signal S1. The serializer SER2 generates the serial signal S2. The serializer SER3 generates the serial signal S3. The generation circuit 61 operates on the basis of the serial signals S1 and S2. The generation circuit 62 operates on the basis of the serial signals S1 and S3. The generation circuit 63 operates on the basis of the serial signals S2 and S3. This makes it possible in the present embodiment to eliminate long signal paths between the distribution circuits 21 to 23 and the circuits 241 to 243 unlike the comparative example. For example, in the transmitter 1R (FIG. 21), the positions to dispose the serializer SER2 and the distribution circuit 22 and the positions to dispose the serializer SER3 and the distribution circuit 23 are exchanged. This makes it possible to eliminate a long signal path like the transmitter 1 (FIG. 14) according to the present embodiment. This makes it possible to facilitate the respective signal paths between the distribution circuits 21 to 23 and the circuits 241 to 243 to transmit high-speed signals. As a result, it is possible in the present embodiment to increase the symbol rate.

[Effects]

As described above, in the present embodiment, there is provided a plurality of operation modes and it is possible to transmit data to a receiver by using a differential signal and a three-phase signal. This makes it possible to achieve a variety of interfaces.

In the present embodiment, the serializer SER1, the serializer SER2, and the serializer SER3 are disposed in this order on the semiconductor substrate. The generation circuit 61, the generation circuit 62, and the generation circuit 63 are disposed in this order on the semiconductor substrate. The serializer SER1 generates the serial signal S1. The serializer SER2 generates the serial signal S2. The serializer SER3 generates the serial signal S3. The generation circuit 61 operates on the basis of the serial signals S1 and S2. The generation circuit 62 operates on the basis of the serial signals S1 and S3. The generation circuit 63 operates on the basis of the serial signals S2 and S3. This makes it possible to increase the symbol rate.

Modification Example 1-1

In the embodiment described above, for example, the one serializer SER1 serializes the parallel signal DATA1 on the basis of the clock signal CLK to generate the serial signal S1, but this is not limitative. In place of this, for example, the serial signal S1 may be generated by using a plurality of serializers. The same applies to a circuit that generates the serial signals S2 to S6. The following describes a circuit that generates the serial signal S1 in detail.

FIG. 22 illustrates a configuration example of a serializer unit 120 that generates the serial signal S1. The serializer unit 120 includes four serializers 121 to 124 and a selector 125.

The serializer 121 is configured to serialize a parallel signal DATA11 on the basis of a clock signal CLK2 to generate a serial signal S121. The serializer 121 is supplied with the parallel signal DATA11 having a bit width of up to ten bits in accordance with an application. Similarly, the serializer 122 is configured to serialize a parallel signal DATA12 on the basis of the clock signal CLK2 to generate a serial signal S122. The serializer 123 is configured to serialize a parallel signal DATA13 on the basis of the clock signal CLK2 to generate a serial signal S123. The serializer 124 is configured to serialize a parallel signal DATA14 on the basis of the clock signal CLK2 to generate a serial signal S124.

The selector 125 is configured to generate the serial signal S1 by selecting the serial signals S121, S122, S123, and S124 on the basis of a control signal SEL2. Specifically, the selector 125 sequentially selects the serial signal S121, the serial signal S122, the serial signal S123, and the serial signal S124 in this order to go round and outputs the selected signals. In other words, the selector 125 operates as a serializer of 4:1.

Such a configuration makes it possible to decrease the frequency of the clock signal CLK2 and decrease the operation frequency of the processing unit that generates the parallel signals DATA11 to DATA14. As a result, for example, it is possible to increase the symbol rate of the communication system.

Modification Example 1-2

In the embodiment described above, the flip-flop section 71 is configured by using, for example, the four flip-flops 91 to 94 as illustrated in FIG. 5. It is possible to configure each of the flip-flops 91 to 94 by using, for example, a so-called CMOS (Complementary Metal Oxide Semiconductor) circuit. The following describes a configuration example of the flip-flop 91.

FIG. 23 illustrates a configuration example of the flip-flop 91. The flip-flop 91 includes inverters IV1 to IV8 and transistors MN1, MN2, MP1, and MP2. Each of the transistors MN1 and MN2 is an N-type MOS transistor and each of the transistors MP1 and MP2 is a P-type MOS transistor.

The input terminal of the inverter IV1 is coupled to a clock input terminal CKI of the flip-flop 91 and the output terminal thereof is coupled to the input terminal of the inverter IV2, the gates of the transistors MN1 and MP2, the inversion control terminal of the inverter IV5, and the control terminal of the inverter IV7. The input terminal of the inverter IV2 is coupled to the output terminal of the inverter IV1, the gates of the transistors MN1 and MP2, the inversion control terminal of the inverter IV5, and the control terminal of the inverter IV7 and the output terminal thereof is coupled to the gates of the transistors MP1 and MN2, the control terminal of the inverter IV5, and the inversion control terminal of the inverter IV7. The input terminal of the inverter IV3 is coupled to an input terminal DI of the flip-flop 91 and the output terminal thereof is coupled to the sources of the transistors MN1 and MP1. The gate of the transistor MN1 is coupled to the output terminal of the inverter IV1, the source thereof is coupled to the source of the transistor MP1 and the output terminal of the inverter IV3, and the drain thereof is coupled to the drain of the transistor MP1, the input terminal of the inverter IV4, and the output terminal of the inverter IV5. The gate of the transistor MP1 is coupled to the output terminal of the inverter IV2, the source thereof is coupled to the source of the transistor MN1 and the output terminal of the inverter IV3, and the drain thereof is coupled to the drain of the transistor MN1, the input terminal of the inverter IV4, and the output terminal of the inverter IV5. The input terminal of the inverter IV4 is coupled to the drains of the transistors MN1 and MP1 and the output terminal of the inverter IV5 and the output terminal thereof is coupled to the input terminal of the inverter IV5 and the sources of the transistors MN2 and MP2. The input terminal of the inverter IV5 is coupled to the output terminal of the inverter IV4 and the sources of the transistors MN2 and MP2, the output terminal thereof is coupled to the input terminal of the inverter IV4 and the drains of the transistors MN1 and MP1, the control terminal thereof is coupled to the output terminal of the inverter IV2, and the inversion control terminal thereof is coupled to the output terminal of the inverter IV1. The gate of the transistor MN2 is coupled to the output terminal of the inverter IV2, the source thereof is coupled to the source of the transistor MP2, the output terminal of the inverter IV4, and the input terminal of the inverter IV5, and the drain thereof is coupled to the drain of the transistor MP2, the input terminal of the inverter IV6, and the output terminal of the inverter IV7. The gate of the transistor MP2 is coupled to the output terminal of the inverter IV1, the source thereof is coupled to the source of the transistor MN2, the output terminal of the inverter IV4, and the input terminal of the inverter IV5, and the drain thereof is coupled to the drain of the transistor MN2, the input terminal of the inverter IV6, and the output terminal of the inverter IV7. The input terminal of the inverter IV6 is coupled to the drains of the transistors MN2 and MP2 and the output terminal of the inverter IV7 and the output terminal thereof is coupled to the input terminals of the inverters IV7 and IV8. The input terminal of the inverter IV7 is coupled to the output terminal of the inverter IV6 and the input terminal of the inverter IV8, the output terminal thereof is coupled to the input terminal of the inverter IV6 and the drains of the transistors MN2 and MP2, the control terminal thereof is coupled to the output terminal of the inverter IV1, and the inversion control terminal thereof is coupled to the output terminal of the inverter IV2. The input terminal of the inverter IV8 is coupled to the output terminal of the inverter IV6 and the input terminal of the inverter IV7 and the output terminal thereof is coupled to an output terminal DO of the flip-flop 91.

Modification Example 1-3

In the embodiment described above, the generation circuit 61 and the flip-flop section 71 are configured as illustrated in FIG. 5, but this is not limitative. The following describes the present modification example.

FIG. 24 illustrates a configuration example of a generation circuit 161 according to the present modification example. The generation circuit 161 corresponds to the generation circuit 61 and the flip-flop section 71 according to the embodiment described above. The generation circuit 161 includes a non-logical conjunction circuit 162, a non-logical disjunction (NOR) circuit 163, and flip-flops 164 to 167.

The first input terminal of the non-logical conjunction circuit 162 is coupled to the input terminal A1 of the generation circuit 161, the second input terminal thereof is coupled to the input terminal A2 of the generation circuit 161, and the output terminal thereof is coupled to the second input terminal of the flip-flop 164 and the first input terminal of the flip-flop 165. The first input terminal of the non-logical disjunction circuit 163 is coupled to the input terminal A1 of the generation circuit 161, the second input terminal thereof is coupled to the input terminal A2 of the generation circuit 161, and the output terminal thereof is coupled to the second input terminal of the flip-flop 166 and the first input terminal of the flip-flop 167. The first input terminal of the flip-flop 164 is coupled to the input terminal A1 of the generation circuit 161 and the second input terminal thereof is coupled to the output terminal of the non-logical conjunction circuit 162. The first input terminal of the flip-flop 165 is coupled to the output terminal of the non-logical conjunction circuit 162 and the second input terminal thereof is coupled to the input terminal A2 of the generation circuit 161. The first input terminal of the flip-flop 166 is coupled to the input terminal A1 of the generation circuit 161 and the second input terminal thereof is coupled to the output terminal of the non-logical disjunction circuit 163. The first input terminal of the flip-flop 167 is coupled to the output terminal of the non-logical disjunction circuit 163 and the second input terminal thereof is coupled to the input terminal A2 of the generation circuit 161.

FIG. 25 illustrates a configuration example of the flip-flop 164. The same applies to the flip-flop 165. The flip-flop 164 includes a non-logical conjunction circuit ND1. The first input terminal of the non-logical conjunction circuit ND1 is coupled to a first input terminal DI1 of the flip-flop 164, the second input terminal thereof is coupled to a second input terminal DI2 of the flip-flop 164, and the output terminal thereof is coupled to the sources of the transistors MN1 and MP1.

FIG. 26 illustrates a configuration example of the flip-flop 166. The same applies to the flip-flop 167. The flip-flop 166 includes a non-logical disjunction circuit NR1. The first input terminal of the non-logical disjunction circuit NR1 is coupled to the first input terminal DI1 of the flip-flop 166, the second input terminal thereof is coupled to the second input terminal DI2 of the flip-flop 166, and the output terminal thereof is coupled to the sources of the transistors MN1 and MP1.

FIG. 27 illustrates an operation example of the generation circuit 161. The signals SA1 and SA2 are input signals of the input terminals A1 and A2 of the generation circuit 161. The signals ST1, ST2, ST3, and ST4 are output signals of the output terminals T1, T2, T3, and T4 of the generation circuit 161. In a case where the signals SA1 and SA2 are "0, 0" or "1, 1", the signals ST1, ST2, ST3, and ST4 are "0, 0, 1, 1". In this case, the voltage of the signal SIG1 is the medium level voltage VM. In addition, in a case where the signals SA1 and SA2 are "0, 1", the signals ST1, ST2, ST3, and ST4 are "0, 1, 0, 1". In this case, the voltage of the signal SIG1 is the low level voltage VL. In addition, in a case where the signals SA1 and SA2 are "1, 0", the signals ST1, ST2, ST3, and ST4 are "1, 0, 1, 0". In this case, the voltage of the signal SIG1 is the high level voltage VH.

This configuration makes it possible to decrease the number of circuit stages of the generation circuit 161 (FIG. 24) according to the present modification example as compared with that of the embodiment (FIG. 5) described above.

Modification Example 1-4

In the embodiment described above, the flip-flop section 71 is configured by using, for example, the four flip-flops 91 to 94 as illustrated in FIG. 5. It is possible to configure each of the flip-flops 91 to 94 by using, for example, a so-called TSPC (True Signal Phase Clock) circuit. The following describes a configuration example of the flip-flop 91.

FIG. 28 illustrates a configuration example of the flip-flop 91. The flip-flop 91 includes an inverter IV11 and transistors MN11 to MN15 and MP11 to MP14. Each of the transistors MN11 to MN15 is an N-type MOS transistor and each of the transistors MP11 to MP14 is a P-type MOS transistor.

The input terminal of the inverter IV11 is coupled to the input terminal DI of the flip-flop 91 and the output terminal thereof is coupled to the gates of the transistors MN11 and MP12. The gate of the transistor MP11 is coupled to the clock input terminal CM of the flip-flop 91, the source thereof is supplied with a power supply voltage VDD, and the drain thereof is coupled to the source of the transistor MP12. The gate of the transistor MP12 is coupled to the output terminal of the inverter IV11, the source thereof is coupled to the drain of the transistor MP11, and the drain thereof is coupled to the drain of the transistor MN11 and the gate of the transistor MN12. The gate of the transistor MN11 is coupled to the output terminal of the inverter IV11, the drain thereof is coupled to the drain of the transistor MP12 and the gate of the transistor MN12, and the source thereof is grounded. The gate of the transistor MP13 is coupled to the clock input terminal CKI of the flip-flop 91, the source thereof is supplied with the power supply voltage VDD, and the drain thereof is coupled to the drain of the transistor MN12 and the gates of the transistors MP14 and MN15. The gate of the transistor MN12 is coupled to the drains of the transistors MP12 and MN11, the drain thereof is coupled to the drain of the transistor MP13 and the gates of the transistors MP14 and MN15, and the source thereof is coupled to the drain of the transistor MN13. The gate of the transistor MN13 is coupled to the clock input terminal CKI of the flip-flop 91, the drain thereof is coupled to the source of the transistor MN12, and the source thereof is grounded.

The gate of the transistor MP14 is coupled to the gate of the transistor MN15 and the drains of the transistors MP13 and MN12, the source thereof is supplied with the power supply voltage VDD, and the drain thereof is coupled to the drain of the transistor MN14 and the output terminal DO of the flip-flop 91. The gate of the transistor MN14 is coupled to the clock input terminal CKI of the flip-flop 91, the drain thereof is coupled to the drain of the transistor MP14 and the output terminal DO of the flip-flop 91, and the source thereof is coupled to the drain of the transistor MN15. The gate of the transistor MN15 is coupled to the gate of the transistor MP14 and the drains of the transistors MP13 and MN12, the drain thereof is coupled to the source of the transistor MN14, and the source thereof is grounded.

The generation circuit 161 (FIG. 24) according to the modification example 1-3 may be configured by using such a TSPC circuit.

FIG. 29 illustrates a configuration example of the flip-flop 164 in the generation circuit 161. The same applies to the flip-flop 165. The flip-flop 164 includes a non-logical conjunction circuit ND2. The first input terminal of the non-logical conjunction circuit ND2 is coupled to the first input terminal DI1 of the flip-flop 164, the second input terminal thereof is coupled to the second input terminal DI2 of the flip-flop 164, and the output terminal thereof is coupled to the gates of the transistors MP12 and MN11.

FIG. 30 illustrates a configuration example of the flip-flop 166 in the generation circuit 161. The same applies to the flip-flop 167. The flip-flop 166 includes a non-logical disjunction circuit NR2. The first input terminal of the non-logical disjunction circuit NR2 is coupled to the first input terminal DI1 of the flip-flop 166, the second input terminal thereof is coupled to the second input terminal DI2 of the flip-flop 166, and the output terminal thereof is coupled to the gates of the transistors MP12 and MN11.

Modification Example 1-5

In the embodiment described above, the generation circuit 61 and the flip-flop section 71 are each provided with the four flip-flops 91 to 94 as illustrated in FIG. 5, but this is not limitative. The following describes the present modification example.

FIG. 31 illustrates a configuration example of a generation circuit 171 according to the present modification example. The generation circuit 171 corresponds to the generation circuit 61 and the flip-flop section 71 according to the embodiment described above. The generation circuit 171 includes a non-logical conjunction circuit 172 and two flip-flops 173 and 174.

The first input terminal of the non-logical conjunction circuit 172 is coupled to the input terminal A1 of the generation circuit 171, the second input terminal thereof is coupled to the input terminal A2 of the generation circuit 171, and the output terminal thereof is coupled to the second input terminal of the flip-flop 173 and the first input terminal of the flip-flop 174. The first input terminal of the flip-flop 173 is coupled to the input terminal A1 of the generation circuit 171, the second input terminal thereof is coupled to the output terminal of the non-logical conjunction circuit 172, the first output terminal thereof is coupled to the selector 101, and the second output terminal thereof is coupled to the selector 102. The first input terminal of the flip-flop 174 is coupled to the output terminal of the non-logical conjunction circuit 172, the second input terminal thereof is coupled to the input terminal A2 of the generation circuit 171, the first output terminal thereof is coupled to the selector 103, and the second output terminal thereof is coupled to the selector 104.

FIG. 32 illustrates a configuration example of the flip-flop 173. The same applies to the flip-flop 174. The flip-flop 173 includes inverters IV21 to IV26, a non-logical conjunction circuit ND23, and transistors MN21 to MN23 and MP21 to MP23. Each of the transistors MN21 to MN23 is an N-type MOS transistor and each of the transistors MP21 to MP23 is a P-type MOS transistor.

The input terminal of the inverter IV21 is coupled to the clock input terminal CKI of the flip-flop 173 and the output terminal thereof is coupled to the input terminal of the inverter IV22, the gates of the transistors MN21, MP22, and MN23, and the inversion control terminal of the inverter IV24. The input terminal of the inverter IV22 is coupled to the output terminal of the inverter IV21, the gates of the transistors MN21, MP22, and MN23, and the inversion control terminal of the inverter IV24 and the output terminal thereof is coupled to the gates of the transistors MP21, MN22, and MP23 and the control terminal of the inverter IV24. The first input terminal of the non-logical conjunction circuit ND23 is coupled to the first input terminal DI1 of the flip-flop 173, the second input terminal thereof is coupled to the second input terminal DI2 of the flip-flop 173, and the output terminal thereof is coupled to the sources of the transistors MN21 and MP21. The gate of the transistor MN21 is coupled to the output terminal of the inverter IV21, the source thereof is coupled to the source of the transistor MP21 and the output terminal of a non-logical conjunction circuit ND3, and the drain thereof is coupled to the drain of the transistor MP21, the input terminal of the inverter IV23, the output terminal of the inverter IV24, and the sources of the transistors MN23 and MP23. The input terminal of the inverter IV23 is coupled to the drains of the transistors MN21 and MP21, the output terminal of the inverter IV24, and the sources of the transistors MN23 and MP23 and the output terminal thereof is coupled to the input terminal of the inverter IV24 and the sources of the transistors MN22 and MP22. The input terminal of the inverter IV24 is coupled to the output terminal of the inverter IV23 and the sources of the transistors MN22 and MP22, the output terminal thereof is coupled to the input terminal of the inverter IV23, the drains of the transistors MN21 and MP21, and the sources of the transistors MN23 and MP23, the control terminal thereof is coupled to the output terminal of the inverter IV22, and the inversion control terminal thereof is coupled to the output terminal of the inverter IV21. The gate of the transistor MN22 is coupled to the output terminal of the inverter IV22, the source thereof is coupled to the source of the transistor MP22, the output terminal of the inverter IV23, and the input terminal of the inverter IV24, and the drain thereof is coupled to the drain of the transistor MP22, the input terminal of the inverter IV25, the output terminal of the inverter IV26, and a second output terminal DO2 of the flip-flop 173. The gate of the transistor MP22 is coupled to the output terminal of the inverter IV21, the source thereof is coupled to the source of the transistor MN22, the output terminal of the inverter IV23, and the input terminal of the inverter IV24, and the drain thereof is coupled to the drain of the transistor MN22, the input terminal of the inverter IV25, the output terminal of the inverter IV26, and the second output terminal DO2 of the flip-flop 173. The gate of the transistor MN23 is coupled to the output terminal of the inverter IV21, the source thereof is coupled to the source of the transistor MP23, the output terminal of the inverter IV24, the input terminal of the inverter IV23, and the drains of the transistors MN21 and MP21, and the drain thereof is coupled to the drain of the transistor MP23, the input terminal of the inverter IV26, the output terminal of the inverter IV25, and a first output terminal DO1 of the flip-flop 173. The gate of the transistor MP23 is coupled to the output terminal of the inverter IV22, the source thereof is coupled to the source of the transistor MN23, the output terminal of the inverter IV24, the input terminal of the inverter IV23, and the drains of the transistors MN21 and MP21, and the drain thereof is coupled to the drain of the transistor MN23, the input terminal of the inverter IV26, the output terminal of the inverter IV25, and the first output terminal DO1 of the flip-flop 173. The input terminal of the inverter IV25 is coupled to the drains of the transistors MN22 and MP22, the output terminal of the inverter IV26, and the second output terminal DO2 of the flip-flop 173 and the output terminal thereof is coupled to the input terminal of the inverter IV26, the drains of the transistors MN23 and MP23, and the first output terminal DO1 of the flip-flop 173. The input terminal of the inverter IV26 is coupled to the drains of the transistors MN23 and MP23, the output terminal of the inverter IV25, and the first output terminal DO1 of the flip-flop 173 and the output terminal thereof is coupled to the input terminal of the inverter IV25, the drains of the transistors MN22 and MP22, and the second output terminal DO2 of the flip-flop 173.

This configuration makes it possible to decrease the number of flip-flops in the generation circuit 171 (FIG. 31) according to the present modification example as compared with that of the embodiment (FIG. 5) described above and simplify the configuration of the generation circuit 171.

Modification Example 1-6

In the embodiment described above, the transmitter 1 has the operation mode M1 for transmitting data by using a differential signal and the operation mode M2 for transmitting data by using a three-phase signal, but this is not limitative. For example, the transmitter 1 may further have an operation mode (an operation mode M3) for transmitting data by using a single-phase signal. The following describes a transmitter 1A according to the present modification example in detail. The transmitter 1A includes a processing unit 10A and a transmission unit 20A as with the transmitter 1 (FIG. 1) according to the embodiment described above.

The processing unit 10A is configured to generate the six sets of parallel signals DATA1 to DATA6 by performing a predetermined process as with the processing unit 10 (FIG. 1) according to the embodiment described above. The processing unit 10A includes the processing circuit 11 and exchange circuits 12A and 13A.

The exchange circuit 12A does not exchange the parallel signal DT2 and the parallel signal DT3 with each other, but outputs the parallel signal DT2 and the parallel signal DT3 as they are in a case where the operation mode M is the operation mode M1 (the differential mode) or the operation mode M3 (a single-phase mode). This causes the processing unit 10A to output the parallel signal DT2 as the parallel signal DATA2 and output the parallel signal DT3 as the parallel signal DATA3. In addition, the exchange circuit 12A exchanges the parallel signal DT2 and the parallel signal DT3 with each other in a case where the operation mode M is the operation mode M2 (the three-phase mode). This causes the processing unit 10A to output the parallel signal DT3 as the parallel signal DATA2 and output the parallel signal DT2 as the parallel signal DATA3.

Similarly, the exchange circuit 13A does not exchange the parallel signal DT5 and the parallel signal DT6 with each other, but outputs the parallel signal DT5 and the parallel signal DT6 as they are in a case where the operation mode M is the operation mode M1 (the differential mode) or the operation mode M3 (the single-phase mode). This causes the processing unit 10A to output the parallel signal DT5 as the parallel signal DATA5 and output the parallel signal DT6 as the parallel signal DATA6. In addition, the exchange circuit 13A exchanges the parallel signal DT5 and the parallel signal DT6 with each other in a case where the operation mode M is the operation mode M2 (the three-phase mode). This causes the processing unit 10A to output the parallel signal DT6 as the parallel signal DATA5 and output the parallel signal DT5 as the parallel signal DATA6.

The transmission unit 20A is configured to generate the signals SIG1 to SIG6 on the basis of the parallel signals DATA1 to DATA6 and the mode control signal MSEL and respectively output these signals SIG1 to SIG6 from the output terminals Tout1 to Tout6 as with the transmission unit 20 according to the embodiment described above.

FIG. 33 illustrates a configuration example of the transmission unit 20A. The transmission unit 20A includes selectors 36, 46, and 56 and a control section 29A. The control signal MSW is set to the low level ("0") in the operation mode M1 (the differential mode) and the operation mode M3 (the single-phase mode) and is set to the high level ("1") in the operation mode M2 (the three-phase mode). A control signal MSW2 is set to the low level ("0") in the operation mode M1 (the differential mode) and the operation mode M2 (the three-phase mode) and is set to the high level ("1") in the operation mode M3 (the single-phase mode).

The selector 36 is configured to select one of the signals P33 and N33 on the basis of the control signal MSW2 and output the selected signal. Specifically, in a case where the control signal MSW2 is at the low level ("0"), the selector 36 selects the signal N33. In a case where the control signal MSW2 is at the high level ("1"), the selector 36 selects the signal P33. Similarly, the selector 46 is configured to select one of the signals P43 and N43 on the basis of the control signal MSW2 and output the selected signal. The selector 56 is configured to select one of the signals P53 and N53 on the basis of the control signal MSW2 and output the selected signal.

The control section 29A is configured to select one of the three operation modes M1 to M3 on the basis of the mode control signal MSEL and control the transmission unit 20A to cause the transmission unit 20A to operate in the selected operation mode. The control section 29A generates the clock signal CLK, the control signals MSW, MSW2, and SEL, and the voltage V1 in accordance with the selected operation mode.

FIG. 34 illustrates a configuration example of a communication system 6 in a case where the transmitter 1A operates in the operation mode M3 (the single-phase mode). The communication system 6 includes the transmitter 1A and a receiver 230. The receiver 230 includes input units 231 to 236. In the operation mode M3, the output section DRV1 transmits the signal SIG1 as a single-phase signal and the input unit 231 receives this signal SIG1. The same applies to the signals SIG2 to SIG6.

FIG. 35 illustrates a configuration example of the input unit 231. It is to be noted that the following describes the input unit 231 as an example, but the same applies to the input units 232 to 236. The input unit 231 includes a resistor 238 and an amplifier 239. The resistor 238 functions as a terminating resistor of the communication system 6 and the resistance value is about 50[Ω] in this example. One end of the resistor 238 is coupled to an input terminal Tin31 or the like and the other end thereof is supplied with a bias voltage V2. The positive input terminal of the amplifier 239 is coupled to the one end of the resistor 238 and the input terminal Tin31 and the negative input terminal thereof is supplied with a bias voltage V3.

This configuration allows the communication system 6 to transmit and receive data by using single-phase signals.

Here, the selector 34 corresponds to a specific example of the "fourth output control circuit" according to the present disclosure. Each of the selectors 35 and 36 corresponds to a specific example of the "fifth output control circuit" according to the present disclosure. The operation mode M3 corresponds to a specific example of a "third operation mode" according to the present disclosure.

In the operation mode M1 (the differential mode) and the operation mode M2 (the three-phase mode), the selector 36 of the transmission unit 20A selects the signal N33, the selector 46 selects the signal N43, and the selector 56 selects the signal N53. This causes the transmission unit 20A to operate in the operation mode M1 (the differential mode) in a manner similar to the case (FIGS. 15A, 15B, and 16) of the embodiment described above and operate in the operation mode M2 (the three-phase mode) in a manner similar to the case (FIG. 17) of the embodiment described above.

FIG. 36 illustrates an operation example of the transmission unit 20A in the operation mode M3. In the operation mode M3, the transmission unit 20A transmits data to the receiver by using a single-phase signal.

In the operation mode M3, the control section 29A generates the clock signal CLK, the control signal MSW at the low level ("0"), the control signal MSW2 at the high level ("1"), and the control signal SEL at a predetermined level.

The serializers SER1 to SER6 respectively generate the serial signals S1 to S6 by serializing the parallel signals DATA1 to DATA6 on the basis of the clock signal CLK.

The control signal MSW is at the low level ("0"). This causes the distribution circuit 21 to supply the serial signal S1 to the flip-flop 31, causes the distribution circuit 22 to supply the serial signal S2 to the flip-flop 32, causes the distribution circuit 23 to supply the serial signal S3 to the flip-flop 41, causes the distribution circuit 24 to supply the serial signal S4 to the flip-flop 42, causes the distribution circuit 25 to supply the serial signal S5 to the flip-flop 51, and causes the distribution circuit 26 to supply the serial signal S6 to the flip-flop 52.

The flip-flop 31 samples an output signal (the serial signal S1) of the distribution circuit 21 on the basis of the clock signal CLK, outputs the sampled signal as the signal P31, and outputs an inverted signal of the signal P31 as the signal N31. The selector 34 generates the signal S34 by selecting the signal P31 on the basis of the control signal SEL.

The control signal MSW is at the low level ("0") and the output section DRV1 thus generates the signal SIG1 on the basis of the signal S34. Specifically, the output section DRV1 sets the voltage of the signal SIG1 to the high level voltage VH in a case where the signal P34 included in the signal S34 is at the high level and the signal N34 is at the low level. The output section DRV1 sets the voltage of the signal SIG1 to the low level voltage VL in a case where the signal P34 included in the signal S34 is at the low level and the signal N34 is at the high level. In this way, the transmission unit 20A transmits the signal SIG1 as a single-phase signal.

The flip-flop 32 samples an output signal (the serial signal S2) of the distribution circuit 22 on the basis of the clock signal CLK and outputs the sampled signal. The latch 33 latches an output signal of the flip-flop 32 on the basis of the clock signal CLK, outputs the latched signal as the signal P33, and outputs an inverted signal of the signal P33 as the signal N33. The selector 36 selects the signal P33 on the basis of the control signal MSW2. The selector 35 generates the signal S35 on the basis of the signal P33 selected by the selector 36 on the basis of the control signal SEL. The output section DRV2 generates the signal SIG2 on the basis of the signal S35. In this way, the transmission unit 20A transmits the signal SIG2 as a single-phase signal.

The above has described the signals SIG1 and SIG2 as an example, but the same applies to the signals SIG3 to SIG6.

In this way, in the operation mode M3, the transmitter 1A transmits data to the receiver by using a single-phase signal.

Modification Example 1-7

In the embodiment described above, the transmitter 1 has a plurality of operation modes, but this is not limitative. In place of this, for example, a plurality of operation modes is not provided, but the transmitter 1 may be configured to transmit data by using a three-phase signal. The following describes a transmitter 1B according to the present modification example in detail.

FIG. 37 illustrates a configuration example of the transmitter 1B. The transmitter 1B includes a processing unit 10B and a transmission unit 20B.

The processing unit 10B is configured to generate the six sets of parallel signals DATA1 to DATA6 by performing a predetermined process as with the processing unit 10 according to the embodiment described above. The processing unit 10B includes exchange circuits 12B and 13B. The exchange circuit 12B is configured to exchange the parallel signal DT2 and the parallel signal DT3 with each other. This causes the processing unit 10B to output the parallel signal DT3 as the parallel signal DATA2 and output the parallel signal DT2 as the parallel signal DATA3. Similarly, the exchange circuit 13B is configured to exchange the parallel signal DT5 and the parallel signal DT6 with each other. This causes the processing unit 10B to output the parallel signal DT6 as the parallel signal DATA5 and output the parallel signal DT5 as the parallel signal DATA6.

The transmission unit 20B is configured to generate the signals SIG1 to SIG6 on the basis of the parallel signals DATA1 to DATA6 and respectively output these signals SIG1 to SIG6 from the output terminals Tout1 to Tout6. The transmission unit 20B transmits data to the receiver by using a three-phase signal.

FIG. 38 illustrates a configuration example of the transmission unit 20B.

The transmission unit 20B includes the serializers SER1 to SER6, the generation circuits 61 to 66, the flip-flop (F/F) sections 71 to 76, output sections DRV1B to DRV6B, and a control section 29B.

The serializer SER1 is configured to serialize the parallel signal DATA1 on the basis of the clock signal CLK to generate the serial signal S1 and supply this serial signal S1 to each of the generation circuits 61 and 62. The serializer SER2 is configured to serialize the parallel signal DATA2 on the basis of the clock signal CLK to generate the serial signal S2 and supply this serial signal S2 to each of the generation circuits 61 and 63. The serializer SER3 is configured to serialize the parallel signal DATA3 on the basis of the clock signal CLK to generate the serial signal S3 and supply this serial signal S3 to each of the generation circuits 62 and 63. The serializer SER4 is configured to serialize the parallel signal DATA4 on the basis of the clock signal CLK to generate the serial signal S4 and supply this serial signal S4 to each of the generation circuits 64 and 65. The serializer SER5 is configured to serialize the parallel signal DATA5 on the basis of the clock signal CLK to generate the serial signal S5 and supply this serial signal S5 to each of the generation circuits 64 and 66. The serializer SER6 is configured to serialize the parallel signal DATA6 on the basis of the clock signal CLK to generate the serial signal S6 and supply this serial signal S6 to each of the generation circuits 65 and 66.

The generation circuit 61 is configured to generate four signals on the basis of the serial signal S1 and the serial signal S2. The input terminal A1 of the generation circuit 61 is coupled to the serializer SER1 and the input terminal A2 thereof is coupled to the serializer SER2. The flip-flop section 71 is configured to sample the four signals outputted from the generation circuit 61 on the basis of the clock signal CLK and output the signal S71 including the four sampled signals.

The generation circuit 62 is configured to generate four signals on the basis of the serial signal S3 and the serial signal S1. The input terminal A1 of the generation circuit 62 is coupled to the serializer SER3 and the input terminal A2 thereof is coupled to the serializer SER1. The flip-flop section 72 is configured to sample the four signals outputted from the generation circuit 62 on the basis of the clock signal CLK and output the signal S72 including the four sampled signals.

The generation circuit 63 is configured to generate four signals on the basis of the serial signal S2 and the serial signal S3. The input terminal A1 of the generation circuit 63 is coupled to the serializer SER2 and the input terminal A2 thereof is coupled to the serializer SER3. The flip-flop section 73 is configured to sample the four signals outputted from the generation circuit 63 on the basis of the clock signal CLK and output the signal S73 including the four sampled signals.

The generation circuit 64 is configured to generate four signals on the basis of the serial signal S4 and the serial signal S5. The input terminal A1 of the generation circuit 64 is coupled to the serializer SER4 and the input terminal A2 thereof is coupled to the serializer SER5. The flip-flop section 74 is configured to sample the four signals outputted from the generation circuit 64 on the basis of the clock signal CLK and output the signal S74 including the four sampled signals.

The generation circuit 65 is configured to generate four signals on the basis of the serial signal S6 and the serial signal S4. The input terminal A1 of the generation circuit 65 is coupled to the serializer SER6 and the input terminal A2 thereof is coupled to the serializer SER4. The flip-flop section 75 is configured to sample the four signals outputted from the generation circuit 65 on the basis of the clock signal CLK and output the signal S75 including the four sampled signals.

The generation circuit 66 is configured to generate four signals on the basis of the serial signal S5 and the serial signal S6. The input terminal A1 of the generation circuit 66 is coupled to the serializer SER5 and the input terminal A2 thereof is coupled to the serializer SER6. The flip-flop section 76 is configured to sample the four signals outputted from the generation circuit 66 on the basis of the clock signal CLK and output the signal S76 including the four sampled signals.

The output section DRV1B is configured to set the voltage of the output terminal Tout1 on the basis of the signal S71 outputted from the flip-flop section 71. The output section DRV2B is configured to set the voltage of the output terminal Tout2 on the basis of the signal S72 outputted from the flip-flop section 72. The output section DRV3B is configured to set the voltage of the output terminal Tout3 on the basis of the signal S73 outputted from the flip-flop section 73. The output section DRV4B is configured to set the voltage of the output terminal Tout4 on the basis of the signal S74 outputted from the flip-flop section 74. The output section DRV5B is configured to set the voltage of the output terminal Tout5 on the basis of the signal S75 outputted from the flip-flop section 75. The output section DRV6B is configured to set the voltage of the output terminal Tout6 on the basis of the signal S76 outputted from the flip-flop section 76.

FIG. 39 illustrates a configuration example of the output section DRV1B. FIG. 39 illustrates even the generation circuit 61 and the flip-flop section 71 for the sake of explanation. The output section DRV1B includes the transistors 111, 114, 115, and 118 and the resistors 112, 113, 116, and 117. The output section DRV1B is obtained by omitting the selectors 101 to 104 from the output section DRV1 (FIG. 5) according to the embodiment described above. The same applies to the output sections DRV2B to DRV6B.

The control section 29B (FIG. 38) is configured to control the transmission unit 20B. The control section 29B generates the clock signal CLK and the voltage V1.

Modification Example 1-8

In the embodiment described above, the transmission unit 20 is provided with the six output sections DRV1 to DRV6, but this is not limitative. Alternatively, for example, as in a transmission unit 20C illustrated in FIG. 40, the four output sections DRV1 to DRV4 may be provided. This transmission unit 20C is obtained by omitting the serializers SER5 and SER6, the generation circuits 64 to 66, the flip-flop sections 74 to 76, the flip-flops 51 and 52, the latch 53, the selectors 54 and 55, and the output sections DRV5 and DRV6 from the transmission unit 20 (FIG. 3) according to the embodiment described above. In this example, all of the four signals included in the signal S74 to be supplied to the output section DRV4 are set to "0". According to this configuration, the transmission unit 20C includes the signals SIG1 and SIG2 in a differential signal and the signals SIG3 and SIG4 in a differential signal in the operation mode M1. In addition, the signals SIG1 to SIG3 are included in a three-phase signal in the operation mode M2.

In addition, for example, as in a transmission unit 20D illustrated in FIG. 41, the three output sections DRV1 to DRV3 may be provided. This transmission unit 20D is obtained by omitting the serializers SER4 to SER6, the generation circuits 64 to 66, the flip-flop sections 74 to 76, the flip-flops 41 and 42, the latch 43, the selectors 44 and 45, the flip-flops 51 and 52, the latch 53, the selectors 54 and 55, and the output sections DRV4 to DRV6 from the transmission unit 20 (FIG. 3) according to the embodiment described above. In this example, all of the two signals included in the signal S44 to be supplied to the output section DRV3 are set to "0". According to this configuration, the transmission unit 20D includes the signals SIG1 and SIG2 in a differential signal in the operation mode M1. In addition, the signals SIG1 to SIG3 are included in a three-phase signal in the operation mode M2.

Modification Example 1-9

In the embodiment described above, the transmission unit 20 is provided with the six serializers SER1 to SER6 and the distribution circuits 21 to 26 distribute output signals of the serializers SER1 to SER6, but this is not limitative. The following describes a transmission unit 20E according to the present modification example in detail.

FIG. 42 illustrates a configuration example of the transmission unit 20E. The transmission unit 20E includes distribution circuits 131 to 136, serializers SER11 to SER16, and serializers SER21 to 26.

The distribution circuit 131 is configured to selectively supply the parallel signal DATA1 to the serializer SER21 or the serializer SER11 on the basis of the control signal MSW. In a case where the control signal MSW is at the high level ("1"), the distribution circuit 131 supplies the parallel signal DATA1 to the serializer SER11. In a case where the control signal MSW is at the low level ("0"), the distribution circuit 131 supplies the parallel signal DATA1 to the serializer SER21. Similarly, the distribution circuit 132 is configured to selectively supply the parallel signal DATA2 to the serializer SER22 or the serializer SER12 on the basis of the control signal MSW. The distribution circuit 133 is configured to selectively supply the parallel signal DATA3 to the serializer SER23 or the serializer SER13 on the basis of the control signal MSW. The distribution circuit 134 is configured to selectively supply the parallel signal DATA4 to the serializer SER24 or the serializer SER14 on the basis of the control signal MSW. The distribution circuit 135 is configured to selectively supply the parallel signal DATA5 to the serializer SER25 or the serializer SER15 on the basis of the control signal MSW. The distribution circuit 136 is configured to selectively supply the parallel signal DATA6 to the serializer SER26 or the serializer SER16 on the basis of the control signal MSW.

The serializer SER21 is configured to serialize an output signal (the parallel signal DATA1) of the distribution circuit 131 on the basis of the clock signal CLK to generate a serial signal and supply the generated serial signal to each of the generation circuits 61 and 62 in the operation mode M2. The serializer SER22 is configured to serialize an output signal (the parallel signal DATA2) of the distribution circuit 132 on the basis of the clock signal CLK to generate a serial signal and supply the generated serial signal to each of the generation circuits 61 and 63 in the operation mode M2. The serializer SER23 is configured to serialize an output signal (the parallel signal DATA3) of the distribution circuit 133 on the basis of the clock signal CLK to generate a serial signal and supply the generated serial signal to each of the generation circuits 62 and 63 in the operation mode M2. The serializer SER24 is configured to serialize an output signal (the parallel signal DATA4) of the distribution circuit 134 on the basis of the clock signal CLK to generate a serial signal and supply the generated serial signal to each of the generation circuits 64 and 65 in the operation mode M2. The serializer SER25 is configured to serialize an output signal (the parallel signal DATA5) of the distribution circuit 135 on the basis of the clock signal CLK to generate a serial signal and supply the generated serial signal to each of the generation circuits 64 and 66 in the operation mode M2. The serializer SER26 is configured to serialize an output signal (the parallel signal DATA6) of the distribution circuit 136 on the basis of the clock signal CLK to generate a serial signal and supply the generated serial signal to each of the generation circuits 65 and 66 in the operation mode M2.

The serializer SER11 is configured to serialize an output signal (the parallel signal DATA1) of the distribution circuit 131 on the basis of the clock signal CLK to generate a serial signal and supply the generated serial signal to the flip-flop 31 in the operation mode M1. The serializer SER12 is configured to serialize an output signal (the parallel signal DATA2) of the distribution circuit 132 on the basis of the clock signal CLK to generate a serial signal and supply the generated serial signal to the flip-flop 32 in the operation mode M1. The serializer SER13 is configured to serialize an output signal (the parallel signal DATA3) of the distribution circuit 133 on the basis of the clock signal CLK to generate a serial signal and supply the generated serial signal to the flip-flop 41 in the operation mode M1. The serializer SER14 is configured to serialize an output signal (the parallel signal DATA4) of the distribution circuit 134 on the basis of the clock signal CLK to generate a serial signal and supply the generated serial signal to the flip-flop 42 in the operation mode M1. The serializer SER15 is configured to serialize an output signal (the parallel signal DATA5) of the distribution circuit 135 on the basis of the clock signal CLK to generate a serial signal and supply the generated serial signal to the flip-flop 51 in the operation mode M1. The serializer SER16 is configured to serialize an output signal (the parallel signal DATA6) of the distribution circuit 136 on the basis of the clock signal CLK to generate a serial signal and supply the generated serial signal to the flip-flop 52 in the operation mode M1.

Here, the serializer SER21 corresponds to a specific example of the "first serializer" according to the present disclosure. The serializer SER22 corresponds to the specific example of a "second serializer" according to the present disclosure. The serializer SER23 corresponds to a specific example of the "third serializer" according to the present disclosure. The serializer SER11 corresponds to a specific example of a "fourth serializer" according to the present disclosure. The serializer SER12 corresponds to a specific example of a "fifth serializer" according to the present disclosure. A serial signal outputted from the serializer SER21 corresponds to a specific example of a "first serial signal" according to the present disclosure. A serial signal outputted from the serializer SER22 corresponds to a specific example of the "second serial signal" according to the present disclosure. A serial signal outputted from the serializer SER23 corresponds to a specific example of the "third serial signal" according to the present disclosure. A serial signal outputted from the serializer SER11 corresponds to a specific example of a "fourth serial signal" according to the present disclosure. A serial signal outputted from the serializer SER12 corresponds to a specific example of a "fifth serial signal" according to the present disclosure. The operation mode M2 corresponds to a specific example of the "first operation mode" according to the present disclosure. The operation mode M1 corresponds to a specific example of the "second operation mode" according to the present disclosure.

Other Modification Examples

In addition, two or more of these modification examples may be combined.

2. Second Embodiment

Next, a transmitter 300 according to a second embodiment is described. The transmitter 300 according to the present embodiment is configured to communicate with a variety of receivers that have different orders of input terminals. It is to be noted that the same sign is attached to a component that is substantially the same as that of the transmitter 1 according to the first embodiment described above and the description thereof is appropriately omitted.

Each of FIGS. 43A to 43F illustrates a configuration example of a communication system 3 to which the transmitter 300 is applied. The communication system 3 is configured to perform communication by using a three-phase signal. The communication system 3 includes the transmitter 300 and a receiver 400. The transmitter 300 transmits the signals SIG1 to SIG3 to the receiver 400 as a three-phase signal and the receiver 400 receives these signals SIG1 to SIG3.

The transmitter 300 and the receiver 400 are supplied from a variety of vendors. This may cause the order of the output terminals Tout1, Tout2, and Tout3 of the transmitter 300 to be different from the order of the input terminals Tin21, Tin22, and Tin23 of the receiver 400 as illustrated in FIGS. 43A to 43F.

In a communication system 2A illustrated in FIG. 43A, a receiver 400A has input terminals arranged in the order of the input terminals Tin21, Tin22, and Tin23. In this case, the output terminal Tout1 of the transmitter 300 is coupled to the input terminal Tin21 of the receiver 400A through the transmission line 201. The output terminal Tout2 of the transmitter 300 is coupled to the input terminal Tin22 of the receiver 400A through the transmission line 202. The output terminal Tout3 of the transmitter 300 is coupled to the input terminal Tin23 of the receiver 400A through the transmission line 203.

In a communication system 2B illustrated in FIG. 43B, a receiver 400B has input terminals arranged in the order of the input terminals Tin21, Tin23, and Tin22. In this case, the output terminal Tout1 of the transmitter 300 is coupled to the input terminal Tin21 of the receiver 400B through the transmission line 201. The output terminal Tout2 of the transmitter 300 is coupled to the input terminal Tin23 of the receiver 400B through the transmission line 202. The output terminal Tout3 of the transmitter 300 is coupled to the input terminal Tin22 of the receiver 400B through the transmission line 203.

In a communication system 2C illustrated in FIG. 43C, a receiver 400C has input terminals arranged in the order of the input terminals Tin22, Tin21, and Tin23. In this case, the output terminal Tout1 of the transmitter 300 is coupled to the input terminal Tin22 of the receiver 400C through the transmission line 201. The output terminal Tout2 of the transmitter 300 is coupled to the input terminal Tin21 of the receiver 400C through the transmission line 202. The output terminal Tout3 of the transmitter 300 is coupled to the input terminal Tin23 of the receiver 400C through the transmission line 203.

In a communication system 2D illustrated in FIG. 43D, a receiver 400D has input terminals arranged in the order of the input terminals Tin22, Tin23, and Tin21. In this case, the output terminal Tout1 of the transmitter 300 is coupled to the input terminal Tin22 of the receiver 400D through the transmission line 201. The output terminal Tout2 of the transmitter 300 is coupled to the input terminal Tin23 of the receiver 400D through the transmission line 202. The output terminal Tout3 of the transmitter 300 is coupled to the input terminal Tin21 of the receiver 400D through the transmission line 203.

In a communication system 2E illustrated in FIG. 43E, a receiver 400E has input terminals arranged in the order of the input terminals Tin23, Tin21, and Tin22. In this case, the output terminal Tout1 of the transmitter 300 is coupled to the input terminal Tin23 of the receiver 400E through the transmission line 201. The output terminal Tout2 of the transmitter 300 is coupled to the input terminal Tin21 of the receiver 400E through the transmission line 202. The output terminal Tout3 of the transmitter 300 is coupled to the input terminal Tin22 of the receiver 400E through the transmission line 203.

In a communication system 2F illustrated in FIG. 43F, a receiver 400F has input terminals arranged in the order of the input terminals Tin23, Tin22, and Tin21. In this case, the output terminal Tout1 of the transmitter 300 is coupled to the input terminal Tin23 of the receiver 400F through the transmission line 201. The output terminal Tout2 of the transmitter 300 is coupled to the input terminal Tin22 of the receiver 400F through the transmission line 202. The output terminal Tout3 of the transmitter 300 is coupled to the input terminal Tin21 of the receiver 400F through the transmission line 203.

The transmitter 300 is configured to exchange signal patterns between the signals SIG1, SIG2, and SIG3. This allows a communication system 2 to prevent wiring lines, for example, between the transmitter 300 and the receiver 400 from intersecting.

FIG. 44 illustrates a configuration example of the transmitter 300. The transmitter 300 includes a processing unit 310 and a transmission unit 320.

The processing unit 310 is configured to generate the three sets of parallel signals DATA1 to DATA3 by performing a predetermined process. Each of the parallel signals DATA1 to DATA3 is a signal having a bit width of up to eight bits in this example. The processing unit 310 includes a processing circuit 311, an exchange circuit 312, and an exchange circuit 313.

The processing circuit 311 is configured to generate three sets of parallel signals DT11 to DT13 by performing a predetermined process. Each of the parallel signals DT11 to DT13 is a signal having a bit width of up to eight bits in this example as with each of the three sets of parallel signals DATA1 to DATA3.

The exchange circuit 312 is configured to exchange the parallel signal DT2 and the parallel signal DT3 with each other, output the parallel signal DT3 as a parallel signal DT2A, and output the parallel signal DT2 as a parallel signal DT3A as with the exchange circuit 12 according to the first embodiment described above.

The exchange circuit 313 is configured to exchange the parallel signals DT1, DT2A, and DT3A on the basis of a mode control signal MSEL2. The mode control signal MSEL2 is a signal corresponding to the order of the input terminals Tin21, Tin22, and Tin23 in the receiver 400.

FIG. 45 illustrates an operation example of the exchange circuit 312. The exchange circuit 312 has six operation modes MA to MF.

In a case where the input terminals of the receiver 400 are arranged in the order of the input terminals Tin21, Tin22, and Tin23 (FIG. 43A), the operation mode is set to an operation mode MA. In this case, the exchange circuit 313 outputs the parallel signal DT1 as the parallel signal DATA1, outputs the parallel signal DT2A as the parallel signal DATA2, and outputs the parallel signal DT3A as the parallel signal DATA3.

In a case where the input terminals of the receiver 400 are arranged in the order of the input terminals Tin21, Tin23, and Tin22 (FIG. 43B), the operation mode is set to an operation mode MB. In this case, the exchange circuit 313 outputs an inverted signal of the parallel signal DT3A as the parallel signal DATA1, outputs an inverted signal of the parallel signal DT1 as the parallel signal DATA2, and outputs an inverted signal of the parallel signal DT2A as the parallel signal DATA3.

In a case where the input terminals of the receiver 400 are arranged in the order of the input terminals Tin22, Tin21, and Tin23 (FIG. 43C), the operation mode is set to an operation mode MC. In this case, the exchange circuit 313 outputs an inverted signal of the parallel signal DT1 as the parallel signal DATA1, outputs an inverted signal of the parallel signal DT2A as the parallel signal DATA2, and outputs an inverted signal of the parallel signal DT3A as the parallel signal DATA3.

In a case where the input terminals of the receiver 400 are arranged in the order of the input terminals Tin22, Tin23, and Tin21 (FIG. 43D), the operation mode is set to an operation mode MD. In this case, the exchange circuit 313 outputs the parallel signal DT2A as the parallel signal DATA1, outputs the parallel signal DT1 as the parallel signal DATA2, and outputs the parallel signal DT3A as the parallel signal DATA3.

In a case where the input terminals of the receiver 400 are arranged in the order of the input terminals Tin23, Tin21, and Tin22 (FIG. 43E), the operation mode is set to an operation mode ME. In this case, the exchange circuit 313 outputs the parallel signal DT3A as the parallel signal DATA1, outputs the parallel signal DT2A as the parallel signal DATA2, and outputs the parallel signal DT1 as the parallel signal DATA3.

In a case where the input terminals of the receiver 400 are arranged in the order of the input terminals Tin23, Tin22, and Tin21 (FIG. 43F), the operation mode is set to an operation mode MF. In this case, the exchange circuit 313 outputs an inverted signal of the parallel signal DT2A as the parallel signal DATA1, outputs an inverted signal of the parallel signal DT3A as the parallel signal DATA2, and outputs an inverted signal of the parallel signal DT1 as the parallel signal DATA3.

The transmission unit 320 (FIG. 44) is configured to generate the signals SIG1 to SIG3 on the basis of the parallel signals DATA1 to DATA3 and respectively output these signals SIG1 to SIG3 from the output terminals Tout1 to Tout3.

FIG. 46 illustrates a configuration example of the transmission unit 320. The transmission unit 320 includes the serializers SER1 to SER3, the generation circuits 61 to 63, the flip-flop (F/F) sections 71 to 76, the output sections DRV1B to DRV6B, and the control section 29B.

The serializer SER1 is configured to serialize the parallel signal DATA1 on the basis of the clock signal CLK to generate the serial signal S1 and supply this serial signal S1 to each of the generation circuits 61 and 62. The serializer SER2 is configured to serialize the parallel signal DATA2 on the basis of the clock signal CLK to generate the serial signal S2 and supply this serial signal S2 to each of the generation circuits 61 and 63. The serializer SER3 is configured to serialize the parallel signal DATA3 on the basis of the clock signal CLK to generate the serial signal S3 and supply this serial signal S3 to each of the generation circuits 62 and 63.

The generation circuit 61 is configured to generate four signals on the basis of the serial signal S1 and the serial signal S2. The input terminal A1 of the generation circuit 61 is coupled to the serializer SER1 and the input terminal A2 thereof is coupled to the serializer SER2. The flip-flop section 71 is configured to sample the four signals outputted from the generation circuit 61 on the basis of the clock signal CLK and output the signal S71 including the four sampled signals.

The generation circuit 62 is configured to generate four signals on the basis of the serial signal S3 and the serial signal S1. The input terminal A1 of the generation circuit 62 is coupled to the serializer SER3 and the input terminal A2 thereof is coupled to the serializer SER1. The flip-flop section 72 is configured to sample the four signals outputted from the generation circuit 62 on the basis of the clock signal CLK and output the signal S72 including the four sampled signals.

The generation circuit 63 is configured to generate four signals on the basis of the serial signal S2 and the serial signal S3. The input terminal A1 of the generation circuit 63 is coupled to the serializer SER2 and the input terminal A2 thereof is coupled to the serializer SER3. The flip-flop section 73 is configured to sample the four signals outputted from the generation circuit 63 on the basis of the clock signal CLK and output the signal S73 including the four sampled signals.

The output section DRV1B is configured to set the voltage of the output terminal Tout1 on the basis of the signal S71 outputted from the flip-flop section 71. The output section DRV2B is configured to set the voltage of the output terminal Tout2 on the basis of the signal S72 outputted from the flip-flop section 72. The output section DRV3B is configured to set the voltage of the output terminal Tout3 on the basis of the signal S73 outputted from the flip-flop section 73.

The control section 29B is configured to control the transmission unit 320.

The control section 29B generates the clock signal CLK and the voltage V1.

The transmission unit 320 has the serializers SER1, SER2, and SER3 disposed in this order and has the generation circuits 61, 62, and 63 disposed in this order as with the transmission unit 20 (FIG. 14) according to the first embodiment described above. There is provided a wiring region between the serializers SER1 to SER3 and the generation circuits 61 to 63. In this wiring region, signals are transmitted from the serializer SER1 to the generation circuits 61 and 62, signals are transmitted from the serializer SER2 to the generation circuits 61 and 63, and signals are transmitted from the serializer SER3 to the generation circuits 62 and 63.

FIG. 47 illustrates an operation example of the communication system 2. In this example, the processing circuit 311 indicates an operation in a case where the respective corresponding three bits included in the parallel signals DT1, DT2, and DT3 are set to "1, 0, 0". In other words, as illustrated in FIG. 7, the transmitter 300 is about to transmit the symbol "+x".

The exchange circuit 312 exchanges the parallel signal DT2 and the parallel signal DT3 with each other. This causes the parallel signals DT1, DT2A, and DT3A to include "1, 0, 0".

In the communication system 2A (the operation mode MA), the exchange circuit 313 outputs the parallel signal DT1 as the parallel signal DATA1, outputs the parallel signal DT2A as the parallel signal DATA2, and outputs the parallel signal DT3A as the parallel signal DATA3 as illustrated in FIG. 45. The parallel signals DATA1, DATA2, and DATA3 therefore include "1, 0, 0". Therefore, the serial signals S1, S2, and S3 generated by the serializers SER1, SER2, and SER3 similarly include "1, 0, 0". In this case, as illustrated in FIG. 7, the voltages of the output terminals Tout1, Tout2, and Tout3 of the transmitter 300 are set to "VH, VL, VM". As illustrated in FIG. 43A, in the operation mode MA, the output terminals Tout1, Tout2, and Tout3 of the transmitter 300 are respectively coupled to the input terminals Tin21, Tin22, and Tin23 of the receiver 400A. This causes the voltages of the input terminals Tin21, Tin22, and Tin23 of the receiver 400A to be "VH, VL, VM". In this way, the receiver 400A receives the symbol "+x".

In the communication system 2B (the operation mode MB), the exchange circuit 313 outputs an inverted signal of the parallel signal DT3A as the parallel signal DATA1, outputs an inverted signal of the parallel signal DT1 as the parallel signal DATA2, and outputs an inverted signal of the parallel signal DT2A as the parallel signal DATA3 as illustrated in FIG. 45. The parallel signals DATA1, DATA2, and DATA3 therefore include "1, 0, 1". Therefore, the serial signals S1, S2, and S3 generated by the serializers SER1, SER2, and SER3 similarly include "1, 0, 1". In this case, as illustrated in FIG. 7, the voltages of the output terminals Tout1, Tout2, and Tout3 of the transmitter 300 are set to "VH, VM, VL". As illustrated in FIG. 43B, in the operation mode MB, the output terminals Tout1, Tout2, and Tout3 of the transmitter 300 are respectively coupled to the input terminals Tin21, Tin23, and Tin22 of the receiver 400B. This causes the voltages of the input terminals Tin21, Tin22, and Tin23 of the receiver 400B to be "VH, VL, VM". In this way, the receiver 400B receives the symbol "+x".

In the communication system 2C (the operation mode MC), the exchange circuit 313 outputs an inverted signal of the parallel signal DT1 as the parallel signal DATA1, outputs an inverted signal of the parallel signal DT2A as the parallel signal DATA2, and outputs an inverted signal of the parallel signal DT3A as the parallel signal DATA3 as illustrated in FIG. 45. The parallel signals DATA1, DATA2, and DATA3 therefore include "0, 1, 1". Therefore, the serial signals S1, S2, and S3 generated by the serializers SER1, SER2, and SER3 similarly include "0, 1, 1". In this case, as illustrated in FIG. 7, the voltages of the output terminals Tout1, Tout2, and Tout3 of the transmitter 300 are set to "VL, VH, VM". As illustrated in FIG. 43C, in the operation mode MC, the output terminals Tout1, Tout2, and Tout3 of the transmitter 300 are respectively coupled to the input terminals Tin22, Tin21, and Tin23 of the receiver 400C. This causes the voltages of the input terminals Tin21, Tin22, and Tin23 of the receiver 400C to be "VH, VL, VM". In this way, the receiver 400C receives the symbol "+x".

In the communication system 2D (the operation mode MD), the exchange circuit 313 outputs the parallel signal DT2A as the parallel signal DATA1, outputs the parallel signal DT1 as the parallel signal DATA2, and outputs the parallel signal DT3A as the parallel signal DATA3 as illustrated in FIG. 45. The parallel signals DATA1, DATA2, and DATA3 therefore include "0, 1, 0". Therefore, the serial signals S1, S2, and S3 generated by the serializers SER1, SER2, and SER3 similarly include "0, 1, 0". In this case, as illustrated in FIG. 7, the voltages of the output terminals Tout1, Tout2, and Tout3 of the transmitter 300 are set to "VL, VM, VH". As illustrated in FIG. 43D, in the operation mode MD, the output terminals Tout1, Tout2, and Tout3 of the transmitter 300 are respectively coupled to the input terminals Tin22, Tin23, and Tin21 of the receiver 400D. This causes the voltages of the input terminals Tin21, Tin22, and Tin23 of the receiver 400D to be "VH, VL, VM". In this way, the receiver 400D receives the symbol "+x".

In the communication system 2E (the operation mode ME), the exchange circuit 313 outputs the parallel signal DT3A as the parallel signal DATA1, outputs the parallel signal DT2A as the parallel signal DATA2, and outputs the parallel signal DT1 as the parallel signal DATA3 as illustrated in FIG. 45. The parallel signals DATA1, DATA2, and DATA3 therefore include "0, 0, 1". Therefore, the serial signals S1, S2, and S3 generated by the serializers SER1, SER2, and SER3 similarly include "0, 0, 1". In this case, as illustrated in FIG. 7, the voltages of the output terminals Tout1, Tout2, and Tout3 of the transmitter 300 are set to "VM, VH, VL". As illustrated in FIG. 43E, in the operation mode ME, the output terminals Tout1, Tout2, and Tout3 of the transmitter 300 are respectively coupled to the input terminals Tin23, Tin21, and Tin22 of the receiver 400E. This causes the voltages of the input terminals Tin21, Tin22, and Tin23 of the receiver 400E to be "VH, VL, VM". In this way, the receiver 400E receives the symbol "+x".

In the communication system 2F (the operation mode MF), the exchange circuit 313 outputs an inverted signal of the parallel signal DT2A as the parallel signal DATA1, outputs an inverted signal of the parallel signal DT3A as the parallel signal DATA2, and outputs an inverted signal of the parallel signal DT1 as the parallel signal DATA3 as illustrated in FIG. 45. The parallel signals DATA1, DATA2, and DATA3 therefore include "1, 1, 0". Therefore, the serial signals S1, S2, and S3 generated by the serializers SER1, SER2, and SER3 similarly include "1, 1, 0". In this case, as illustrated in FIG. 7, the voltages of the output terminals Tout1, Tout2, and Tout3 of the transmitter 300 are set to "VM, VL, VH". As illustrated in FIG. 43F, in the operation mode MC, the output terminals Tout1, Tout2, and Tout3 of the transmitter 300 are respectively coupled to the input terminals Tin23, Tin22, and Tin21 of the receiver 400F. This causes the voltages of the input terminals Tin21, Tin22, and Tin23 of the receiver 400F to be "VH, VL, VM". In this way, the receiver 400F receives the symbol "+x".

In this way, the receiver 400 is able to receive the symbol "+x" even in a case of any of the communication systems 2A to 2F.

The transmitter 300 is provided with the exchange circuit 312 and exchanges the parallel signals DT11 to DT13 in accordance with the operation mode. This allows the transmitter 300 to exchange signal patterns between the signals SIG1, SIG2, and SIG3. This allows the communication system 2 to perform communication with no wiring lines intersecting between the transmitter 300 and the receiver 400. In the communication system 2, no wiring lines intersect in this way. For example, this makes it possible to reduce the possibility of the deterioration of waveform quality. It is thus possible to increase the symbol rate.

As described above, in the present embodiment, the exchange circuit 312 is provided and parallel signals are exchanged in accordance with the operation mode. This makes it possible to perform communication with no wiring lines intersecting between the transmitter and the receiver. It is thus possible to increase the symbol rate. The other effects are similar to those of the first embodiment described above.

3. Application Example

Next, an application example of the transmitter described in any of the embodiments and the modification examples described above is described.

FIG. 48 illustrates the appearance of a smartphone 700 (a multifunctional mobile phone) to which the transmitter according to any of the embodiments and the like described above is applied. This smartphone 700 may be mounted with a variety of devices. In a communication system that exchanges data between those devices, the transmitter according to any of the embodiments and the like described above is applied.

FIG. 49 illustrates a configuration example of an application processor 710 used for the smartphone 700. The application processor 710 includes CPU (Central Processing Unit) 711, a memory control unit 712, a power supply control unit 713, an external interface 714, GPU (Graphics Processing Unit) 715, a media processing unit 716, a display control unit 717, and an MIPI (Mobile Industry Processor Interface) interface 718. In this example, the CPU 711, the memory control unit 712, the power supply control unit 713, the external interface 714, the GPU 715, the media processing unit 716, and the display control unit 717 are coupled to a system bus 719 and it is possible to exchange data in between through this system bus 719.

The CPU 711 processes various kinds of information handled in the smartphone 700 in accordance with a program. The memory control unit 712 controls a memory 901 to be used for the CPU 711 to perform information processing. The power supply control unit 713 controls the power supply of the smartphone 700.

The external interface 714 is an interface for communication with an external device and is coupled to a wireless communication unit 902 and an image sensor 810 in this example. The wireless communication unit 902 wirelessly communicates with a base station of mobile phones and includes, for example, a baseband section, an RF (Radio Frequency) front end section, and the like. The image sensor 810 acquires an image and includes, for example, a CMOS sensor.

The GPU 715 performs image processing. The media processing unit 716 processes information such as sound, text, and graphics. The display control unit 717 controls a display 904 through the MIPI interface 718. The MIPI interface 718 transmits an image signal to the display 904. It is possible to use, for example, a YUV-format signal, an RGB-format signal, or the like as the image signal. For example, the transmitter according to any of the embodiments and the like described above is applied to this MIPI interface 718.

FIG. 50 illustrates a configuration example of the image sensor 810. The image sensor 810 include a sensor unit 811, ISP (Image Signal Processor) 812, a JPEG (Joint Photographic Experts Group) encoder 813, CPU 814, and RAM (Random Access Memory) 815, ROM (Read Only Memory) 816, power supply control unit 817, an I²C (Inter-Integrated Circuit) interface 818, and an MIPI interface 819. In this example, these respective blocks are coupled to a system bus 820 and it is possible to exchange data in between through this system bus 820.

The sensor unit 811 acquires an image and includes, for example, a CMOS sensor. The ISP 812 performs a predetermined process on the image acquired by the sensor unit 811. The JPEG encoder 813 encodes the image processed by the ISP 812 and generates a JPEG image. The CPU 814 controls each of the blocks of the image sensor 810 in accordance with a program. The RAM 815 is a memory to be used for the CPU 814 to perform information processing. The ROM 816 stores the program executed by the CPU 814. The power supply control unit 817 controls the power supply of the image sensor 810. The I²C interface 818 receives a control signal from the application processor 710. In addition, although not illustrated, the image sensor 810 also receives a clock signal in addition to a control signal from the application processor 710. Specifically, the image sensor 810 is configured to operate on the basis of clock signals having a variety of frequencies. The MIPI interface 819 transmits an image signal to the application processor 710. It is possible to use, for example, a YUV-format signal, an RGB-format signal, or the like as the image signal. For example, the transmitter according to any of the embodiments and the like described above is applied to this MIPI interface 819.

Although the present technology has been described above with reference to several embodiments and modification examples, a specific practical application example thereof and an example of application to an electronic apparatus, the present technology is not limited to these embodiments and the like. It is possible to make a variety of modifications.

For example, in the embodiment described above, the output section DRV1 sets the voltage of the output terminal Tout1 to the medium level voltage VM by turning on one of the transistors 111 and 115 and turning on one of the transistors 114 and 118, but this is not limitative. In place of this, for example, all of the transistors 111, 114, 115, and 118 may be turned off. In this case, for example, the output impedance of the output section DRV1 enters a high-impedance state. This sets the voltage of the output terminal Tout1 to the medium level voltage VM through the terminating resistor in the receiver.

It is to be noted that the effects described in this specification are merely illustrative, but not limited. In addition, other effects may be included.

It is to be noted that the present technology may be configured as follows. The present technology having the following configurations makes it possible to increase the symbol rate.

(1)

A transmitter including:

a first serializer configured to generate a first serial signal;

a second serializer configured to generate a second serial signal;

a third serializer configured to generate a third serial signal;

a first output section configured to set a voltage of a first output terminal to any of a first voltage, a second voltage, and a third voltage between the first voltage and the second voltage;

a first output control circuit configured to control an operation of the first output section on the basis of the first serial signal and the second serial signal;

a second output section configured to set a voltage of a second output terminal to any of the first voltage, the second voltage, and the third voltage;

a second output control circuit configured to control an operation of the second output section on the basis of the third serial signal and the first serial signal;

a third output section configured to set a voltage of a third output terminal to any of the first voltage, the second voltage, and the third voltage; and a third output control circuit configured to control an operation of the third output section on the basis of the second serial signal and the third serial signal, in which the first serializer, the second serializer, and the third serializer are disposed in this order on a semiconductor substrate, and the first output control circuit, the second output control circuit, and the third output control circuit are disposed in this order on the semiconductor substrate.

(2)

The transmitter according to (1), in which the first output control circuit is configured to control the operation of the first output section to cause the first output section to set the voltage of the first output terminal to the third voltage in a case where the first serial signal and the second serial signal are equal to each other, the second output control circuit is configured to control the operation of the second output section to cause the second output section to set the voltage of the second output terminal to the third voltage in a case where the third serial signal and the first serial signal are equal to each other, and the third output control circuit is configured to control the operation of the third output section to cause the third output section to set the voltage of the third output terminal to the third voltage in a case where the second serial signal and the third serial signal are equal to each other.

(3)

The transmitter according to (1) or (2), in which the first output control circuit is configured to control the operation of the first output section to cause the first output section to set the voltage of the first output terminal to the first voltage in a case where the first serial signal indicates first logic and the second serial signal indicates second logic and cause the first output section to set the voltage of the first output terminal to the second voltage in a case where the first serial signal indicates the second logic and the second serial signal indicates the first logic, the second output control circuit is configured to control the operation of the second output section to cause the second output section to set the voltage of the second output terminal to the first voltage in a case where the third serial signal indicates the first logic and the first serial signal indicates the second logic and cause the second output section to set the voltage of the second output terminal to the second voltage in a case where the third serial signal indicates the second logic and the first serial signal indicates the first logic, and the third output control circuit is configured to control the operation of the third output section to cause the third output section to set the voltage of the third output terminal to the first voltage in a case where the second serial signal indicates the first logic and the third serial signal indicates the second logic and cause the third output section to set the voltage of the third output terminal to the second voltage in a case where the second serial signal indicates the second logic and the third serial signal indicates the first logic.

(4)

The transmitter according to any of (1) to (3), in which the first output section includes a first switch including a first terminal and a second terminal, the first terminal being guided to a first power supply node, the second terminal being guided to the first output terminal, a second switch including a first terminal and a second terminal, the first terminal being guided to a second power supply node, the second terminal being guided to the first output terminal, a third switch including a first terminal and a second terminal, the first terminal being guided to the first power supply node, the second terminal being guided to the first output terminal, and a fourth switch including a first terminal and a second terminal, the first terminal being guided to the second power supply node, the second terminal being guided to the first output terminal, the first output section is configured to set the voltage of the first output terminal to the first voltage by turning on the first switch and the third switch and turning off the second switch and the fourth switch, the first output section is configured to set the voltage of the first output terminal to the second voltage by turning on the second switch and the fourth switch and turning off the first switch and the third switch, and the first output section is configured to set the voltage of the first output terminal to the third voltage by turning on one of the first switch and the third switch and turning off another of the first switch and the third switch and turning on one of the second switch and the fourth switch and turning off another of the second switch and the fourth switch.

(5)

The transmitter according to any of (1) to (4), including:

a fourth output control circuit configured to control the operation of the first output section on the basis of the first serial signal and the second serial signal; and a fifth output control circuit configured to control the operation of the second output section on the basis of an inverted signal of the first serial signal and an inverted signal of the second serial signal, in which the transmitter is configured to operate in one of a plurality of operation modes including a first operation mode and a second operation mode, the first output section is configured to set the voltage of the first output terminal to any of the first voltage, the second voltage, and the third voltage in the first operation mode and is configured to set the voltage of the first output terminal to a fourth voltage or a fifth voltage in the second operation mode, the second output section is configured to set the voltage of the second output terminal to any of the first voltage, the second voltage, and the third voltage in the first operation mode and is configured to set the voltage of the second output terminal to the fourth voltage or the fifth voltage in the second operation mode, the third output section is configured to set the voltage of the third output terminal to any of the first voltage, the second voltage, and the third voltage in the first operation mode, the first output control circuit is configured to control the operation of the first output section in the first operation mode, the second output control circuit is configured to control the operation of the second output section in the first operation mode, the third output control circuit is configured to control the operation of the third output section in the first operation mode, the fourth output control circuit is configured to control the operation of the first output section in the second operation mode, and the fifth output control circuit is configured to control the operation of the second output section in the second operation mode.

(6)

The transmitter according (5), in which the fourth output control circuit includes a first selector configured to alternately select the first serial signal and the second serial signal, the fifth output control circuit includes a second selector configured to select the inverted signal of the first serial signal in a case where the first selector selects the first serial signal and configured to select the inverted signal of the second serial signal in a case where the first selector selects the second serial signal, the first output section is configured to selectively set the voltage of the first output terminal to the fourth voltage or the fifth voltage on the basis of a signal selected by the first selector, and the second output section is configured to selectively set the voltage of the second output terminal to the fourth voltage or the fifth voltage on the basis of a signal selected by the second selector.

(7)

The transmitter according to (5) or (6), in which
the first output section includes
- a first switch including a first terminal and a second terminal, the first terminal being guided to a first power supply node, the second terminal being guided to the first output terminal,
- a second switch including a first terminal and a second terminal, the first terminal being guided to a second power supply node, the second terminal being guided to the first output terminal,
- a third switch including a first terminal and a second terminal, the first terminal being guided to the first power supply node, the second terminal being guided to the first output terminal, and
- a fourth switch including a first terminal and a second terminal, the first terminal being guided to the second power supply node, the second terminal being guided to the first output terminal, the first output section is configured to set the voltage of the first output terminal to the fourth voltage by turning on the first switch and the third switch and turning off the second switch and the fourth switch, and the first output section is configured to set the voltage of the first output terminal to the fifth voltage by turning on the second switch and the fourth switch and turning off the first switch and the third switch.

(8)

The transmitter according to any of (5) to (7), in which
the fifth output control circuit is configured to control the operation of the second output section on the basis of an inverted signal of the first serial signal, an inverted signal of the second serial signal, and the second serial signal, the plurality of operation modes further includes a third operation mode, the first output section is configured to set the voltage of the first output terminal to a sixth voltage or a seventh voltage in the third operation mode, the second output section is configured to set the voltage of the second output terminal to the sixth voltage or the seventh voltage in the third operation mode, the fourth output control circuit is configured to control the operation of the first output section in the third operation mode on the basis of the first serial signal, and the fifth output control circuit is configured to control the operation of the second output section in the third operation mode on the basis of the second serial signal.

(9)

The transmitter according to any of (5) to (8), further including a processing unit configured to generate a first transmission parallel signal, a second transmission parallel signal, and a third transmission parallel signal, in which
the processing unit includes
- a first processing circuit configured to generate a first parallel signal, a second parallel signal, and a third parallel signal and configured to output the first parallel signal as the first transmission parallel signal, and
- a second processing circuit configured to output the second parallel signal as the third transmission parallel signal and output the third parallel signal as the second transmission parallel signal in the first operation mode and configured to output the second parallel signal as the second transmission parallel signal and output the third parallel signal as the third transmission parallel signal in the second operation mode, the first serializer is configured to generate the first serial signal on the basis of the first transmission parallel signal, the second serializer is configured to generate the second serial signal on the basis of the second transmission parallel signal, and the third serializer is configured to generate the third serial signal on the basis of the third transmission parallel signal.

(10)

The transmitter according to any of (1) to (9), further including a processing unit configured to generate a first transmission parallel signal, a second transmission parallel signal, and a third transmission parallel signal and configured to change a number of bits of each of the first transmission parallel signal, the second transmission parallel signal, and the third transmission parallel signal, in which the first serializer is configured to generate the first serial signal on the basis of the first transmission parallel signal, the second serializer is configured to generate the second serial signal on the basis of the second transmission parallel signal, and the third serializer is configured to generate the third serial signal on the basis of the third transmission parallel signal.

(11)

The transmitter according to any of (1) to (10), in which
the first serializer includes
- a plurality of serializers, and
- a selector configured to generate the first serial signal by sequentially selecting signals outputted from the plurality of serializers.

(12)

The transmitter according to any of (1) to (11), further including a processing unit configured to generate a first transmission parallel signal, a second transmission parallel signal, and a third transmission parallel signal, in which
the processing unit includes
- a third processing circuit configured to generate a first parallel signal, a second parallel signal, and a third parallel signal, and
- a fourth processing circuit configured to generate the first transmission parallel signal, the second transmission parallel signal, and the third transmission parallel signal by performing one of a first process and a second process, the first process being for exchanging the first parallel signal, the second parallel signal, and the third parallel signal, the second process being for exchanging an inverted signal of the first parallel signal, an inverted signal of the second parallel signal, and an inverted signal of the third parallel signal, the first serializer is configured to generate the first serial signal on the basis of the first transmission parallel signal, the second serializer is configured to generate the second serial signal on the basis of the second transmission parallel signal, and the third serializer is configured to generate the third serial signal on the basis of the third transmission parallel signal.

(13)

The transmitter according to any of (1) to (4), including:
a fourth serializer configured to generate a fourth serial signal;
a fifth serializer configured to generate a fifth serial signal;
a fourth output control circuit configured to control the operation of the first output section on the basis of the fourth serial signal and the fifth serial signal; and
a fifth output control circuit configured to control the operation of the second output section on the basis of an inverted signal of the fourth serial signal and an inverted signal of the fifth serial signal, in which the transmitter is configured to operate in one of a plurality of operation modes including a first operation mode and a second operation mode, the first output section is configured to set the voltage of the first output terminal to any of the first voltage, the second voltage, and the third voltage in the first operation mode and is configured to set the voltage of the first output terminal to a fourth voltage or a fifth voltage in the second operation mode, the second output section is configured to set the voltage of the second output terminal to any of the first voltage, the second voltage, and the third voltage in the first operation mode and is configured to set the voltage of the second output terminal to the fourth voltage or the fifth voltage in the second operation mode, the third output section is configured to set the voltage of the third output terminal to any of the first voltage, the second voltage, and the third voltage in the first operation mode, the first output control circuit is configured to control the operation of the first output section in the first operation mode, the second output control circuit is configured to control the operation of the second output section in the first operation mode, the third output control circuit is configured to control the operation of the third output section in the first operation mode, the fourth output control circuit is configured to control the operation of the first output section in the second operation mode, and the fifth output control circuit is configured to control the operation of the second output section in the second operation mode.

(13)
A communication system including:
a transmitter; and
a receiver configured to receive a signal transmitted from the transmitter, in which
the transmitter includes
a first serializer configured to generate a first serial signal,
a second serializer configured to generate a second serial signal,
a third serializer configured to generate a third serial signal,
a first output section configured to set a voltage of a first output terminal to any of a first voltage, a second voltage, and a third voltage between the first voltage and the second voltage,
a first output control circuit configured to control an operation of the first output section on the basis of the first serial signal and the second serial signal, a second output section configured to set a voltage of a second output terminal to any of the first voltage, the second voltage, and the third voltage,
a second output control circuit configured to control an operation of the second output section on the basis of the third serial signal and the first serial signal,
a third output section configured to set a voltage of a third output terminal to any of the first voltage, the second voltage, and the third voltage, and
a third output control circuit configured to control an operation of the third output section on the basis of the second serial signal and the third serial signal,
the first serializer, the second serializer, and the third serializer are disposed in this order on a semiconductor substrate, and the first output control circuit, the second output control circuit, and the third output control circuit are disposed in this order on the semiconductor substrate.

The present application claims the priority on the basis of Japanese Patent Application No. 2019-099922 filed on May 29, 2019 with Japan Patent Office, the entire contents of which are incorporated in the present application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A transmitter comprising:
a first serializer configured to generate a first serial signal;
a second serializer configured to generate a second serial signal;
a third serializer configured to generate a third serial signal;
a first output section configured to set a voltage of a first output terminal to any of a first voltage, a second voltage, and a third voltage between the first voltage and the second voltage;
a first output control circuit configured to control an operation of the first output section on a basis of the first serial signal and the second serial signal;
a second output section configured to set a voltage of a second output terminal to any of the first voltage, the second voltage, and the third voltage;
a second output control circuit configured to control an operation of the second output section on a basis of the third serial signal and the first serial signal;
a third output section configured to set a voltage of a third output terminal to any of the first voltage, the second voltage, and the third voltage; and
a third output control circuit configured to control an operation of the third output section on a basis of the second serial signal and the third serial signal, wherein
the first serializer, the second serializer, and the third serializer are disposed in this order on a semiconductor substrate, and
the first output control circuit, the second output control circuit, and the third output control circuit are disposed in this order on the semiconductor substrate.

2. The transmitter according to claim 1, wherein
the first output control circuit is configured to control the operation of the first output section to cause the first output section to set the voltage of the first output terminal to the third voltage in a case where the first serial signal and the second serial signal are equal to each other,
the second output control circuit is configured to control the operation of the second output section to cause the second output section to set the voltage of the second output terminal to the third voltage in a case where the third serial signal and the first serial signal are equal to each other, and
the third output control circuit is configured to control the operation of the third output section to cause the third output section to set the voltage of the third output terminal to the third voltage in a case where the second serial signal and the third serial signal are equal to each other.

3. The transmitter according to claim 1, wherein
the first output control circuit is configured to control the operation of the first output section to cause the first output section to set the voltage of the first output terminal to the first voltage in a case where the first serial signal indicates first logic and the second serial signal indicates second logic and cause the first output section to set the voltage of the first output terminal to the second voltage in a case where the first serial signal indicates the second logic and the second serial signal indicates the first logic, the second output control circuit is configured to control the operation of the second output section to cause the second output section to set the voltage of the second output terminal to the first voltage in a case where the third serial signal indicates the first logic and the first serial signal indicates the second logic and cause the second output section to set the voltage of the second output terminal to the second voltage in a case where the third serial signal indicates the second logic and the first serial signal indicates the first logic, and the third output control circuit is configured to control the operation of the third output section to cause the third output section to set the voltage of the third output terminal to the first voltage in a case where the second serial signal indicates the first logic and the third serial signal indicates the second logic and cause the third output section to set the voltage of the third output terminal to the second voltage in a case where the second serial signal indicates the second logic and the third serial signal indicates the first logic.

4. The transmitter according to claim 1, wherein
the first output section includes
  a first switch including a first terminal and a second terminal, the first terminal being guided to a first power supply node, the second terminal being guided to the first output terminal,
  a second switch including a first terminal and a second terminal, the first terminal being guided to a second power supply node, the second terminal being guided to the first output terminal,
  a third switch including a first terminal and a second terminal, the first terminal being guided to the first power supply node, the second terminal being guided to the first output terminal, and
  a fourth switch including a first terminal and a second terminal, the first terminal being guided to the second power supply node, the second terminal being guided to the first output terminal,
the first output section is configured to set the voltage of the first output terminal to the first voltage by turning on the first switch and the third switch and turning off the second switch and the fourth switch,
the first output section is configured to set the voltage of the first output terminal to the second voltage by turning on the second switch and the fourth switch and turning off the first switch and the third switch, and
the first output section is configured to set the voltage of the first output terminal to the third voltage by turning on one of the first switch and the third switch and turning off another of the first switch and the third switch and turning on one of the second switch and the fourth switch and turning off another of the second switch and the fourth switch.

5. The transmitter according to claim 1, comprising:
a fourth output control circuit configured to control the operation of the first output section on the basis of the first serial signal and the second serial signal; and
a fifth output control circuit configured to control the operation of the second output section on a basis of an inverted signal of the first serial signal and an inverted signal of the second serial signal, wherein the transmitter is configured to operate in one of a plurality of operation modes including a first operation mode and a second operation mode, the first output section is configured to set the voltage of the first output terminal to any of the first voltage, the second voltage, and the third voltage in the first operation mode and is configured to set the voltage of the first output terminal to a fourth voltage or a fifth voltage in the second operation mode, the second output section is configured to set the voltage of the second output terminal to any of the first voltage, the second voltage, and the third voltage in the first operation mode and is configured to set the voltage of the second output terminal to the fourth voltage or the fifth voltage in the second operation mode, the third output section is configured to set the voltage of the third output terminal to any of the first voltage, the second voltage, and the third voltage in the first operation mode, the first output control circuit is configured to control the operation of the first output section in the first operation mode, the second output control circuit is configured to control the operation of the second output section in the first operation mode, the third output control circuit is configured to control the operation of the third output section in the first operation mode, the fourth output control circuit is configured to control the operation of the first output section in the second operation mode, and the fifth output control circuit is configured to control the operation of the second output section in the second operation mode.

6. The transmitter according claim 5, wherein
the fourth output control circuit includes a first selector configured to alternately select the first serial signal and the second serial signal,
the fifth output control circuit includes a second selector configured to select the inverted signal of the first serial signal in a case where the first selector selects the first serial signal and configured to select the inverted signal of the second serial signal in a case where the first selector selects the second serial signal,
the first output section is configured to selectively set the voltage of the first output terminal to the fourth voltage or the fifth voltage on a basis of a signal selected by the first selector, and
the second output section is configured to selectively set the voltage of the second output terminal to the fourth voltage or the fifth voltage on a basis of a signal selected by the second selector.

7. The transmitter according to claim 5, wherein
the first output section includes
  a first switch including a first terminal and a second terminal, the first terminal being guided to a first power supply node, the second terminal being guided to the first output terminal,
  a second switch including a first terminal and a second terminal, the first terminal being guided to a second power supply node, the second terminal being guided to the first output terminal,
  a third switch including a first terminal and a second terminal, the first terminal being guided to the first power supply node, the second terminal being guided to the first output terminal, and a fourth switch including a first terminal and a second terminal, the first terminal being guided to the second power supply node, the second terminal being guided to the first output terminal, the first output section is configured to set the voltage of the first output terminal to the fourth voltage by turning on the first switch and the third switch and turning off the second switch and the fourth switch, and the first output section is configured to set the voltage of the first output terminal to the fifth voltage by turning on the second switch and the fourth switch and turning off the first switch and the third switch.

8. The transmitter according to claim 5, wherein the fifth output control circuit is configured to control the operation of the second output section on a basis of an inverted signal of the first serial signal, an inverted signal of the second serial signal, and the second serial signal, the plurality of operation modes further includes a third operation mode, the first output section is configured to set the voltage of the first output terminal to a sixth voltage or a seventh voltage in the third operation mode, the second output section is configured to set the voltage of the second output terminal to the sixth voltage or the seventh voltage in the third operation mode, the fourth output control circuit is configured to control the operation of the first output section in the third operation mode on a basis of the first serial signal, and the fifth output control circuit is configured to control the operation of the second output section in the third operation mode on a basis of the second serial signal.

9. The transmitter according to claim 5, further comprising a processing unit configured to generate a first transmission parallel signal, a second transmission parallel signal, and a third transmission parallel signal, wherein the processing unit includes a first processing circuit configured to generate a first parallel signal, a second parallel signal, and a third parallel signal and configured to output the first parallel signal as the first transmission parallel signal, and a second processing circuit configured to output the second parallel signal as the third transmission parallel signal and output the third parallel signal as the second transmission parallel signal in the first operation mode and configured to output the second parallel signal as the second transmission parallel signal and output the third parallel signal as the third transmission parallel signal in the second operation mode, the first serializer is configured to generate the first serial signal on a basis of the first transmission parallel signal, the second serializer is configured to generate the second serial signal on a basis of the second transmission parallel signal, and the third serializer is configured to generate the third serial signal on a basis of the third transmission parallel signal.

10. The transmitter according to claim 1, further comprising a processing unit configured to generate a first transmission parallel signal, a second transmission parallel signal, a third transmission parallel signal and configured to change a number of bits of each of the first transmission parallel signal, the second transmission parallel signal, and the third transmission parallel signal, wherein the first serializer is configured to generate the first serial signal on a basis of the first transmission parallel signal, the second serializer is configured to generate the second serial signal on a basis of the second transmission parallel signal, and the third serializer is configured to generate the third serial signal on a basis of the third transmission parallel signal.

11. The transmitter according to claim 1, wherein the first serializer includes a plurality of serializers, and a selector configured to generate the first serial signal by sequentially selecting signals outputted from the plurality of serializers.

12. The transmitter according to claim 1, further comprising a processing unit configured to generate a first transmission parallel signal, a second transmission parallel signal, and a third transmission parallel signal, wherein the processing unit includes a third processing circuit configured to generate a first parallel signal, a second parallel signal, and a third parallel signal, and a fourth processing circuit configured to generate the first transmission parallel signal, the second transmission parallel signal, and the third transmission parallel signal by performing one of a first process and a second process, the first process being for exchanging the first parallel signal, the second parallel signal, and the third parallel signal, the second process being for exchanging an inverted signal of the first parallel signal, an inverted signal of the second parallel signal, and an inverted signal of the third parallel signal, the first serializer is configured to generate the first serial signal on a basis of the first transmission parallel signal, the second serializer is configured to generate the second serial signal on a basis of the second transmission parallel signal, and the third serializer is configured to generate the third serial signal on a basis of the third transmission parallel signal.

13. The transmitter according to claim 1, comprising:

a fourth serializer configured to generate a fourth serial signal;

a fifth serializer configured to generate a fifth serial signal;

a fourth output control circuit configured to control the operation of the first output section on a basis of the fourth serial signal and the fifth serial signal; and a fifth output control circuit configured to control the operation of the second output section on a basis of an inverted signal of the fourth serial signal and an inverted signal of the fifth serial signal, wherein the transmitter is configured to operate in one of a plurality of operation modes including a first operation mode and a second operation mode, the first output section is configured to set the voltage of the first output terminal to any of the first voltage, the second voltage, and the third voltage in the first operation mode and is configured to set the voltage of the first output terminal to a fourth voltage or a fifth voltage in the second operation mode, the second output section is configured to set the voltage of the second output terminal to any of the first voltage, the second voltage, and the third voltage in the first operation mode and is configured to set the voltage of the second output terminal to the fourth voltage or the fifth voltage in the second operation mode, the third output section is configured to set the voltage of the third output terminal to any of the first voltage, the second voltage, and the third voltage in the first operation mode, the first output control circuit is configured to control the operation of the first output section in the first operation mode, the second output control circuit is configured to control the operation of the second output section in the first operation mode, the third output control circuit is configured to control the operation of the third output section in the first operation mode, the fourth output control circuit is configured to control the operation of the first output section in the second operation mode, and the fifth output control circuit is configured to control the operation of the second output section in the second operation mode.

14. A communication system comprising:

a transmitter; and a receiver configured to receive a signal transmitted from the transmitter, wherein the transmitter includes a first serializer configured to generate a first serial signal, a second serializer configured to generate a second serial signal, a third serializer configured to generate a third serial signal, a first output section configured to set a voltage of a first output terminal to any of a first voltage, a second voltage, and a third voltage between the first voltage and the second voltage, a first output control circuit configured to control an operation of the first output section on a basis of the first serial signal and the second serial signal, a second output section configured to set a voltage of a second output terminal to any of the first voltage, the second voltage, and the third voltage, a second output control circuit configured to control an operation of the second output section on a basis of the third serial signal and the first serial signal, a third output section configured to set a voltage of a third output terminal to any of the first voltage, the second voltage, and the third voltage, and a third output control circuit configured to control an operation of the third output section on a basis of the second serial signal and the third serial signal, the first serializer, the second serializer, and the third serializer are disposed in this order on a semiconductor substrate, and the first output control circuit, the second output control circuit, and the third output control circuit are disposed in this order on the semiconductor substrate.

* * * * *